US012598828B2

(12) United States Patent
Ha et al.

(10) Patent No.: US 12,598,828 B2
(45) Date of Patent: Apr. 7, 2026

(54) SEMICONDUCTOR DEVICE

(71) Applicant: SAMSUNG ELECTRONICS CO., LTD., Suwon-si (KR)

(72) Inventors: Hyoun-Jee Ha, Hwaseong-si (KR); Changhwa Kim, Hwaseong-si (KR); Jeongsoon Kang, Busan (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 971 days.

(21) Appl. No.: 17/731,962

(22) Filed: Apr. 28, 2022

(65) Prior Publication Data

US 2022/0262829 A1      Aug. 18, 2022

Related U.S. Application Data

(63) Continuation of application No. 16/799,287, filed on Feb. 24, 2020, now Pat. No. 11,348,960.

(30) Foreign Application Priority Data

Oct. 14, 2019    (KR) ........................ 10-2019-0127283

(51) Int. Cl.
H10F 39/00          (2025.01)

(52) U.S. Cl.
CPC ....... H10F 39/807 (2025.01); H10F 39/8037 (2025.01); H10F 39/8053 (2025.01); H10F 39/8063 (2025.01)

(58) Field of Classification Search
CPC .............................. H10F 39/807; H10F 39/811
See application file for complete search history.

(56) References Cited

U.S. PATENT DOCUMENTS

| | | | |
|---|---|---|---|
| 7,598,553 | B2 | 10/2009 | Lim |
| 8,748,945 | B2 | 6/2014 | Shin |
| 9,281,334 | B2 | 3/2016 | Kao et al. |
| 9,524,995 | B2 | 12/2016 | Koo et al. |
| 9,780,130 | B2 | 10/2017 | Suh et al. |
| 9,917,126 | B1 * | 3/2018 | Lagrasta ............... H10F 39/186 |
| 10,134,792 | B2 | 11/2018 | Lee et al. |
| 10,651,226 | B2 | 5/2020 | Lee et al. |

(Continued)

FOREIGN PATENT DOCUMENTS

| | | | |
|---|---|---|---|
| JP | 2005-93555 A | 4/2005 |
| JP | 4363136 B2 | 11/2009 |

(Continued)

*Primary Examiner* — Ali Naraghi
(74) *Attorney, Agent, or Firm* — Sughrue Mion, PLLC

(57) ABSTRACT

A semiconductor device includes a substrate, a gate pattern, and a conductive line pattern. The substrate has a first surface and a second surface and includes an isolation pattern that defines plural pixel regions, and a photoelectric conversion region in each pixel region and a transistor for each of the pixel regions. The gate pattern of the transistor is disposed on the first surface of the substrate. The conductive line pattern is disposed on the first surface of the substrate and vertically overlaps the isolation pattern in plan view. A top surface of the conductive line pattern is located at the same level as a top surface of the gate pattern, a width of the conductive line pattern is less than a width of the isolation pattern, and the isolation pattern comprises a conducive isolation pattern and a dielectric isolation pattern.

15 Claims, 55 Drawing Sheets

(56)         References Cited

U.S. PATENT DOCUMENTS

| | | | |
|---|---|---|---|
| 11,348,960 B2 * | 5/2022 | Ha | H10F 39/811 |
| 2008/0315338 A1 * | 12/2008 | Yeo | H10F 39/806 |
| | | | 257/431 |
| 2015/0372036 A1 | 12/2015 | Suh et al. | |
| 2016/0027821 A1 * | 1/2016 | Ahn | H10F 39/802 |
| | | | 257/446 |
| 2018/0061873 A1 * | 3/2018 | Lee | H10F 39/8053 |
| 2018/0190691 A1 | 7/2018 | Lee et al. | |
| 2018/0240847 A1 | 8/2018 | Ota et al. | |
| 2019/0019820 A1 | 1/2019 | Takizawa et al. | |
| 2019/0043902 A1 | 2/2019 | Lee et al. | |
| 2019/0103428 A1 | 4/2019 | Wei et al. | |
| 2019/0114243 A1 | 4/2019 | Santoni et al. | |
| 2020/0176500 A1 | 6/2020 | Sze et al. | |

FOREIGN PATENT DOCUMENTS

| | | |
|---|---|---|
| JP | 2012-84816 A | 4/2012 |
| KR | 10-2010-0077593 A | 7/2010 |
| KR | 10-1845257 B1 | 4/2018 |
| KR | 10-2018-0079518 A | 7/2018 |
| KR | 10-2018-0081203 A | 7/2018 |

* cited by examiner

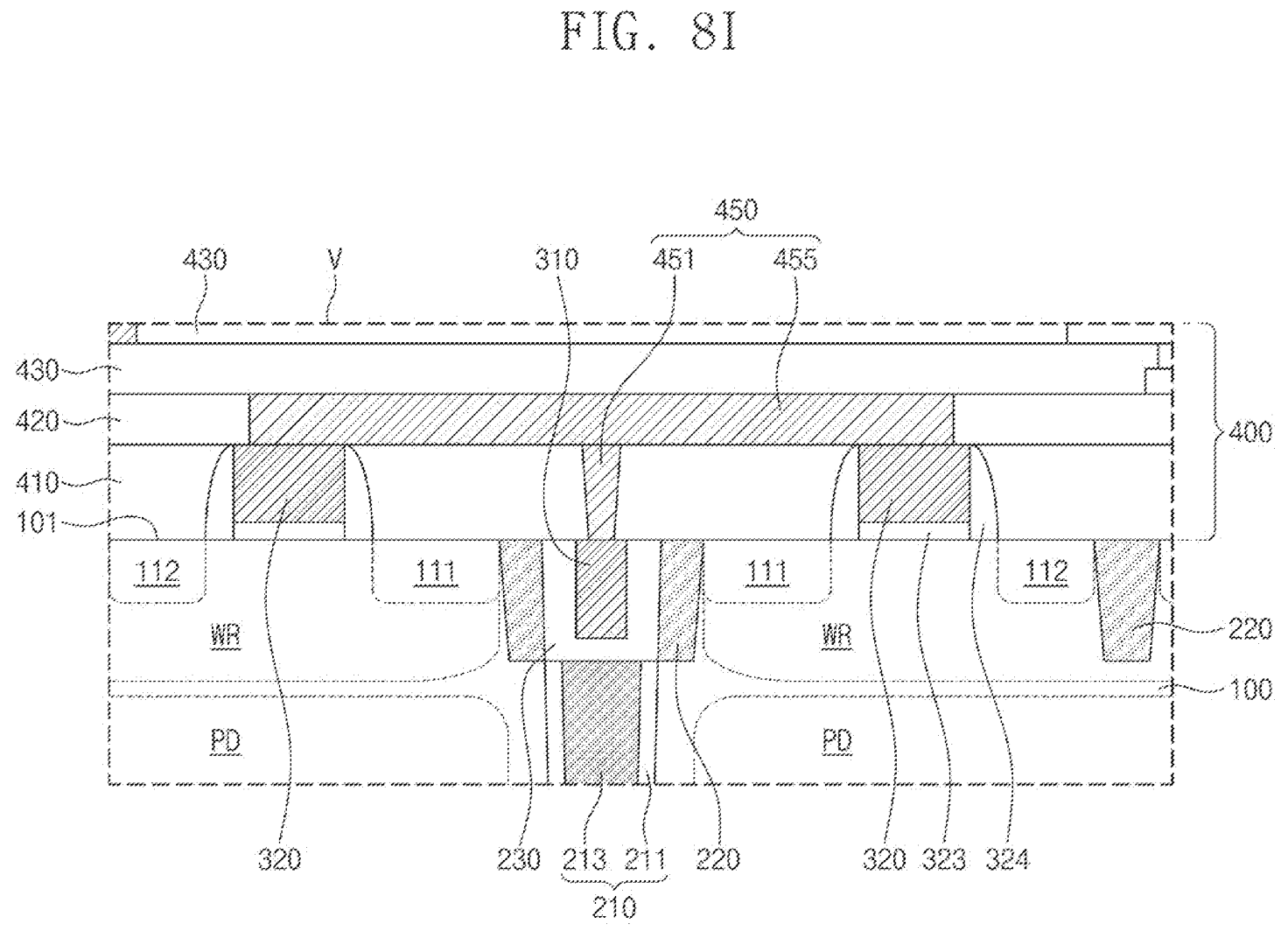

SEMICONDUCTOR DEVICE

CROSS-REFERENCE TO RELATED APPLICATIONS

This application is a Continuation Applications of U.S. application Ser. No. 16/799,287 filed Feb. 24, 2020, which claims priority under 35 U.S.C § 119 from Korean Patent Application No. 10-2019-0127283 filed on Oct. 14, 2019 in the Korean Intellectual Property Office, the entire contents of each of which are hereby incorporated by reference in their entireties.

BACKGROUND

1. Field

The present disclosure relates to an image sensor, and more particularly, to a conductive line pattern of an image sensor.

2. Description of the Related Art

An image sensor is a semiconductor device to convert optical images into electrical signals. An image sensor may be classified into a charge coupled device (CCD) type and a complementary metal oxide semiconductor (CMOS) type. A CMOS type image sensor is abbreviated to CIS (CMOS image sensor). The CIS has a plurality of two-dimensionally arranged pixels. Each of the pixels includes a photodiode. The photodiode serves to convert incident light into electrical signals.

SUMMARY

It is an aspect to provide an image sensor having increased freedom degree of design of wiring lines.

According to an aspect of an example embodiment, there is provided an image sensor comprising a substrate including an isolation pattern that extends from a bottom surface of the substrate into the substrate and defines a plurality of pixel regions, and a photoelectric conversion region and a transistor for each of the plurality of pixel regions; and a conductive line pattern disposed on a top surface of the substrate, the conductive line pattern vertically overlapping the isolation pattern in plan view and electrically connecting to transistors of two or more of the plurality of pixel regions.

According to another aspect of an example embodiment, there is provided an image sensor comprising a substrate including an isolation pattern that extends from a bottom surface of the substrate into the substrate and defines a plurality of pixel regions, and a photoelectric conversion region and a transistor for each of the plurality of pixel regions; and a conductive line pattern disposed in the substrate and extending from a top surface of the substrate into the substrate, the conductive line pattern vertically overlapping the isolation pattern in plan view and electrically connecting to transistors of two or more of the plurality of pixel regions.

According to another aspect of an example embodiment, there is provided an image sensor comprising a substrate including an isolation pattern that extends from a bottom surface of the substrate into the substrate and defines a plurality of pixel regions, and a photoelectric conversion region and a transistor for each of the plurality of pixel regions; a conductive line pattern disposed on a top surface of the substrate, the conductive line pattern vertically overlapping the isolation pattern in plan view and electrically connecting to transistors of two or more of the plurality of pixel regions; a wiring line layer disposed on the top surface of the substrate to cover the conductive line pattern, the wiring line layer comprising a conductive structure electrically connecting the conductive line pattern to the transistors of two or more of the plurality of pixel regions; a backside dielectric layer formed on the bottom surface of the substrate to cover the bottom surface of the substrate and a bottom surface of the isolation pattern; and a plurality of color filters and a plurality of microlenses corresponding respectively to the color filters, disposed on a bottom surface of the backside dielectric layer.

According to another aspect of an example embodiment, there is provided an image sensor comprising a substrate including an isolation pattern that extends from a bottom surface of the substrate into the substrate and defines a plurality of pixel regions, and a photoelectric conversion region and a transistor for each of the plurality of pixel regions; a conductive line pattern disposed in the substrate and extending from a top surface of the substrate into the substrate, the conductive line pattern vertically overlapping the isolation pattern in plan view and electrically connecting to transistors of two or more of the plurality of pixel regions; a wiring line layer disposed on the top surface of the substrate to cover the conductive line pattern, the wiring line layer comprising a conductive structure electrically connecting the conductive line pattern to the transistors of two or more of the plurality of pixel regions; a backside dielectric layer formed on the bottom surface of the substrate to cover the bottom surface of the substrate and a bottom surface of the isolation pattern; and a plurality of color filters and a plurality of microlenses corresponding respectively to the color filters, disposed on a bottom surface of the backside dielectric layer.

BRIEF DESCRIPTION OF THE DRAWINGS

FIG. 2C illustrates an enlarged view showing section V of FIG. 2B.

FIG. 2D illustrates a cross-sectional view taken along line III-IV of FIG. 2A.

FIG. 2E illustrates a cross-sectional view showing an image sensor according to some examples embodiments;

FIG. 7C illustrates a cross-sectional view showing an image sensor according to some examples embodiments;

FIGS. 8A to 8C illustrate cross-sectional views showing an image sensor according to some examples embodiments;

FIG. 8E illustrates an enlarged view showing section V' of FIG. 8D.

FIG. 8F illustrates a cross-sectional view showing a device dielectric pattern and a conductive line pattern according to some examples embodiments;

FIG. 8H illustrates a cross-sectional view showing a conductive line pattern and a conductive structure according to some examples embodiments;

FIG. 8I illustrates a cross-sectional view showing a conductive line pattern and a conductive structure according to some examples embodiments;

FIG. 12D illustrates a cross-sectional view taken along line III-IV of FIG. 12A.

FIGS. 13A to 13C illustrate cross-sectional views showing an image sensor according to some examples embodiments;

DETAILED DESCRIPTION

Figure 1:
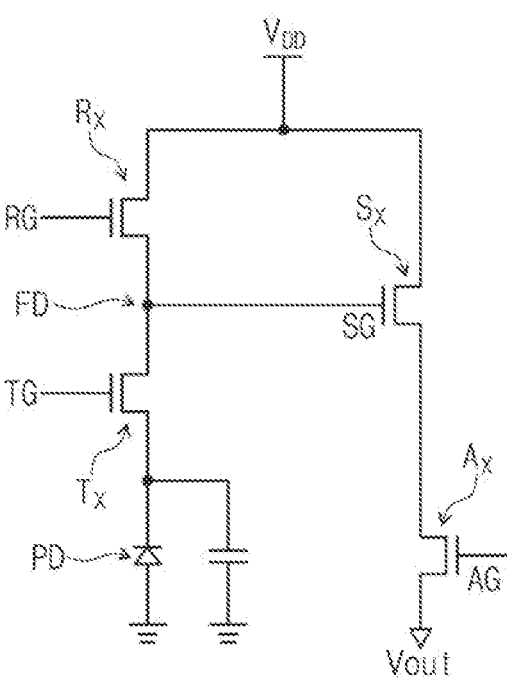
FIG. 1 illustrates a circuit diagram of a pixel of an image sensor according to some examples embodiments.

In this description, like reference numerals may indicate like components. The following will now describe image sensors and methods of fabricating the same according to some example embodiments.

FIG. 1 illustrates a circuit diagram showing a pixel of an image sensor according to some example embodiments.

Referring to FIG. 1, each of pixels of an image sensor may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may respectively include a transfer gate TG, a source follower gate SG, a reset gate RG, and a selection gate AG.

The photoelectric conversion region PD may be a photodiode that includes an n-type impurity region and a p-type impurity region. A floating diffusion region FD may serve as a drain of the transfer transistor Tx. The floating diffusion region FD may also serve as a source of the reset transistor Rx. The floating diffusion region FD may be electrically connected to the source follower gate SG of the source follower transistor Sx. The source follower transistor Sx may be connected to the selection transistor Ax.

An operation of the image sensor will be explained below with reference to FIG. 1. First, a power voltage VDD may be applied to a drain of the reset transistor Rx and a drain of the source follower transistor Sx under a light-blocked state such that the reset transistor Rx may be turned on to discharge charges remaining on the floating diffusion region FD. Thereafter, when the reset transistor Rx is turned off and external light is incident onto the photoelectric conversion region PD, electron-hole pairs may be generated from the photoelectric conversion region PD. Holes may be transferred to and accumulated on a p-type impurity region of the photoelectric conversion region PD, and electrons may be transferred to and accumulated on an n-type impurity region of the photoelectric conversion region PD. When the transfer transistor Tx is turned on, charges such as electrons and hole may be transferred to and accumulated on the floating diffusion region FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A wiring line may be electrically connected to one or more of the transfer gate TG, the source follower gate SG, the reset gate RG, and the selection gate AG. The wiring line may be configured to apply the power voltage VDD to the drain of the reset transistor Rx or the drain of the source follower transistor Sx. The wiring line may include a column line connected to the selection transistor Ax. The wiring line may be a conductive line pattern which will be discussed below.

FIG. 1 exemplarily shows the pixel that includes one photoelectric conversion region PD and four transistors TX, RX, AX, and Sx, but the example embodiments are not limited thereto. For example, the pixel may be provided in plural, and neighboring pixels may share one of the reset transistor Rx, the source follower transistor Sx, and the selection transistor Ax. Therefore, the image sensor may increase in integration.

Figure 2A:
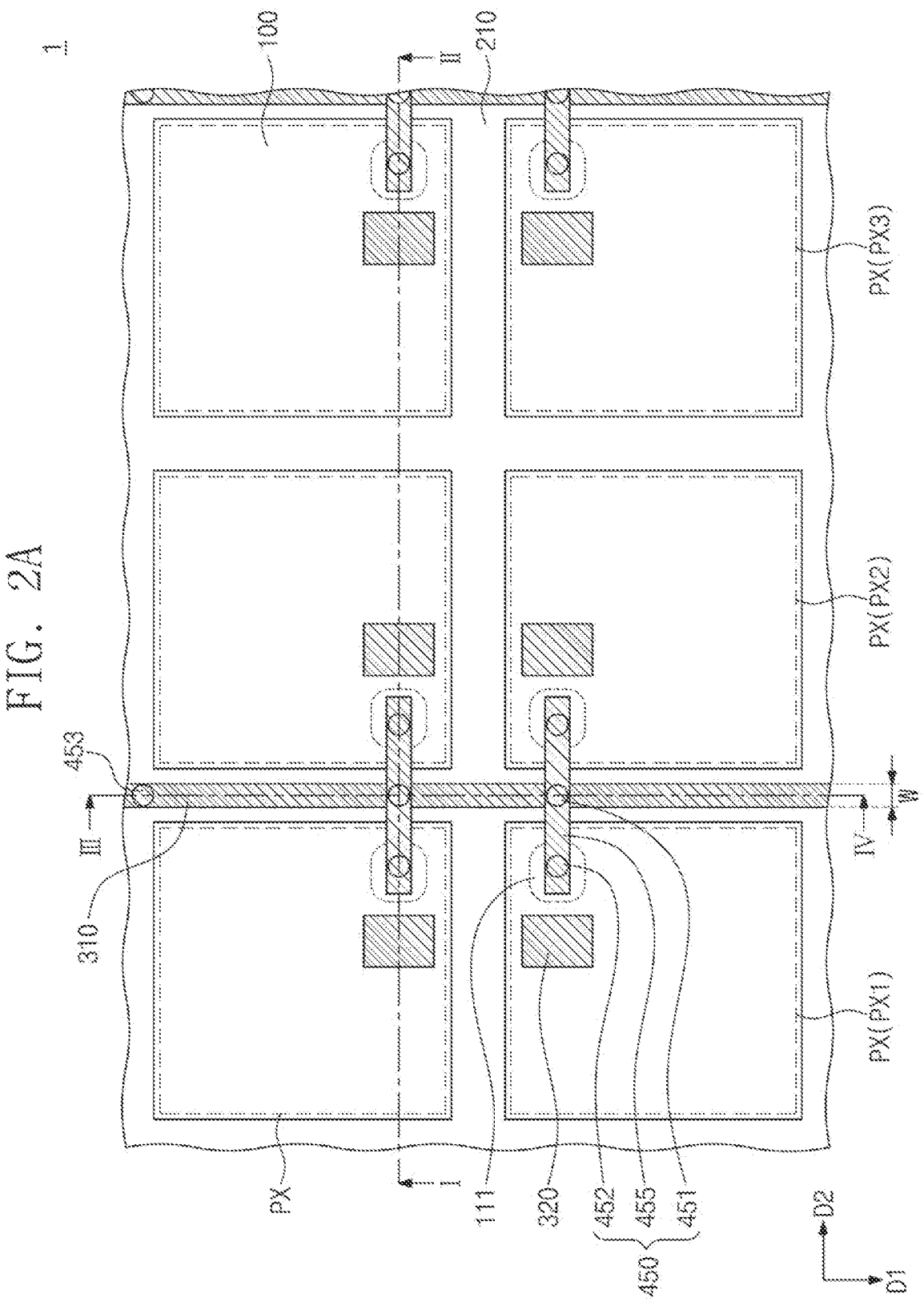
FIG. 2A illustrates a plan view showing an image sensor according to some examples embodiments.
Figure 2B:
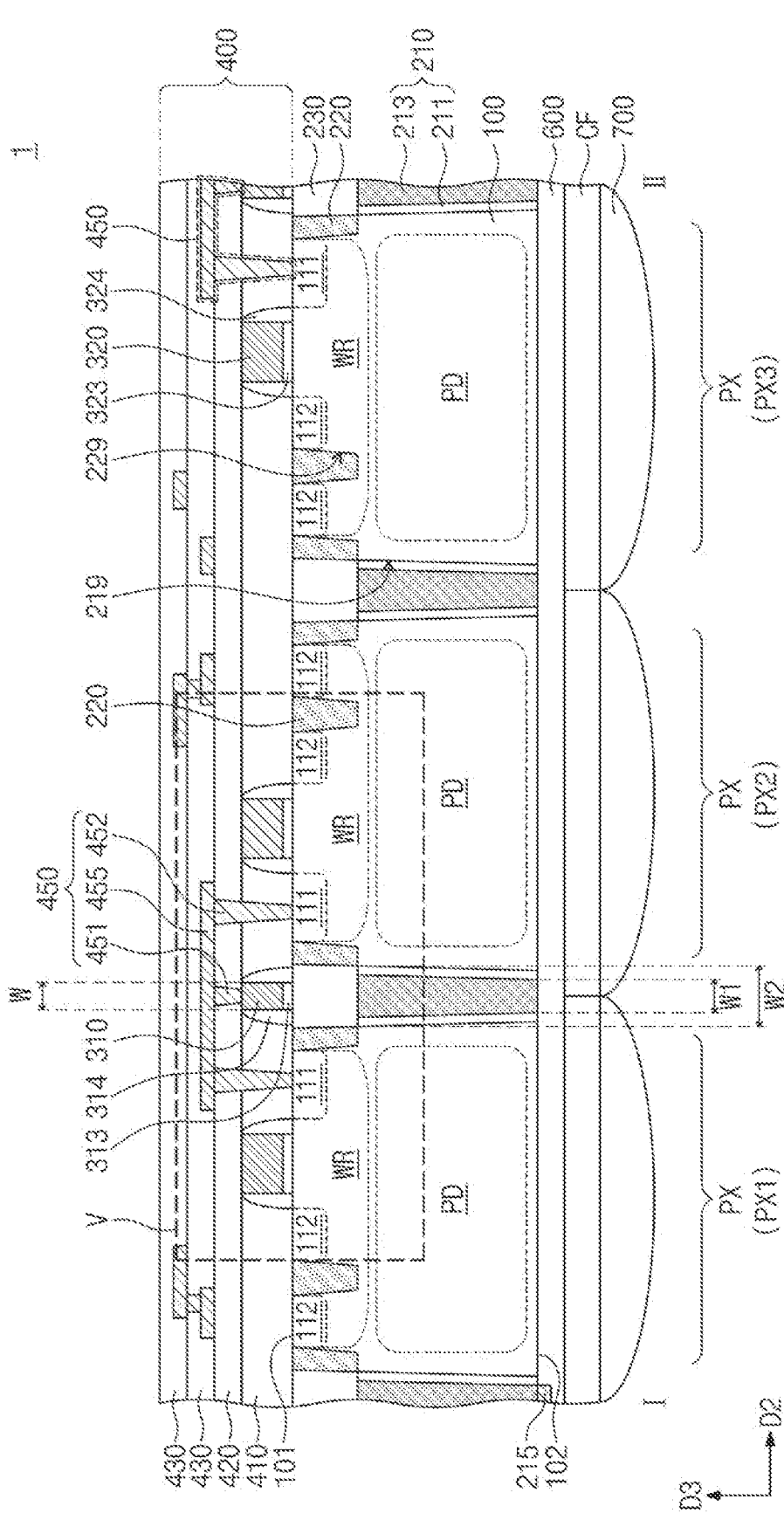
FIG. 2B illustrates a cross-sectional view taken along line I-II of FIG. 2A.
Figure 2C:
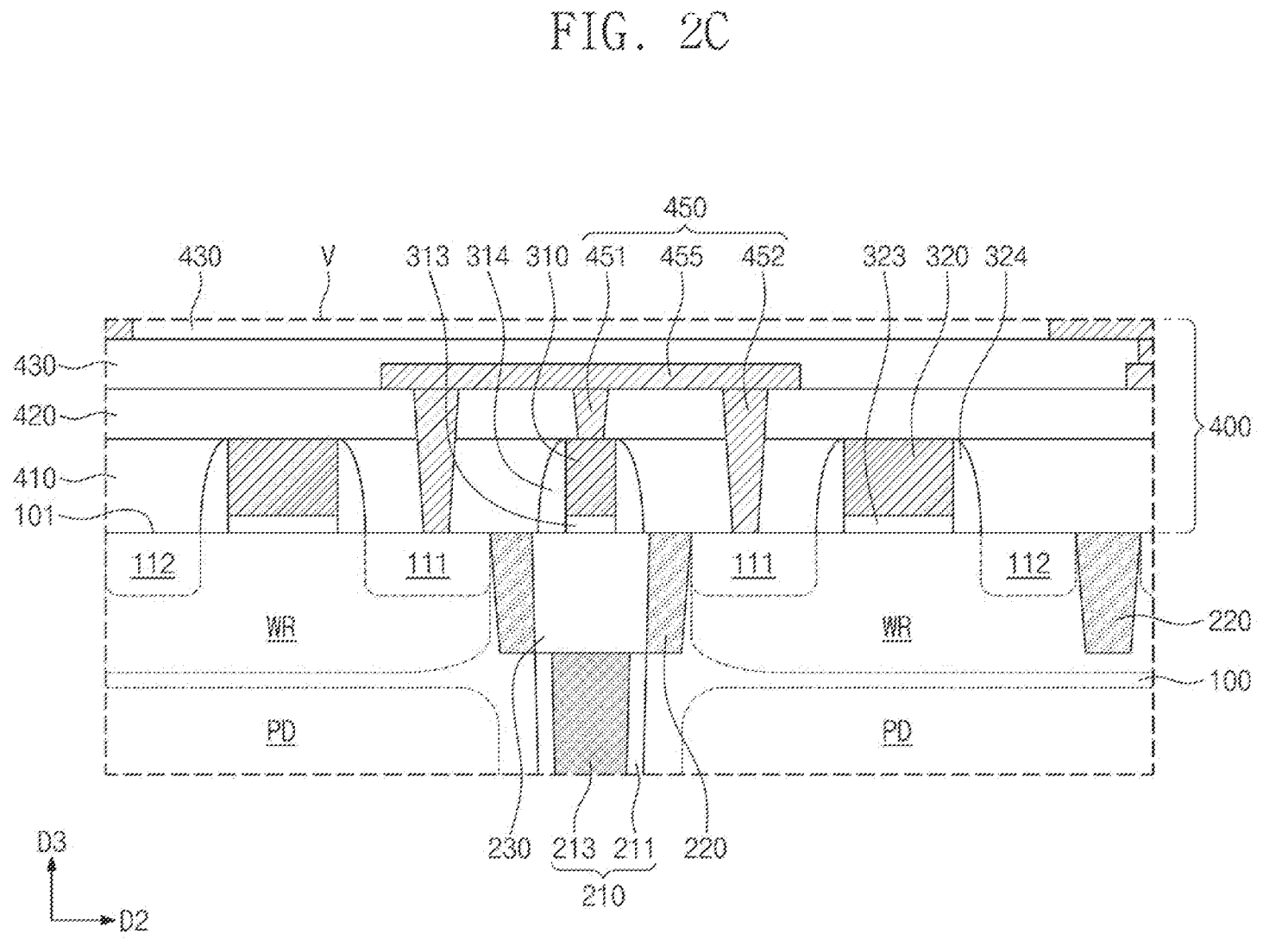
Figure 2D:
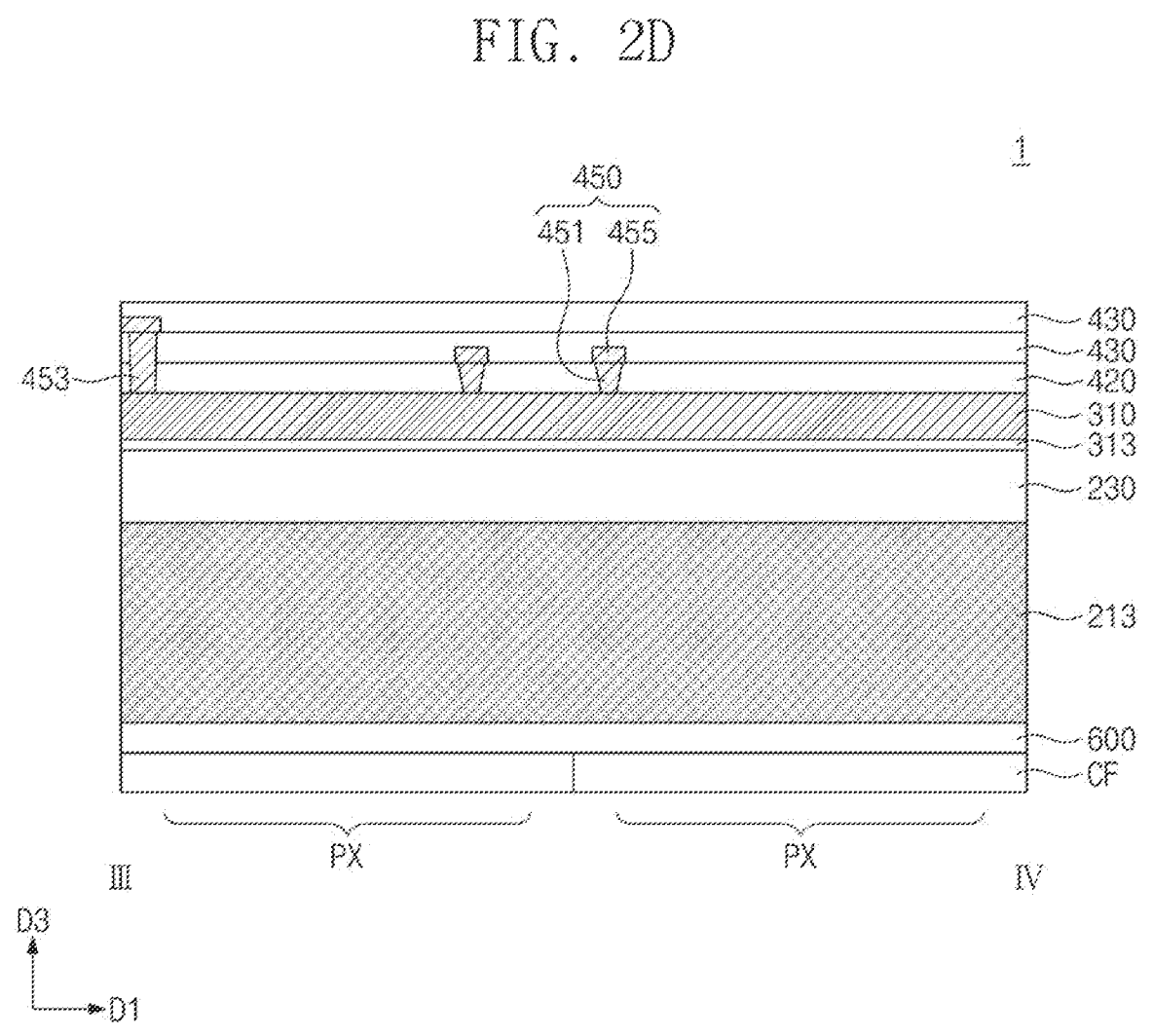

FIG. 2A illustrates a plan view showing an image sensor according to some example embodiments. FIG. 2B illustrates a cross-sectional view taken along line I-II of FIG. 2A. FIG. 2C illustrates an enlarged view showing section V of FIG. 2B. FIG. 2D illustrates a cross-sectional view taken along line III-IV of FIG. 2A. A duplicate description will be omitted below for conciseness of description.

Referring to FIGS. 2A to 2D, an image sensor 1 may include a substrate 100, an isolation pattern 210, a device dielectric pattern 220, a conductive line pattern 310, a gate pattern 320, and a wiring line layer 400. The substrate 100 may have a plurality of pixel regions PX. The pixel discussed with reference to FIG. 1 may be formed on each of the pixel regions PX of the substrate 100. For example, components of the pixel may be provided on each of the pixel regions PX. The substrate 100 may have a first surface 101 and a second surface 102 that face each other. The first surface 101 of the substrate 100 may be a front surface, and the second surface 102 of the substrate 100 may be a rear surface. For example, the substrate 100 may be a semiconductor substrate or a silicon-on-insulator (SOI) substrate. The semiconductor substrate may be, for example, a silicon substrate, a germanium substrate, or a silicon-germanium substrate. The substrate 100 may include first conductivity type impurities. For example, the first conductivity type impurities may include p-type impurities, such as aluminum (Al), boron (B), indium (In), and/or gallium (Ga).

Photoelectric conversion regions PD may be disposed on corresponding pixel regions PX in the substrate 100. The photoelectric conversion regions PD may have the same function and role as those of the photoelectric conversion region PD shown in FIG. 1. The photoelectric conversion regions PD may be areas doped with second conductivity type impurities. The second conductivity type impurities may have a conductive type different than that of the first conductivity type impurities. In some example embodiments, the second conductivity type impurities may have a conductive type opposite to that of the first conductivity type impurities. For example, the second conductive type impurities may include n-type impurities, such as phosphorus, arsenic, bismuth, and/or antimony. The photoelectric conversion regions PD may be located deep below the first surface 101 of the substrate 100.

Well impurity regions WR may be provided on corresponding pixel regions PX in the substrate 100. Each of the well impurity regions WR may be adjacent to the first surface 101 of the substrate 100. For example, on each of the pixel regions PX, the well impurity region WR may be positioned between the photoelectric conversion region PD and the first surface 101 of the substrate 100. The well impurity region WR may be an area doped with the first conductivity type impurities. Therefore, the well impurity region WR may thus have the first conductivity type.

First impurity regions 111 may be disposed on corresponding pixel regions PX in the substrate 100. The first impurity regions 111 may be disposed adjacent to the first surface 101 of the substrate 100. On each of the pixel regions PX, the first impurity region 111 may be provided in the well impurity region WR. The first impurity region 111 may be provided between the well impurity region WR and the first surface 101 of the substrate 100. The well impurity region WR may be interposed between the first impurity region 111 and the photoelectric conversion region PD. The first impurity region 111 may include the second conductivity type impurities.

Second impurity regions 112 may be disposed on corresponding pixel regions PX in the substrate 100. On each of the pixel regions PX, the second impurity regions 112 may be provided in the well impurity region WR. The second impurity regions 112 may be adjacent to the first surface 101 of the substrate 100. The second impurity regions 112 may be provided between the well impurity region WR and the first surface 101 of the substrate 100. Therefore, the well impurity region WR may be interposed between the second impurity regions 112 and the photoelectric conversion region PD. The second impurity regions 112 may include the second conductivity type impurities.

In some example embodiments, the first impurity region 111 and the second impurity regions 112 may be active regions. The term "active regions" may denote areas for the operation of a transistor, and may include source/drain regions of the transistor and the floating diffusion region FD discussed with reference to FIG. 1. The transistor may include one of the transfer transistor Tx, the source/follower transistor Sx, the reset transistor Rx, and the selection transistor Ax that are discussed with reference to FIG. 1. In some example embodiments, the first impurity region 111 may be a ground region.

The device dielectric pattern 220 may be provided in the substrate 100. The device dielectric pattern 220 may define the active regions or the ground region. To be more specific, on each of the pixel regions PX, the device dielectric pattern 220 may define the first impurity region 111 and/or the second impurity regions 112, and may separate the first and second impurity regions 111 and 112 from each other. For example, the device dielectric pattern 220 may be disposed on one side of each of the first and second impurity regions 111 and 112 in the substrate 100, as shown for example in FIG. 2C. A bottom surface of the device dielectric pattern 220 may be provided in the substrate 100. For example, the device dielectric pattern 220 may be provided in a first trench 229, and the first trench 229 may be recessed from the first surface 101 of the substrate 100. The device dielectric pattern 220 may be a shallow trench isolation (STI) layer. The device dielectric pattern 220 may include, for example, one or more of silicon oxide, silicon nitride, and silicon oxynitride.

The isolation pattern 210 may be provided in the substrate 100, thereby defining the pixel regions PX. For example, the isolation pattern 210 may be provided between the pixel regions PX of the substrate 100. The isolation pattern 210 may be provided in a second trench 219, and the second trench 219 may be recessed from the first surface 101 of the substrate 100. The isolation pattern 210 may be a deep trench isolation (DTI) layer. The isolation pattern 210 may have a bottom surface at a lower level than that of the bottom surface of the device dielectric pattern 220. In some example embodiments, the isolation pattern 210 may penetrate the second surface 102 of the substrate 100. A width W2 of the isolation pattern 210 at a top surface of the isolation pattern 210 may be greater than a width W1 of the isolation pattern 210 at the bottom surface of the isolation pattern 210, as illustrated in FIG. 2B. The bottom surface of the isolation pattern 210 may be coplanar with or adjacent to the second surface 102 of the substrate 100. The width and shape of the isolation pattern 210 is not be limited to that shown, but may be variously changed.

The isolation pattern 210 may include a dielectric isolation pattern 211 and a conductive isolation pattern 213. The dielectric isolation pattern 211 may be provided along a sidewall of the second trench 219. The dielectric isolation pattern 211 may include, for example, one or more of a silicon-based dielectric material (e.g., silicon nitride, silicon oxide, and/or silicon oxynitride) and a high-k dielectric material (e.g., hafnium oxide and/or aluminum oxide). The dielectric isolation pattern 211 may include a plurality of layers, and the layers may include different materials from each other. The dielectric isolation pattern 211 may have a refractive index less than that of the substrate 100. Accordingly, a crosstalk phenomenon may be prevented or reduced between the pixel regions PX of the substrate 100.

The conductive isolation pattern 213 may be provided in the dielectric isolation pattern 211. For example, a sidewall of the conductive isolation pattern 213 may be surrounded by the dielectric isolation pattern 211. The dielectric isolation pattern 211 may be interposed between the conductive isolation pattern 213 and the substrate 100. Therefore, when the image sensor 1 operates, the conductive isolation pattern 213 may be electrically separated from the substrate 100. The conductive isolation pattern 213 may include a crystalline semiconductor material, such as polysilicon. For example, the conductive isolation pattern 213 may include doped polysilicon. The conductive isolation pattern 213 may further include dopants, and the dopants may include the first conductivity type impurities or the second conductivity type impurities.

A conductive terminal 215 may be provided on the second surface 102 of the substrate 100 and connected to the conductive isolation pattern 213 (see, e.g., the leftmost portion of FIG. 2B). For example, the conductive terminal 215 may be provided on or outside a certain one of the pixel regions PX and connected to the conductive isolation pattern 213 that surrounds the pixel region PX. The certain one of the pixel regions PX may be an outermost pixel region. The conductive terminal 215 may be configured to receive a first voltage. The first voltage may be, for example, a negative bias voltage. The first voltage may be applied through the conductive terminal 215 to the conductive isolation pattern 213. In this configuration, when the image sensor 1 operates, electrons (e.g., noise electrons) which are generated due to interface defects between the isolation pattern 210 and the substrate 100 may be removed. The interface defects may be provided, for example, on the sidewall of the second trench 219. The removal of the interface defects may increase an image quality of the image sensor 1.

The conductive line pattern 310 may be provided on the first surface 101 of the substrate 100. The conductive line pattern 310, when viewed in plan, may overlap the isolation pattern 210. For example, the conductive line pattern 310 may vertically overlap the conductive isolation pattern 213. In this description, the term "vertical" may denote "parallel in a third direction D3 or in a direction opposite to the third direction D3." The third direction D3 may be substantially perpendicular to the first surface 101 of the substrate 100. The conductive line pattern 310 may include metal, metal silicide, polysilicon, or a combination thereof. In this case, the polysilicon may include doped polysilicon or undoped polysilicon.

The conductive line pattern 310 may have a relatively small width W. The width W of the conductive line pattern 310 may be less than that of the isolation pattern 210 that corresponds to the conductive line pattern 310. The width W of the conductive line pattern 310 may be, for example, less than the width W2 of the isolation pattern 210 at the top surface of the isolation pattern 210. The width W of the conductive line pattern 310 may range from about 10 nm to about 70 nm. The small width W of the conductive line pattern 310 may improve arrangement congestion of components included in the wiring line layer 400.

The wiring line layer 400 may be disposed on the first surface 101 of the substrate 100. The wiring line layer 400 may include a first dielectric layer 410, a second dielectric layer 420, third dielectric layers 430, and a conductive structure 450. The first dielectric layer 410 may cover the first surface 101 of the substrate 100. The first dielectric layer 410 may expose a top surface of the conductive line pattern 310. For example, a surface of the first dielectric layer 410 that is opposite to a surface facing the first surface 101 of the substrate 100 may be coplanar with the top surface of the conductive line pattern 310. The second dielectric layer 420 may be provided on a top surface of the first dielectric layer 410 and the top surface of the conductive line pattern 310. Although not shown, the second dielectric layer 420 may be a multiple layer. Alternatively, the second dielectric layer 420 may be omitted. The third dielectric layers 430 may be stacked on the second dielectric layer 420. The first, second, and third dielectric layers 410, 420, and 430 may include a silicon-based dielectric material, such as silicon oxide, silicon nitride, and/or silicon oxynitride.

The conductive structure 450 may be provided on one or more of the first, second, and third dielectric layers 410, 420, and 430. The conductive structure 450 may include, for example, a first contact plug 451, a second contact plug 452, a third contact plug 453, and a conductive pattern 455. The conductive structure 450 may include metal, such as copper, tungsten, aluminum, titanium, tantalum, or an alloy thereof.

The first contact plug 451 may be provided in and may penetrate the second dielectric layer 420. The first contact plug 451 may be provided on and electrically connected to the conductive line pattern 310. The second contact plug 452 may penetrate the first dielectric layer 410 and the second dielectric layer 420. The second contact plug 452 may be provided on and electrically connected to the first impurity region 111. The second contact plug 452 may be disposed laterally spaced apart from the first contact plug 451. The conductive pattern 455 may be interposed between the second dielectric layer 420 and a lowermost one of the third dielectric layers 430, and coupled to the first contact plug 451 and the second contact plug 452.

As shown in FIG. 2D, the third contact plug 453 may be provided on and electrically connected to the conductive line pattern 310. The third contact plug 453 may penetrate the second dielectric layer 420. The third contact plug 453 may further penetrate at least one of the third dielectric layers 430. The third contact plug 453, as illustrated in FIGS. 2A and 2D, may be disposed spaced apart from the first contact plug 451 and the second contact plug 452.

When the image sensor 1 operates, an external electrical signal or a second voltage may be applied to the first impurity region 111 through the third contact plug 453, the conductive line pattern 310, the first contact plug 451, the conductive pattern 455, and the second contact plug 452. Alternatively, an electrical signal generated from the first impurity region 111 may be externally transferred through the second contact plug 452, the conductive pattern 455, the first contact plug 451, the conductive line pattern 310, and the third contact plug 453. When the first impurity region 111 is a source/drain region of a transistor, the conductive line pattern 310 may serve as a pathway through which voltage is applied or transferred to the source/drain region of the transistor. The second voltage may be different from the first voltage. The following will describe in detail planar arrangement and electrical connection of the conductive line pattern 310 according to some example embodiments, with reference to FIG. 2A.

As illustrated in FIG. 2A, the conductive line pattern 310 may extend parallel to a first direction D1 between the pixel regions PX. The first direction D1 may be parallel to the first surface 101 of the substrate 100. A second direction D2 may be parallel to the first surface 101 of the substrate 100 and may intersect the first direction D1. In other words, the first and second directions D1 and D2 may form a plane that is parallel with the first surface 101 of the substrate 100. The pixel regions PX may include a first pixel region PX1, a second pixel region PX2, and a third pixel region PX3. The first pixel region PX1 may be spaced apart from the third pixel region PX3 in the second direction D2 or in a direction opposite to the second direction D2 (i.e., −D2), and the second pixel region PX2 may be interposed between the first pixel region PX1 and the third pixel region PX3. The pixel regions PX may have corresponding first impurity regions 111. The first impurity regions 111 of two neighboring pixel regions PX may be disposed symmetrically with each other. For example, the first impurity region 111 of the first pixel region PX1 may be disposed symmetrically with the first impurity region 111 of the second pixel region PX2 (best seen with respect to the first pixel region PX1 and the second pixel region PX2 in FIG. 2B).

The conductive line pattern 310, when viewed in plan, may be provided between the first pixel region PX1 and the second pixel region PX2. As shown in FIGS. 2A and 2B, the conductive structure 450 may include a plurality of the second contact plugs 452. One of the second contact plugs 452 may be coupled to the first impurity region 111 of the first pixel region PX1. The other one of the second contact plugs 452 may be coupled to the first impurity region 111 of the second pixel region PX2. In some example embodiments, the conductive line pattern 310 may not be provided between the second pixel region PX2 and the third pixel region PX3.

The conductive line pattern 310 may be provided in plural, and the plurality of conductive line patterns 310 may be spaced apart from each other in the second direction D2. The following will explain a single pixel region PX for simplification of description, but the example embodiments are not limited to the single pixel PX.

In certain example embodiments, wiring lines may be provided between the second and third dielectric layers 420 and 430 or between the third dielectric layers 430, and the wiring lines may include signal lines, ground lines, and power lines. In certain example embodiments, because the conductive line pattern 310 is provided in the first dielectric layer 410, the wiring lines in the wiring line layer 400 may increase in the degree of freedom of design. Therefore, the wiring lines according to the example embodiments may reduce congestion. Alternatively or additionally, the wiring lines may have a fine pitch and may increase integration. Because the conductive line pattern 310 is provided, the wiring line layer 400 may decrease in thickness and in turn the image sensor 1 may be reduced in size.

A first dielectric pattern 230 may be interposed between the conductive isolation pattern 213 and the conductive line pattern 310. The first dielectric pattern 230 may cause the conductive line pattern 310 to have no contact with the conductive isolation pattern 213 and to maintain an electrical separation from the conductive isolation pattern 213. For example, an electrical signal or a second voltage may be applied to the conductive line pattern 310, and a first voltage (e.g., a negative bias voltage) may be applied to the conductive isolation pattern 213. The second voltage may be different from the first voltage.

A second dielectric pattern 313 may be interposed between the first dielectric pattern 230 and the conductive line pattern 310. The second dielectric pattern 313 may include one or more of a silicon-based dielectric material (e.g., silicon oxide, silicon nitride, and/or silicon oxynitride) and a high-k dielectric material (e.g., hafnium oxide and/or aluminum oxide).

A line spacer 314 may be disposed on the first dielectric pattern 230 and may cover a sidewall of the conductive line pattern 310. The line spacer 314 may include a dielectric material such as semiconductor nitride. The semiconductor nitride may include, for example, silicon nitride, silicon carbonitride, or silicon oxynitride.

The gate pattern 320 may be disposed on the first surface 101 of the substrate 100. The gate pattern 320, when viewed in plan, may not overlap the isolation pattern 210. The gate pattern 320 may be laterally spaced apart from the conductive line pattern 310. The gate pattern 320 may be serve as a gate electrode of one of the transfer transistor Tx, the source follower transistor Sx, the reset transistor Rx, and the selection transistor Ax that are discussed above with reference to FIG. 1. For example, the gate pattern 320 may include one of the transfer gate TG, the source follower gate SG, the reset gate RG, and the selection gate AG. For simplification, FIG. 2A shows that a single gate pattern 320 is disposed on each of the pixel regions PX, but a plurality of the gate patterns 320 may be disposed on each of the pixel regions PX. A single gate pattern 320 will be discussed below for simplification of description.

The gate pattern 320 may include metal, metal silicide, polysilicon, or a combination thereof. The polysilicon may include doped polysilicon or undoped polysilicon. For example, the gate pattern 320 may include the same material as that of the conductive line pattern 310. The gate pattern 320 and the conductive line pattern 310 may include metal or polysilicon. For another example, the gate pattern 320 may include a different material from that of the conductive line pattern 310. One of the gate pattern 320 and the conductive line pattern 310 may include metal, and the other of the gate pattern 320 and the conductive line pattern 310 may include polysilicon.

A gate dielectric pattern 323 may be interposed between the gate pattern 320 and the first surface 101 of the substrate 100. The gate dielectric pattern 323 may include, for example, one or more of a silicon-based dielectric material (e.g., silicon oxide, silicon nitride, and/or silicon oxynitride) and a high-k dielectric material (e.g., hafnium oxide and/or aluminum oxide. The gate dielectric pattern 323 may include the same material as that of the second dielectric pattern 313. The gate dielectric pattern 323 may have the same thickness as that of the second dielectric pattern 313.

A gate spacer 324 may be disposed on the first surface 101 of the substrate 100, thereby covering a sidewall of the gate pattern 320. The gate spacer 324 may include the same dielectric material as that of the line spacer 314. For example, the gate spacer 324 may include semiconductor nitride, such as silicon nitride, silicon carbonitride, or silicon oxynitride.

A backside dielectric layer 600 may be disposed on and cover the second surface 102 of the substrate 100. The pixel regions PX may include corresponding color filters CF disposed on a bottom surface of the backside dielectric layer 600. The color filter CF may include one of a red color filter, a blue color filter, and a green color filter. On the bottom surface of the backside dielectric layer 600, a grid pattern (not shown) may further be interposed between the color filters CF. For another example, the color filters CF may be buried in the backside dielectric layer 600. Micro-lenses 700 may be correspondingly disposed on bottom surfaces of the color filters CF.

Figure 2E:
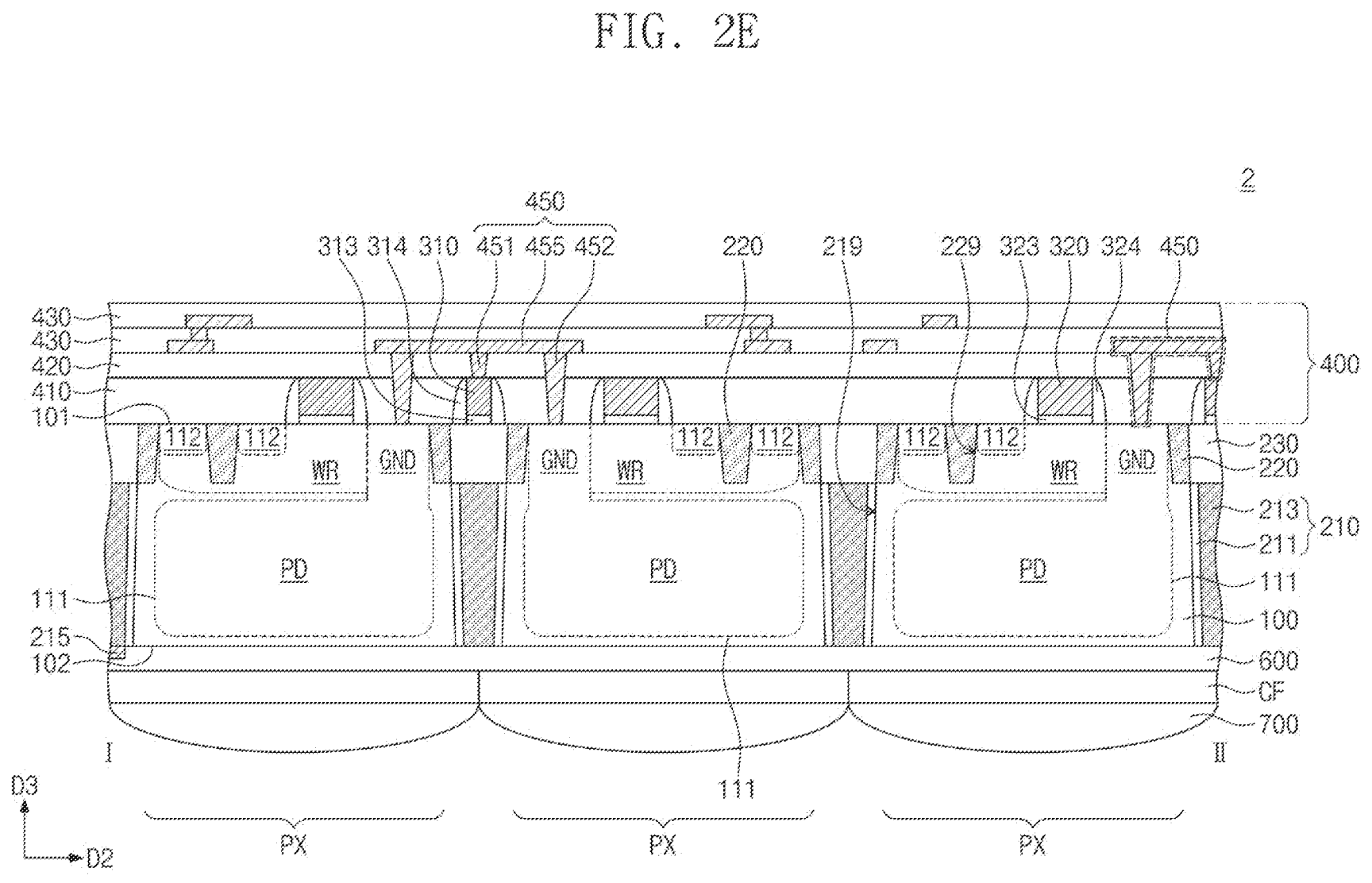

FIG. 2E illustrates a cross-sectional view taken along line I-II of FIG. 2A, showing an image sensor according to some example embodiments. A duplicate description will be omitted below for conciseness.

Referring to FIG. 2E, an image sensor 2 may include the substrate 100, the isolation pattern 210, the device dielectric pattern 220, the conductive line pattern 310, the gate pattern 320, and the wiring line layer 400. The substrate 100, the isolation pattern 210, the device dielectric pattern 220, the conductive line pattern 310, the gate pattern 320, and the wiring line layer 400 may be substantially the same as those discussed above with reference to FIGS. 2A to 2D.

In contrast, the first impurity region 111 may include the photoelectric conversion region PD and a ground region GND. The ground region GND may be disposed adjacent to the first surface 101 of the substrate 100. The ground region GND may be connected to the photoelectric conversion region PD. The first impurity region 111 may include the second conductivity type impurities.

The second contact plug 452 may be coupled to the first impurity region 111. For example, the second contact plug 452 may be coupled to the ground region GND of the first impurity region 111. The conductive line pattern 310 may be electrically connected through the conductive structure 450 to the ground region GND. When the image sensor 2 operates, a ground voltage may be applied to the ground region GND through the conductive line pattern 310 and the conductive structure 450. A first voltage may be applied to the conductive isolation pattern 213, and the first voltage may be different from the ground voltage.

Figure 3A:
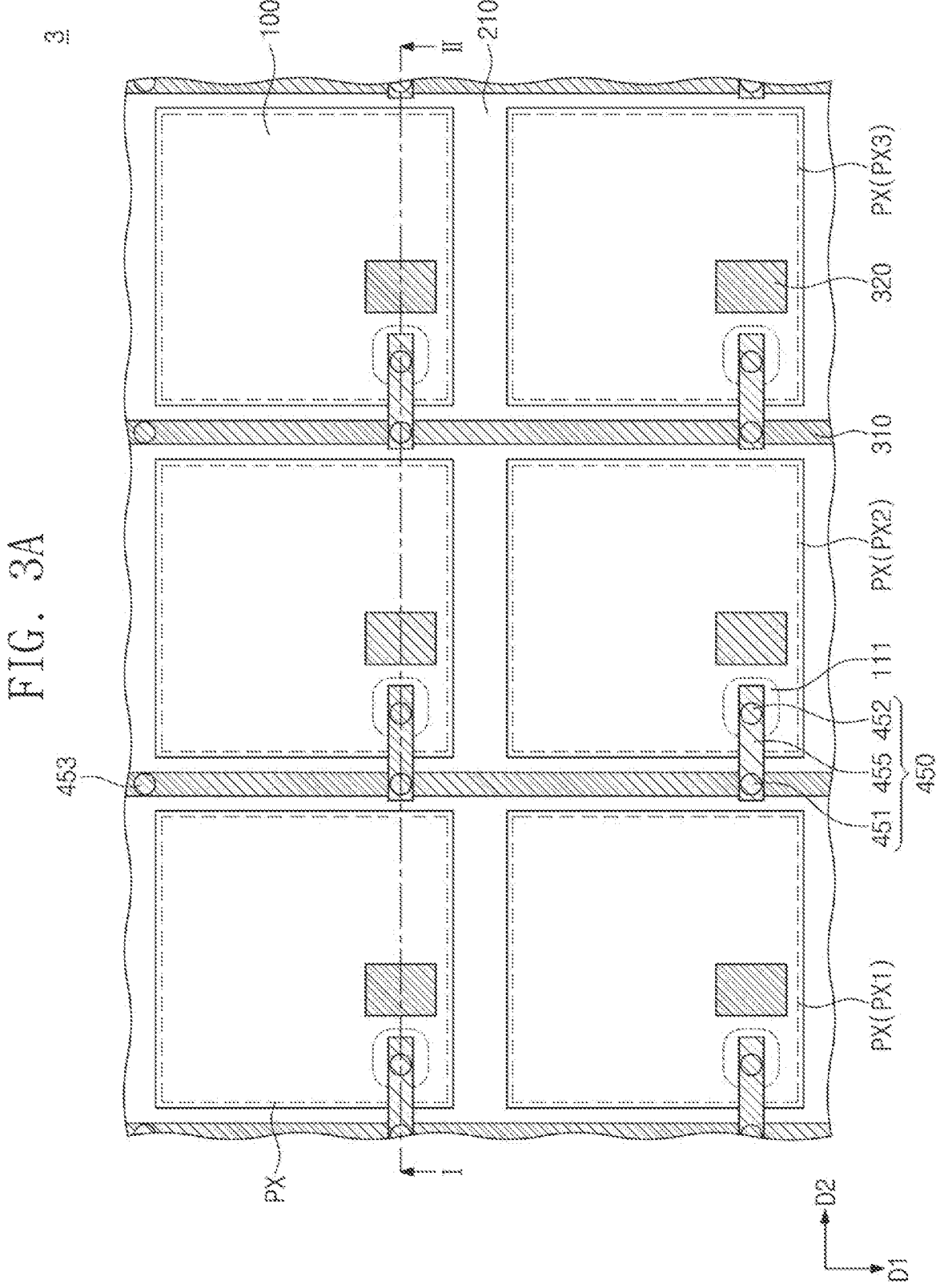
FIG. 3A illustrates a plan view showing an image sensor according to some examples embodiments.
Figure 3B:
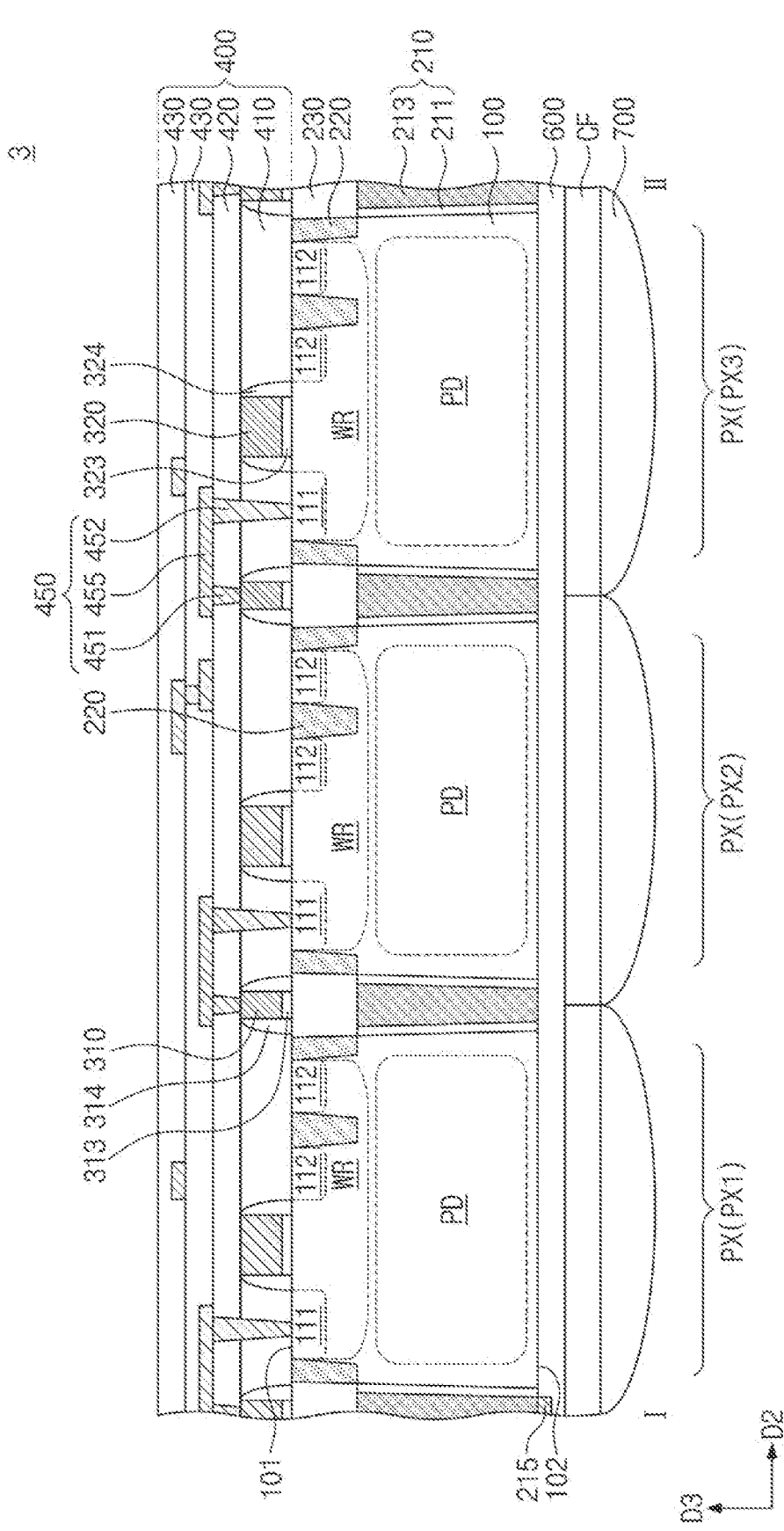
FIG. 3B illustrates a cross-sectional view taken along line I-II of FIG. 3A.

FIG. 3A illustrates a plan view showing an image sensor according to some example embodiments. FIG. 3B illustrates a cross-sectional view taken along line I-II of FIG. 3A. A duplicate description will be omitted below for conciseness.

Referring to FIGS. 3A and 3B, an image sensor 3 may include the substrate 100, the isolation pattern 210, the device dielectric pattern 220, a plurality of the conductive line patterns 310, the gate pattern 320, and a plurality of the conductive structures 450.

The conductive line patterns 310, when viewed in plan, may be correspondingly provided between the pixel regions PX. For example, the conductive line patterns 310 may be interposed between the first and second pixel regions PX1 and PX2 and between the second and third pixel regions PX2 and PX3.

Each of the conductive structures 450 may include the first contact plug 451, a single second contact plug 452, and the conductive pattern 455. When viewed in plan, one end of the conductive structure 450 may overlap a corresponding one of the conductive line patterns 310. For example, the first contact plug 451 of the conductive structure 450 may be coupled to the conductive line pattern 310. The other end of the conductive structure 450 may overlap a corresponding pixel region PX. For example, the second contact plug 452 may be coupled to the first impurity region 111.

Figure 3C:
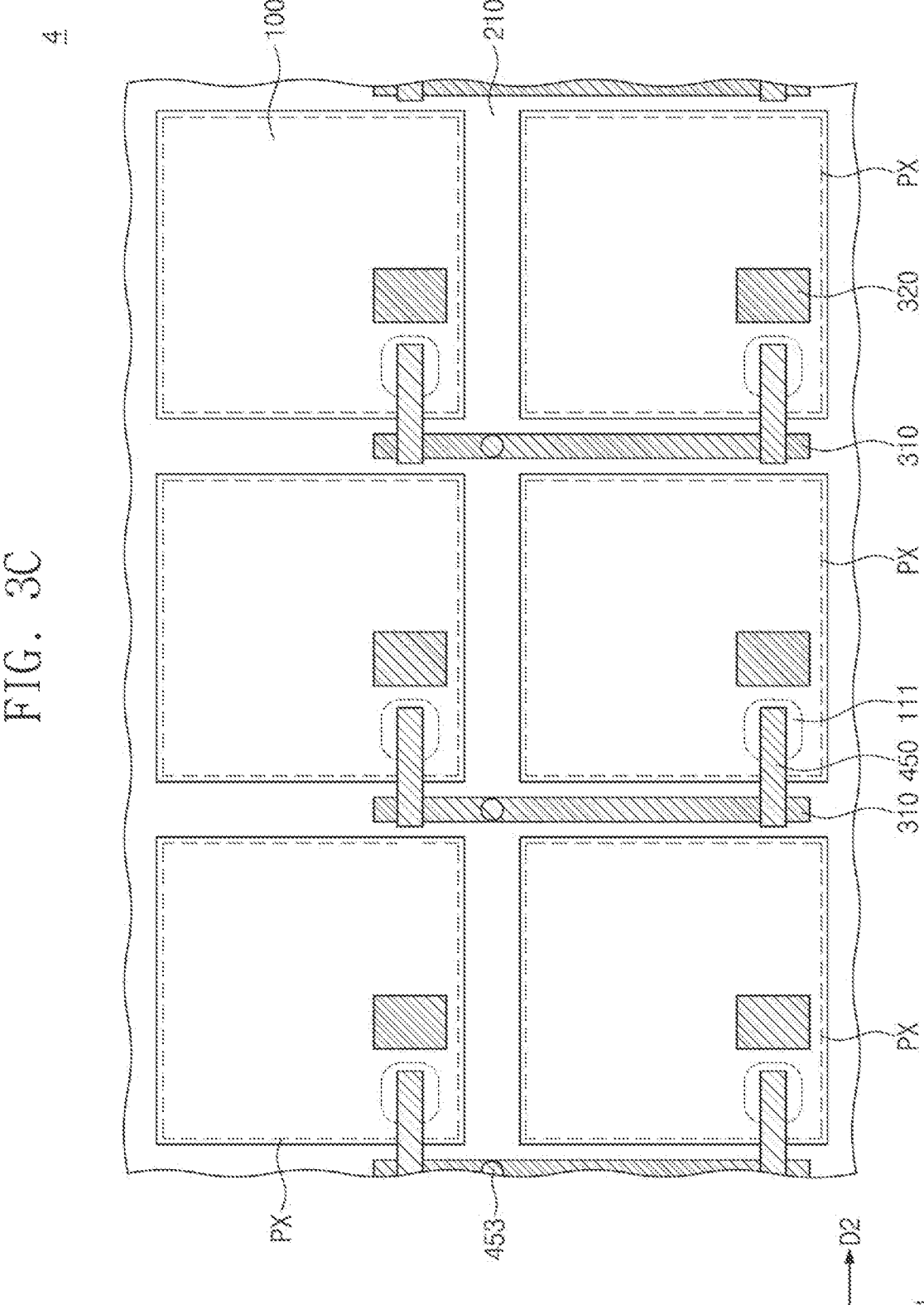
FIG. 3C illustrates a plan view showing an image sensor according to some examples embodiments.

FIG. 3C illustrates a plan view showing an image sensor according to some example embodiments. The following discussion of FIG. 3C also refers to FIG. 3B.

Referring to FIG. 3C, an image sensor 4 may include substrate 100, the isolation pattern 210, the conductive line pattern 310, the gate pattern 320, and the conductive structure 450. The conductive line pattern 310 may have a relatively small length when viewed in plan. The conductive line pattern 310 may have a major axis that extends parallel to the first direction D1. The conductive line pattern 310 may be electrically connected through a plurality of the conductive structures 450 to two neighboring pixel regions PX, and the two pixel regions PX may be arranged in the first direction D1. For example, the conductive structures 450 may overlap the first impurity regions 111 of the two pixel regions PX.

Figure 3D:
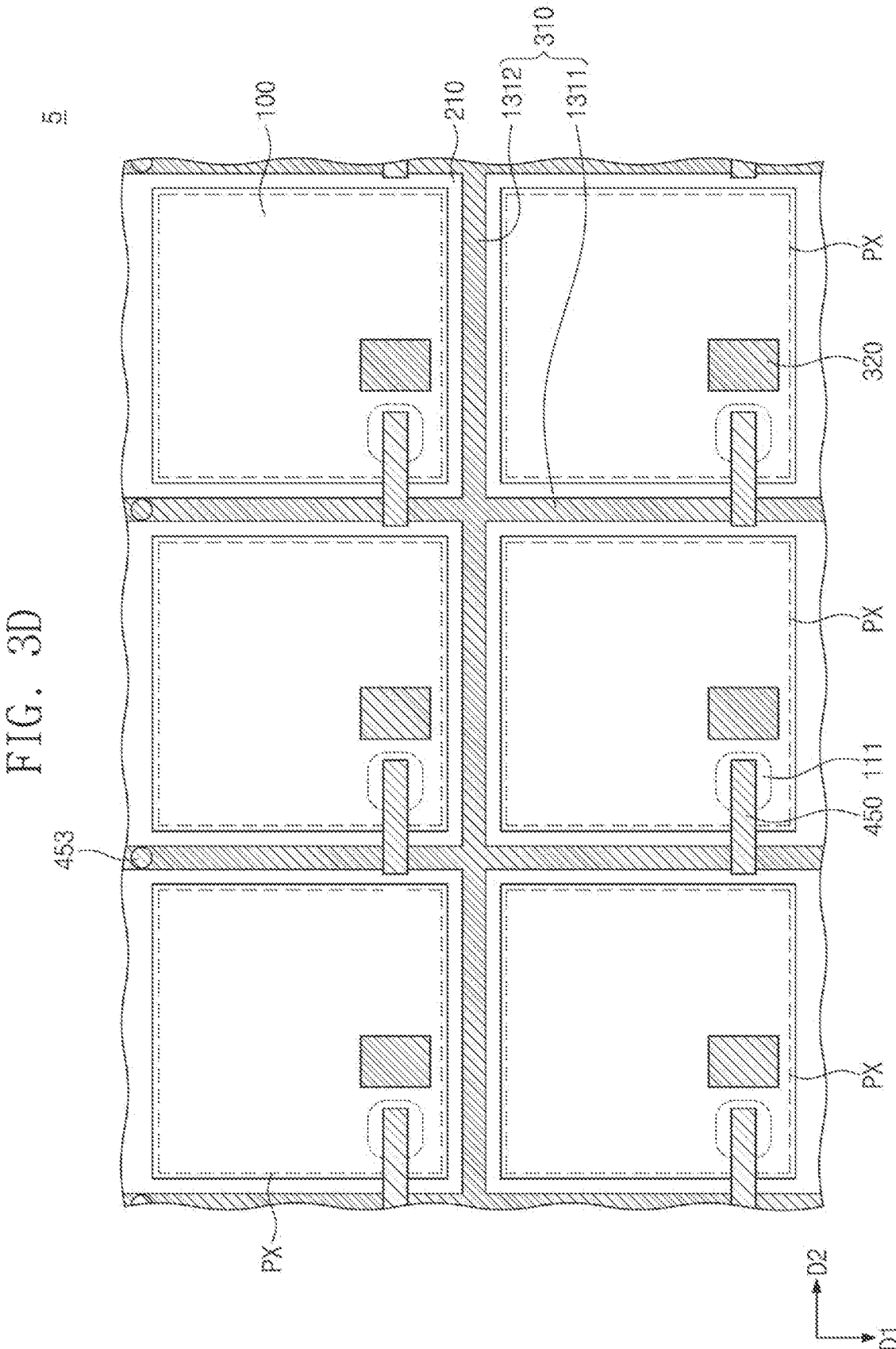
FIG. 3D illustrates a plan view showing an image sensor according to some examples embodiments.

FIG. 3D illustrates a plan view showing an image sensor according to some example embodiments.

Referring to FIG. 3D, an image sensor 5 may include the substrate 100, the isolation pattern 210, the conductive line pattern 310, the gate pattern 320, and the conductive structure 450. The conductive line pattern 310 may include a first line pattern 1311 that extends along the first direction D1 and a second line pattern 1312 that extends along the second direction D2. The second line pattern 1312 may be connected to the first line pattern 1311.

The image sensor 4 of FIG. 3C or the image sensor 5 of FIG. 3D may include the device dielectric pattern 220 and the wiring line layer 400 the same as that illustrated in FIG. 3B. In certain example embodiments, a planar shape of the conductive line pattern 310 is not limited to that shown in FIG. 2A, 3A, 3C, or 3D, but may be variously changed.

The following will describe an electrical connection between the conductive line pattern and the conductive structure according to some example embodiments.

Figure 4A:
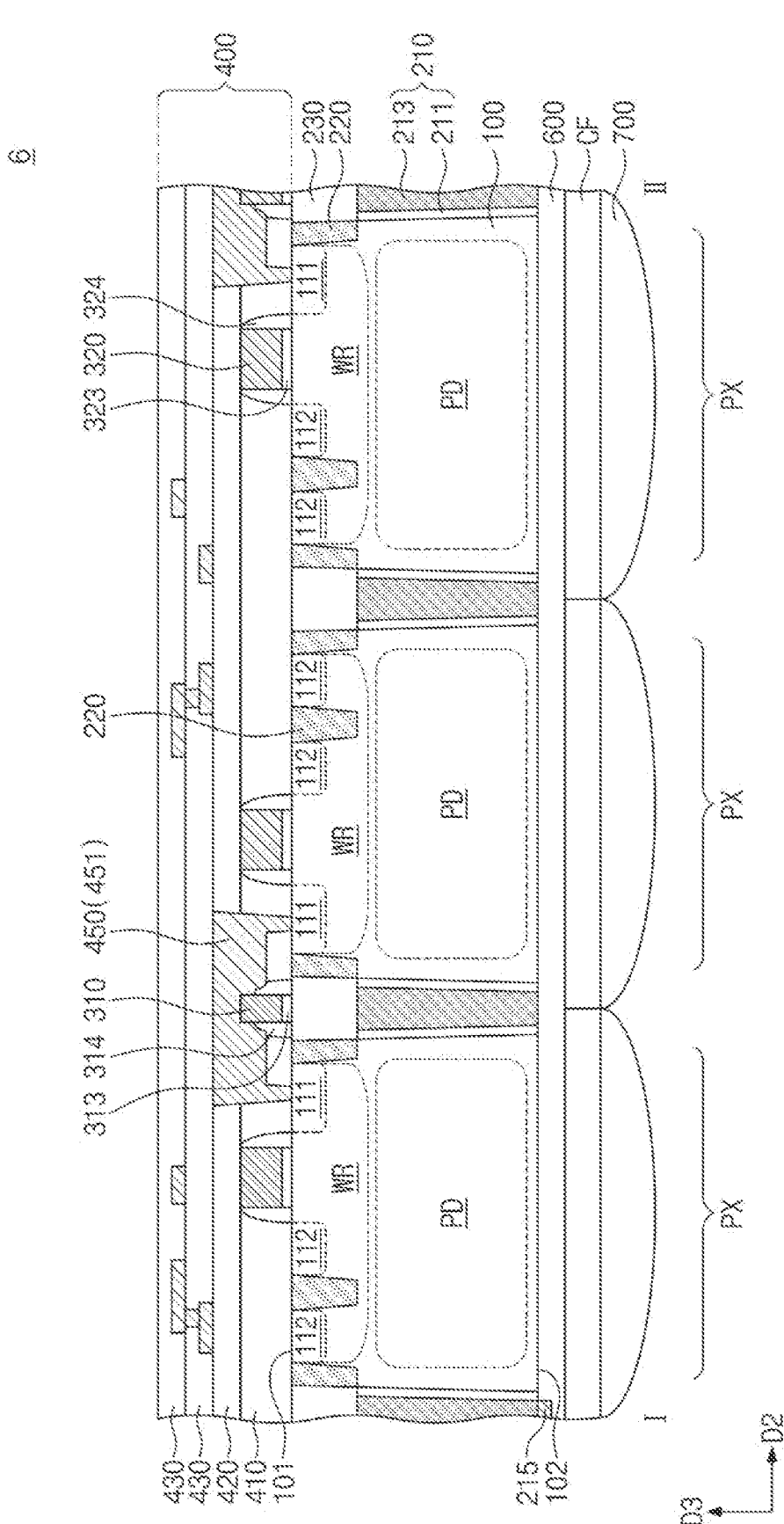
FIG. 4A illustrates a cross-sectional view showing an image sensor according to some examples embodiments.

FIG. 4A illustrates a cross-sectional taken along line I-II of FIG. 2A, showing an image sensor according to some example embodiments. A duplicate description will be omitted below for conciseness.

Referring to FIG. 4A, an image sensor 6 may include the substrate 100, the isolation pattern 210, the device dielectric pattern 220, the conductive line pattern 310, the gate pattern 320, and the conductive structure 450. The substrate 100, the isolation pattern 210, the device dielectric pattern 220, the conductive line pattern 310, and the gate pattern 320 may be substantially the same as those discussed above.

The conductive structure 450 may include the first contact plug 451, but may not include the second contact plug (see 452 of FIG. 2B) or the conductive pattern (see 455 of FIG. 2B). The first contact plug 451 may be directly electrically connected to the conductive line pattern 310 and the first impurity region 111. The first contact plug 451 may cover the top surface of the conductive line pattern 310 and a portion of the first surface 101 of the substrate 100. At least a portion of the first surface 101 of the substrate 100 may correspond to the first impurity region 111.

The line spacer 314 may expose at least a portion of the sidewall of the conductive line pattern 310. The first contact plug 451 may further cover the line spacer 314 and the exposed sidewall of the conductive line pattern 310.

Figure 4B:
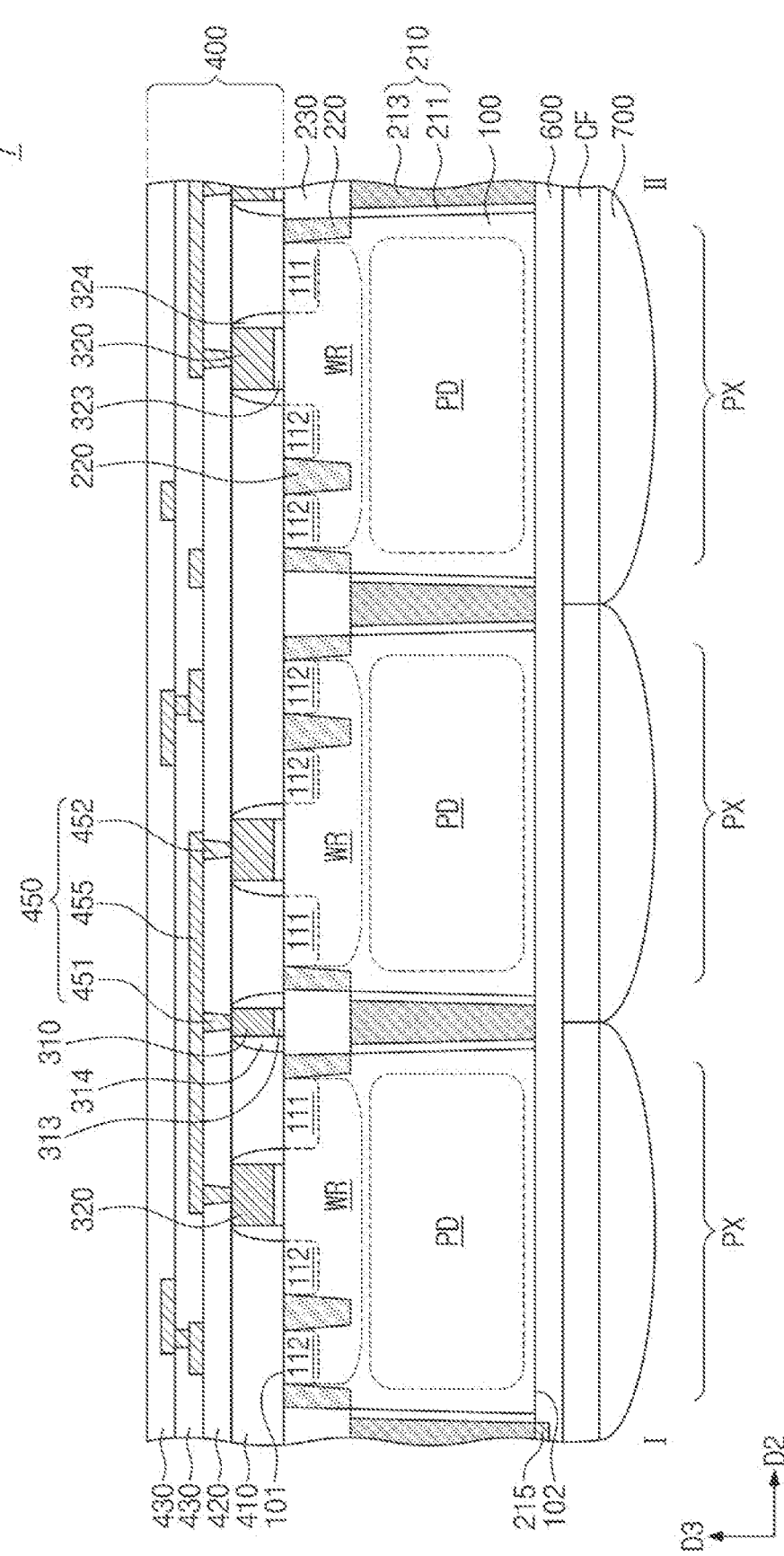
FIG. 4B illustrates a cross-sectional view showing an image sensor according to some examples embodiments.

FIG. 4B illustrates a cross-sectional view taken along line I-II of FIG. 2A, showing an image sensor according to some example embodiments. A duplicate description will be omitted below for conciseness.

Referring to FIG. 4B, an image sensor 7 may include the substrate 100, the isolation pattern 210, the device dielectric pattern 220, the conductive line pattern 310, the gate pattern 320, and the conductive structure 450. The conductive structure 450 may include the first contact plug 451, the second contact plug 452, and the conductive pattern 455.

The second contact plug 452 may be disposed on and electrically connected to the gate pattern 320. The gate pattern 320 may be electrically connected through the conductive structure 450 to the conductive line pattern 310. Therefore, the conductive line pattern 310 may serve as a pathway through which voltage is applied to the gate pattern 320.

The conductive structure 450 may include a plurality of the second contact plugs 452, and the second contact plugs 452 may be connected to corresponding gate patterns 320 of a plurality of the pixel regions PX. In this configuration, the conductive line pattern 310 may be electrically connected through the conductive structure 450 to the gate patterns 320 of different pixel regions PX. The gate patterns 320 connected to the conductive line pattern 310 may be gate electrodes of the same type transistors. In some example embodiments, differently from that shown in FIG. 4B, the conductive structure 450 may include a single second contact plug 452, and the second contact plug 452 may be coupled to the gate pattern 320 of one of the pixel regions PX.

Figure 4C:
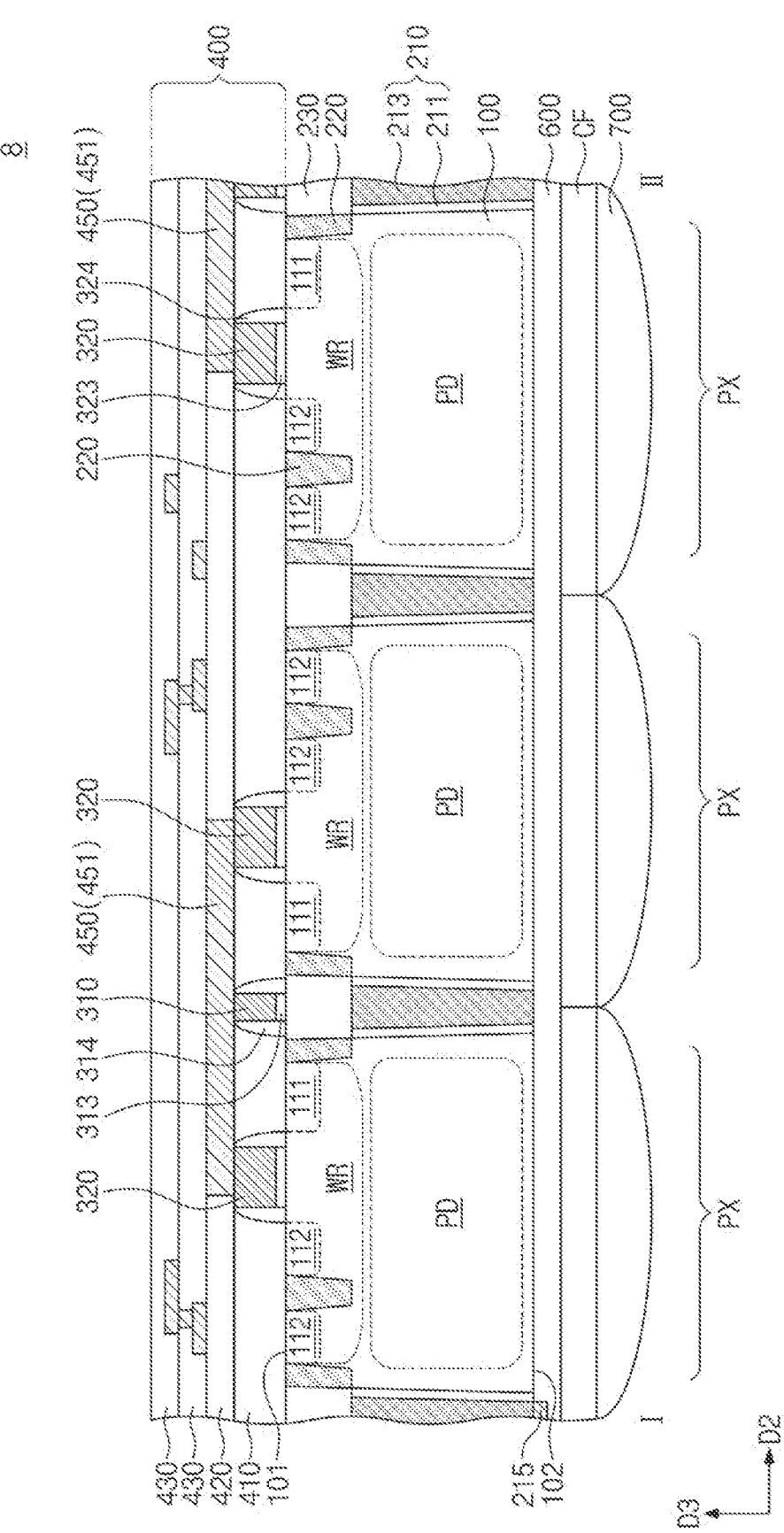
FIG. 4C illustrates a cross-sectional view showing an image sensor according to some examples embodiments.

FIG. 4C illustrates a cross-sectional view taken along line I-II of FIG. 2A, showing an image sensor according to some example embodiments.

Referring to FIG. 4C, an image sensor 8 may include the substrate 100, the isolation pattern 210, the device dielectric pattern 220, the conductive line pattern 310, the gate pattern 320, and the conductive structure 450.

The conductive structure 450 may include the first contact plug 451, but may omit the second contact plug (see 452 of FIG. 2B) and the conductive pattern (see 455 of FIG. 2B). The first contact plug 451 may be disposed on the first dielectric layer 410 and in the second dielectric layer 420. The first contact plug 451 may be directly electrically connected to the conductive line pattern 310 and the gate pattern 320. For example, the first contact plugs 451 may be in direct contact with the top surface of the conductive line pattern 310 and a top surface of the gate pattern 320. In the example shown in FIG. 4C, the first contact plug 451 may not be in contact with the first impurity regions 111 and the second impurity regions 112. For example, the first dielectric layer 410 may be provided between the first contact plug 451 and the first surface 101 of the substrate 100 and between the conductive line pattern 310 and the gate pattern 320.

FIGS. 5A to 5H illustrate cross-sectional views taken along line I-II of FIG. 2A, showing a method of fabricating an image sensor according to some example embodiments. The discussion of FIGS. 5A to 5H also refers to FIGS. 2A to 2D, and a duplicate description will be omitted below for conciseness.

Figure 5A:
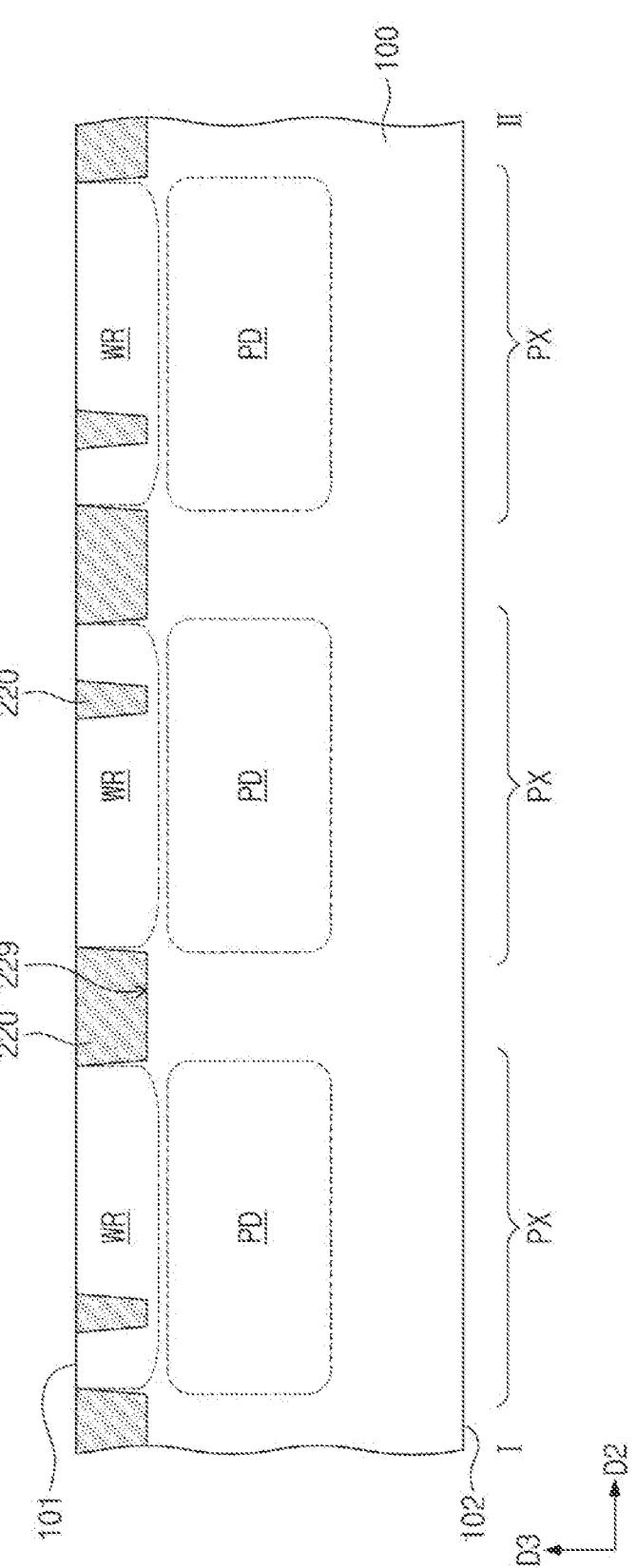
FIGS. 5A to 5H illustrate cross-sectional views showing a method of fabricating an image sensor according to some examples embodiments.

Referring to FIG. 5A, a substrate 100 may be prepared. The substrate 100 may be doped with impurities having a first conductivity type. A photoelectric conversion region PD and a well impurity region WR may be formed in the substrate 100. The formation of the photoelectric conversion region PD may include forming on a first surface 101 of the substrate 100 a mask (not shown) having openings that correspond to pixel regions PX, and using the mask to implant the substrate 100 with impurities having a second conductivity type (e.g., n-type) different from the first conductivity type. The formation of the well impurity region WR may include using the mask to implant the substrate 100 with impurities having the first conductivity type. After the formation of the photoelectric conversion region PD and the well impurity region WR, the mask may be removed. The photoelectric conversion region 110 may be formed deep from the first surface 101 of the substrate 100, and the well impurity region WR may be formed adjacent to the first surface 101 of the substrate 100.

A device dielectric pattern 220 may be formed in the substrate 100. In certain example embodiments, a first trench 229 may be formed on the first surface 101 of the substrate 100. The first trench 229 may be a shallow trench. The first trench 229 may have a depth less than that of the well impurity region WR. A dielectric layer (not shown) may be formed to fill the first trench 229, and a planarization process may be performed on the dielectric layer until the first surface 101 of the substrate 100 is exposed. Therefore, the device dielectric pattern 220 may be formed in the first trench 229.

Figure 5B:
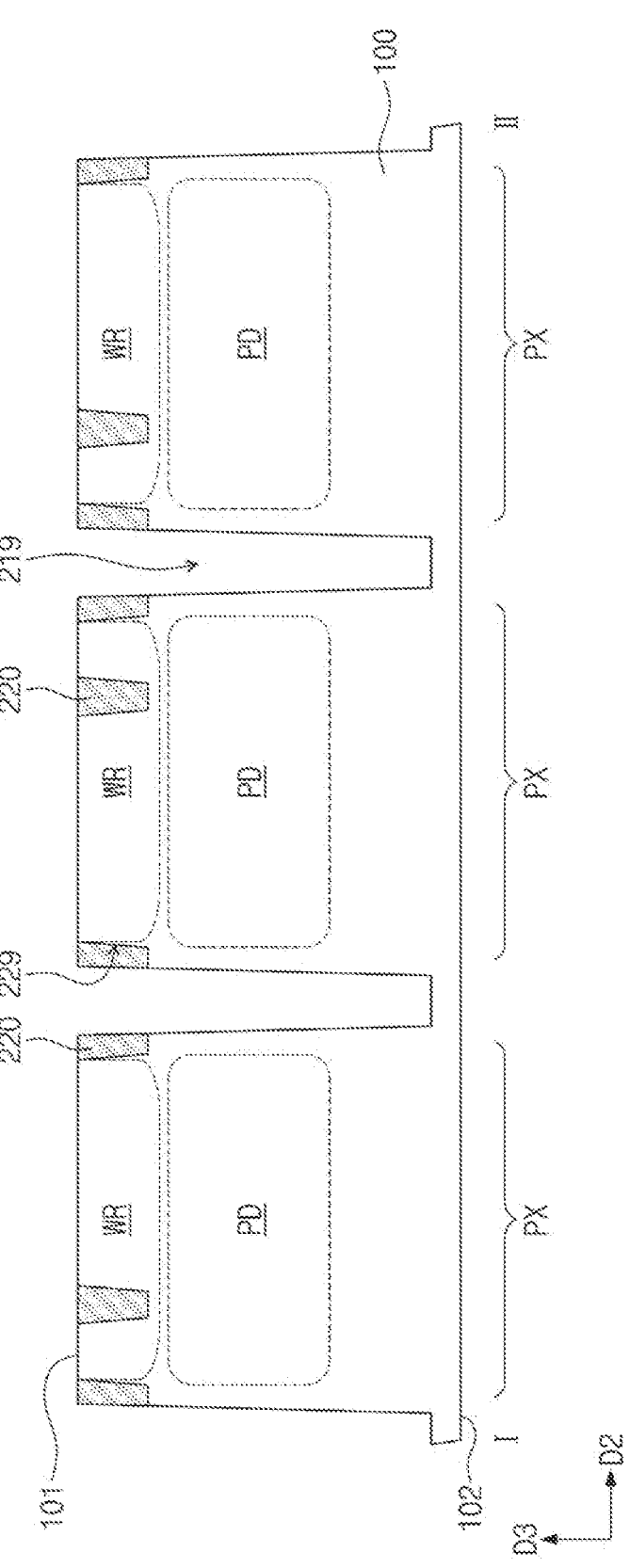

Referring to FIG. 5B, a second trench 219 may be formed between the pixel regions PX in the substrate 100. The formation of the second trench 219 may include forming a mask layer (not shown) on the first surface 101 of the substrate 100, and performing an etching process in which the mask layer is used as an etching mask. The etching process may be, for example, an anisotropic etching process. The second trench 219 may penetrate the device dielectric pattern 220 and a portion of the substrate 100. A bottom surface of the second trench 219 may be provided in the substrate 100.

Figure 5C:
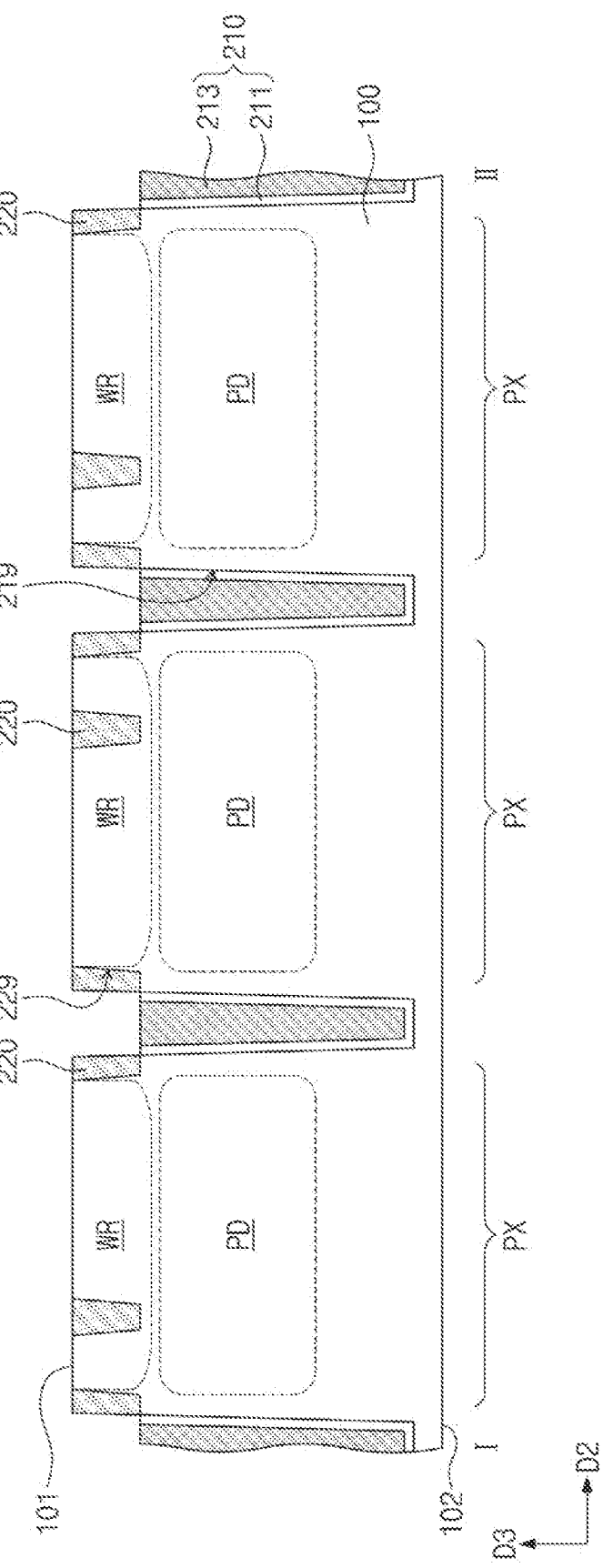

Referring to FIG. 5C, an isolation pattern 210 may be formed in the second trench 219. The isolation pattern 210 may include a dielectric isolation pattern 211 and a conductive isolation pattern 213. The formation of the dielectric isolation pattern 211 and the conductive isolation pattern 213 may include forming a preliminary dielectric isolation layer (not shown) that conformally covers inner walls of the second trench 219, forming on the preliminary dielectric isolation layer a preliminary conductive isolation layer (not shown) that partially fills the second trench 219, and performing a recess process on the preliminary conductive isolation layer and the preliminary dielectric isolation layer. The recess process may include an etch-back process or a planarization process. The recess process may remove the preliminary dielectric isolation layer and the preliminary conductive isolation layer that are formed in an upper portion of the second trench 219. The recess process may also remove the preliminary dielectric isolation layer and the preliminary conductive isolation layer that are formed on the first surface 101 of the substrate 100. The preliminary dielectric isolation layer may be recessed to form the dielectric isolation pattern 211. The preliminary conductive isolation layer may be recessed to form the conductive isolation pattern 213. Therefore, the isolation pattern 210 may be formed in the second trench 219. The isolation pattern 210 may expose an upper sidewall of the second trench 219. The upper sidewall of the second trench 219 may correspond to an inner sidewall of the device dielectric pattern 220.

Figure 5D:
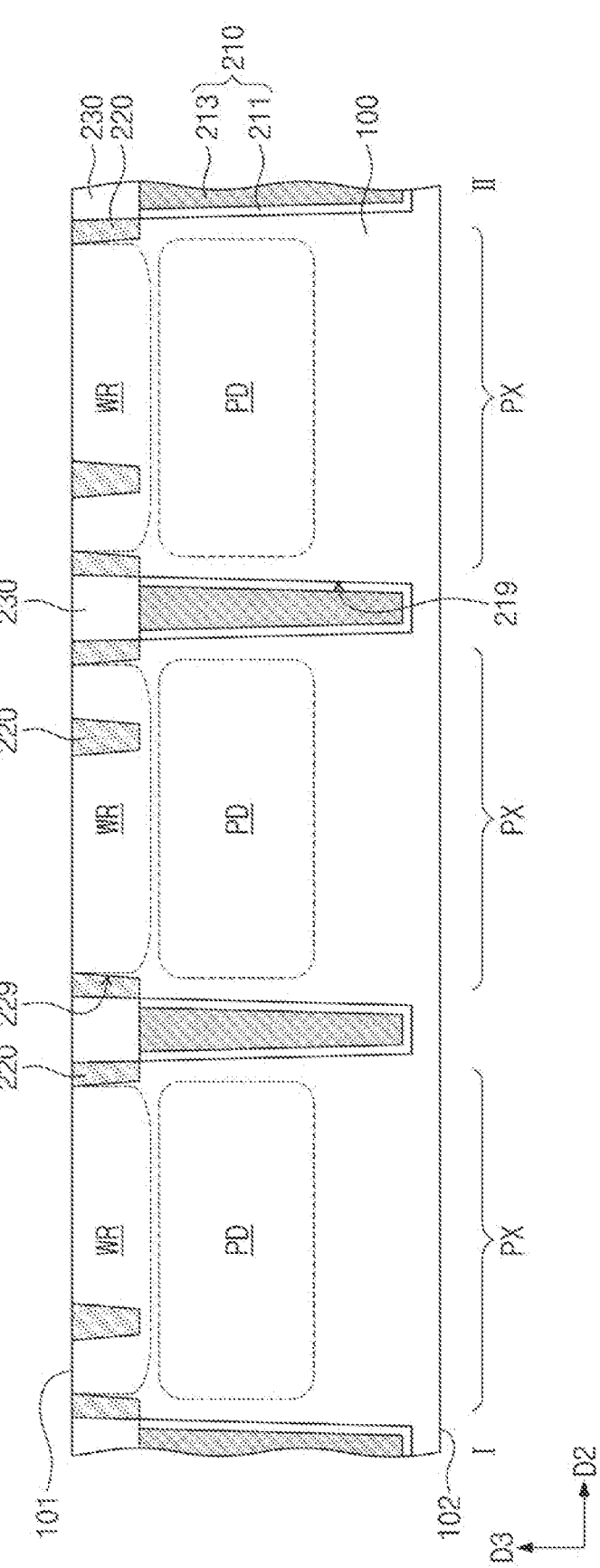

Referring to FIG. 5D, a first dielectric pattern 230 may be formed to fill an upper portion of the second trench 219. The first dielectric pattern 230 may cover a top surface of the dielectric isolation pattern 211, a top surface of the conductive isolation pattern 213, and the inner sidewall of the device dielectric pattern 220. The first dielectric pattern 230 may have a top surface at substantially the same level as that of the first surface 101 of the substrate 100 and that of a top surface of the device dielectric pattern 220.

Figure 5E:
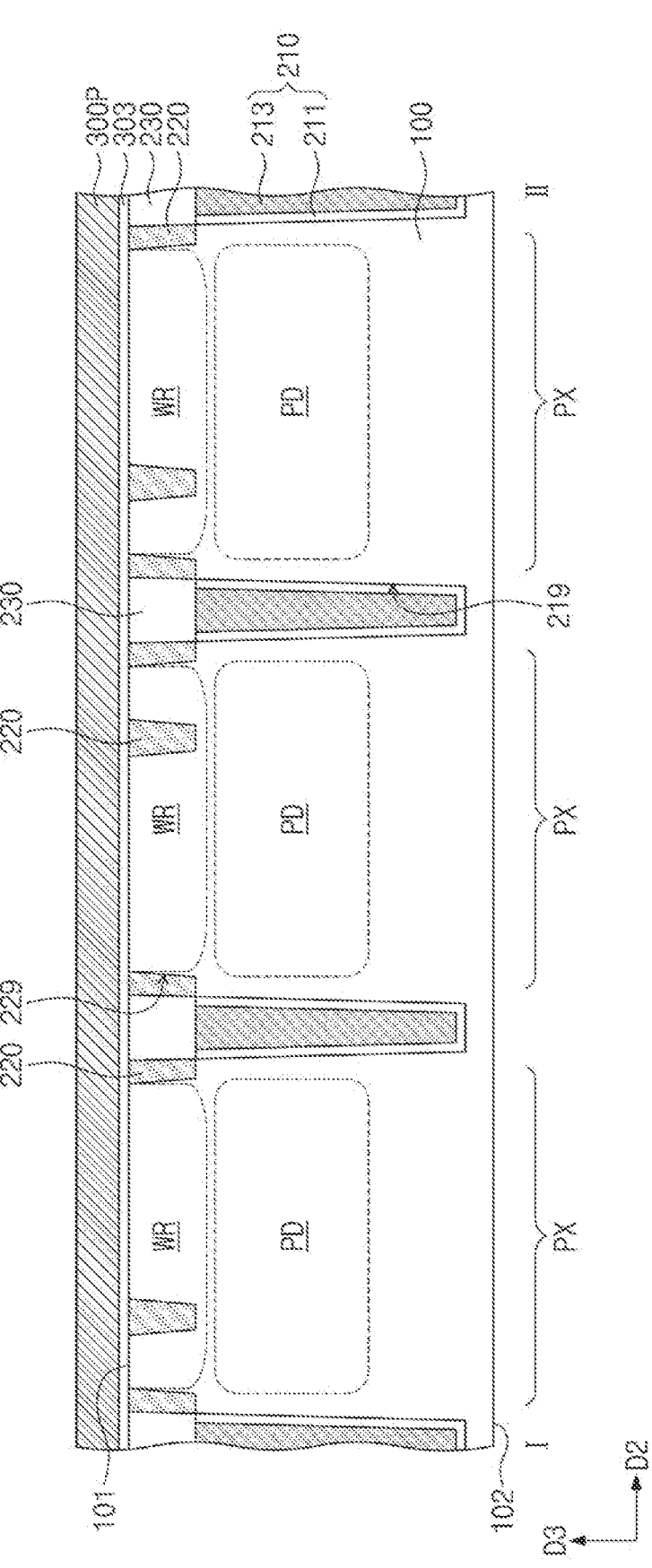

Referring to FIG. 5E, a dielectric layer 303 and a preliminary layer 300P may be formed on the first surface 101 of the substrate 100. The dielectric layer 303 may be formed to cover the first surface 101 of the substrate 100, the top surface of the device dielectric pattern 220, and the top surface of the first dielectric pattern 230. The dielectric layer 303 may include one or more of a silicon-based dielectric material (e.g., silicon nitride, silicon oxide, and/or silicon oxynitride) and a high-k dielectric material (e.g., hafnium oxide and/or aluminum oxide). The preliminary layer 300P may be formed on the dielectric layer 303. The preliminary layer 300P may include, for example, polysilicon.

Figure 5F:
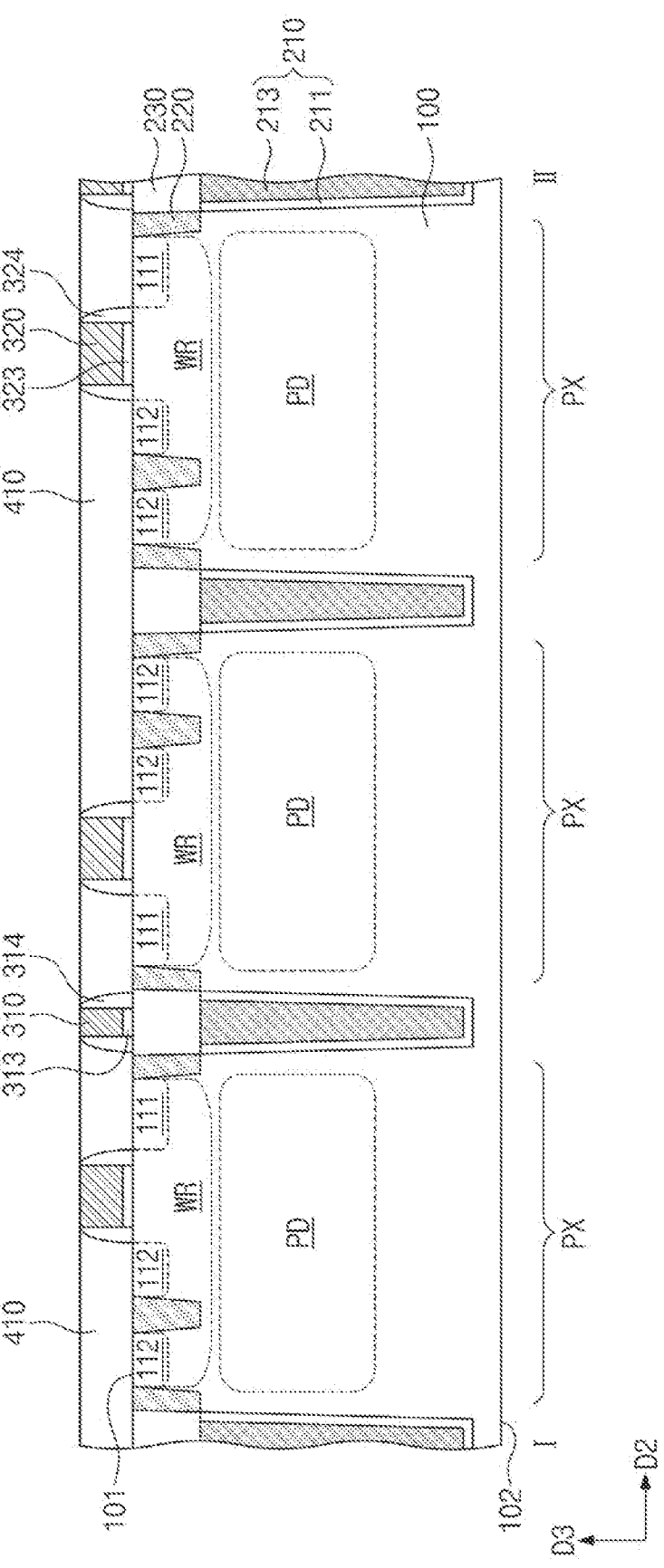

Referring to FIG. 5F, the dielectric layer 303 and the preliminary layer 300P may be patterned to form a second dielectric pattern 313, a gate dielectric pattern 323, a conductive line pattern 310, and a gate pattern 320. In certain example embodiments, the preliminary layer 300P may be patterned to form the conductive line pattern 310 and the gate pattern 320 that are separated from each other. The conductive line pattern 310 and the gate pattern 320 may include polysilicon. The dielectric layer 303 may be patterned to form the second dielectric pattern 313 and the gate dielectric pattern 323. The patterning of the dielectric layer 303 may include that the dielectric layer 303 is etched at its portion exposed by the conductive line pattern 310 and the gate pattern 320. Therefore, the second dielectric pattern 313 may be locally formed below the conductive line pattern 310, and the gate dielectric pattern 323 may be locally formed below the gate pattern 320.

A line spacer 314 may be formed on a sidewall of the conductive line pattern 310 and a sidewall of the second dielectric pattern 313. A gate spacer 324 may be formed on a sidewall of the gate pattern 320 and a sidewall of the gate dielectric pattern 323. A single process may be performed to form the line spacer 314 and the gate spacer 324. For example, a spacer layer (not shown) may be formed on the first surface 101 of the substrate 100, thereby covering the conductive line pattern 310 and the gate pattern 320. The spacer layer may undergo an etching process to form the line spacer 314 and the gate spacer 324. Therefore, the gate spacer 324 may include the same material as that of the line spacer 314. Afterwards, the first surface 101 of the substrate 100 may be implanted with first conductivity type impurities to form a first impurity region 111 and second impurity regions 112.

A first dielectric layer 410 may be formed on the first surface 101 of the substrate 100, thereby covering the first and second impurity regions 111 and 112. The first dielectric layer 410 may cover an outer sidewall of the line spacer 314 and an outer sidewall of the gate spacer 324. The first dielectric layer 410 may expose a top surface of the conductive line pattern 310 and a top surface of the gate pattern 320.

Figure 5G:
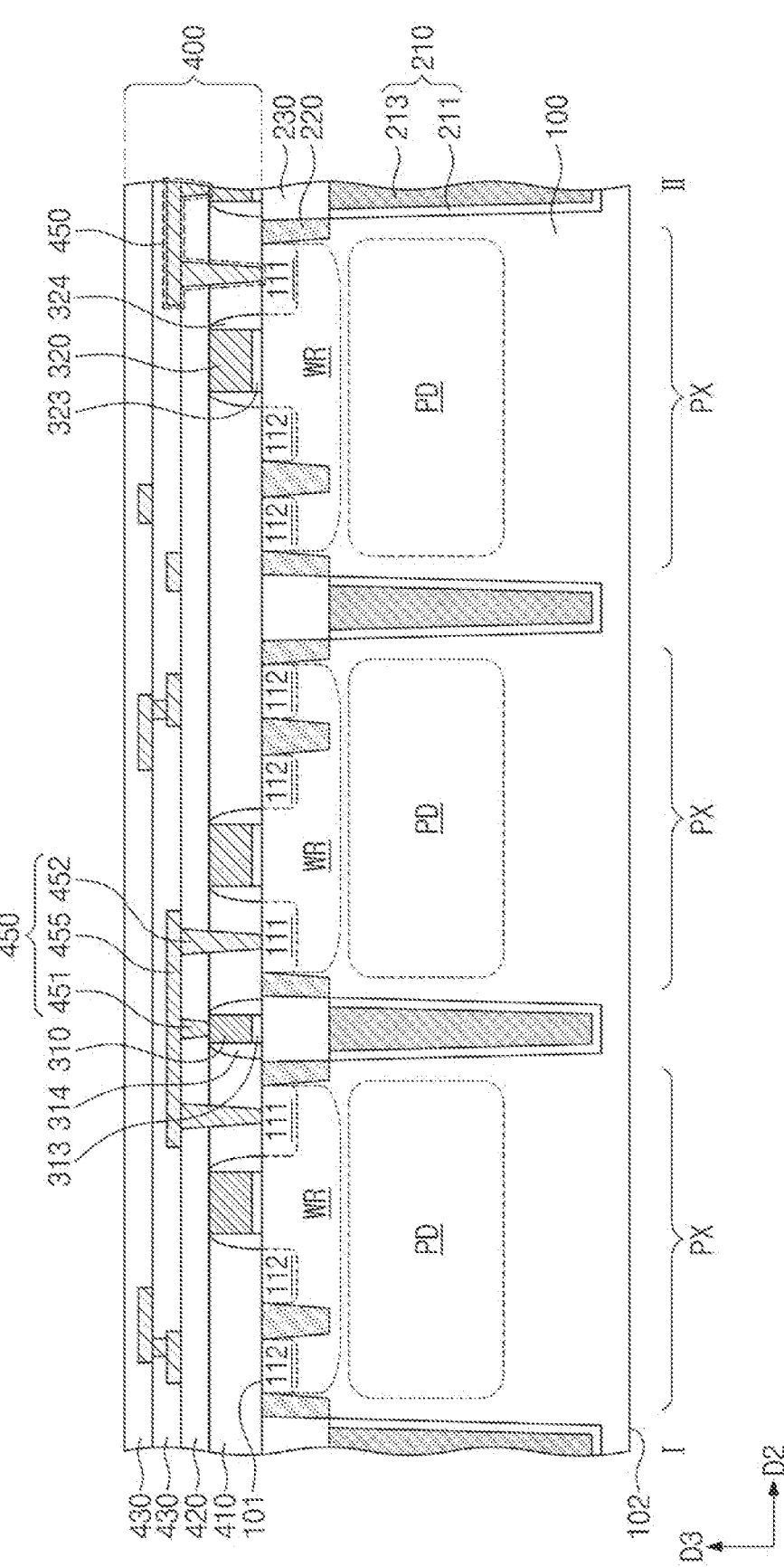

Referring to FIG. 5G, a second dielectric layer 420 may be formed on the first dielectric layer 410. A first contact plug 451 may be formed to penetrate the second dielectric layer 420. A second contact plug 452 may be formed to penetrate the first dielectric layer 410 and the second dielectric layer 420. A conductive pattern 455 may be formed on a top surface of the second dielectric layer 420 and thereby electrically connected to the first and second contact plugs 451 and 452. Wiring lines may further be formed on the top surface of the second dielectric layer 420, and the wiring lines may be formed by a single process used for forming the conductive pattern 455.

A third dielectric layer 430 may be formed on the second dielectric layer 420, thereby covering the conductive pattern 455. The formation of the wiring lines and the third dielectric layer 430 may be repeatedly performed to form a plurality of stacked third dielectric layers 430 and a plurality of stacked wiring lines.

Although not shown, a third contact plug 453 discussed in FIGS. 2A to 2D may be formed in the second dielectric layer 420, and thus the third contact plug 453 may be coupled to the conductive line pattern 310. The second contact plug 452 may further penetrate at least one of the third dielectric layers 430.

Figure 5H:
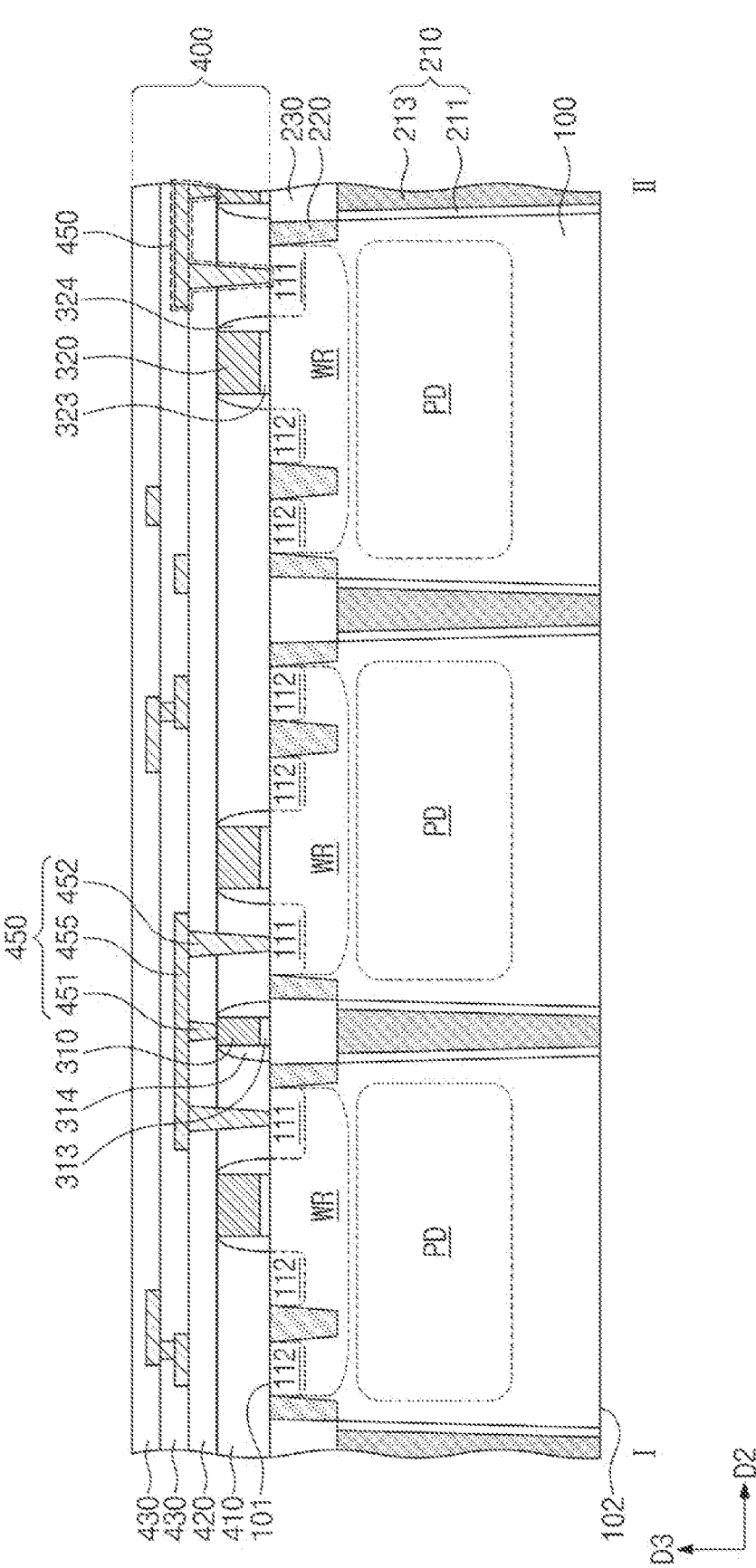

Referring to FIG. 5H, a thinning process may be performed on a second surface 102 of the substrate 100. The thinning process may include a grinding process or a chemical mechanical polishing process. As a result of the thinning process, the isolation pattern 210 may be exposed on the second surface 102 of the substrate 100. For example, the conductive isolation pattern 213 may be exposed on the second surface 102 of the substrate 100.

Referring to FIG. 2B, a conductive terminal 215 may be formed on the second surface 102 of the thinned substrate 100 and thereby coupled to the conductive isolation pattern 213. A backside dielectric layer 600 may be formed on the second surface 102 of the thinned substrate 100, thereby covering the second surface 102 of the substrate 100 and a bottom surface of the isolation pattern 210. Color filters CF and micro-lenses 700 may be formed on a bottom surface of the backside dielectric layer 600. The image sensor 1 discussed in FIGS. 2A to 2D may be fabricated through the processes explained above.

Figure 6A:
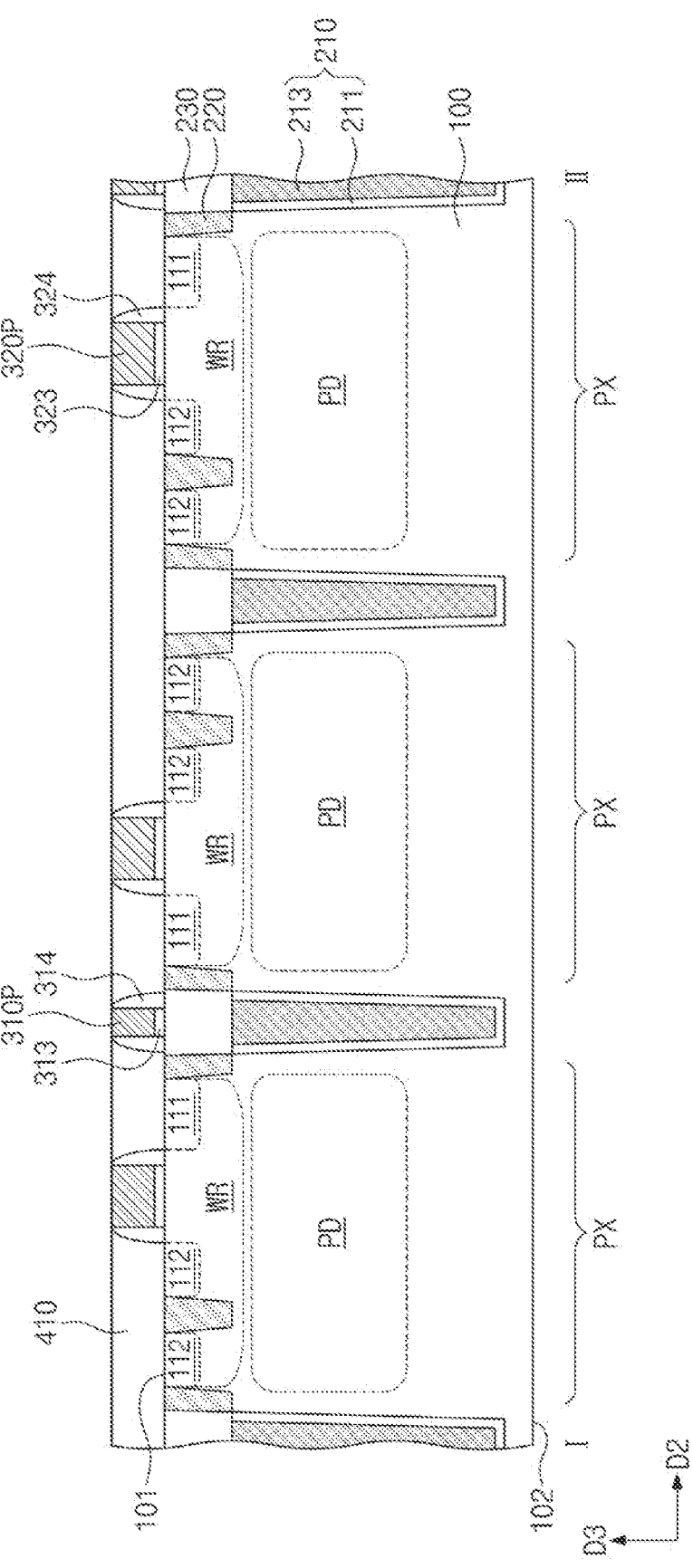
FIGS. 6A and 6B illustrate cross-sectional views showing a method of forming a conductive line pattern and a gate pattern according to some examples embodiments.
Figure 6B:
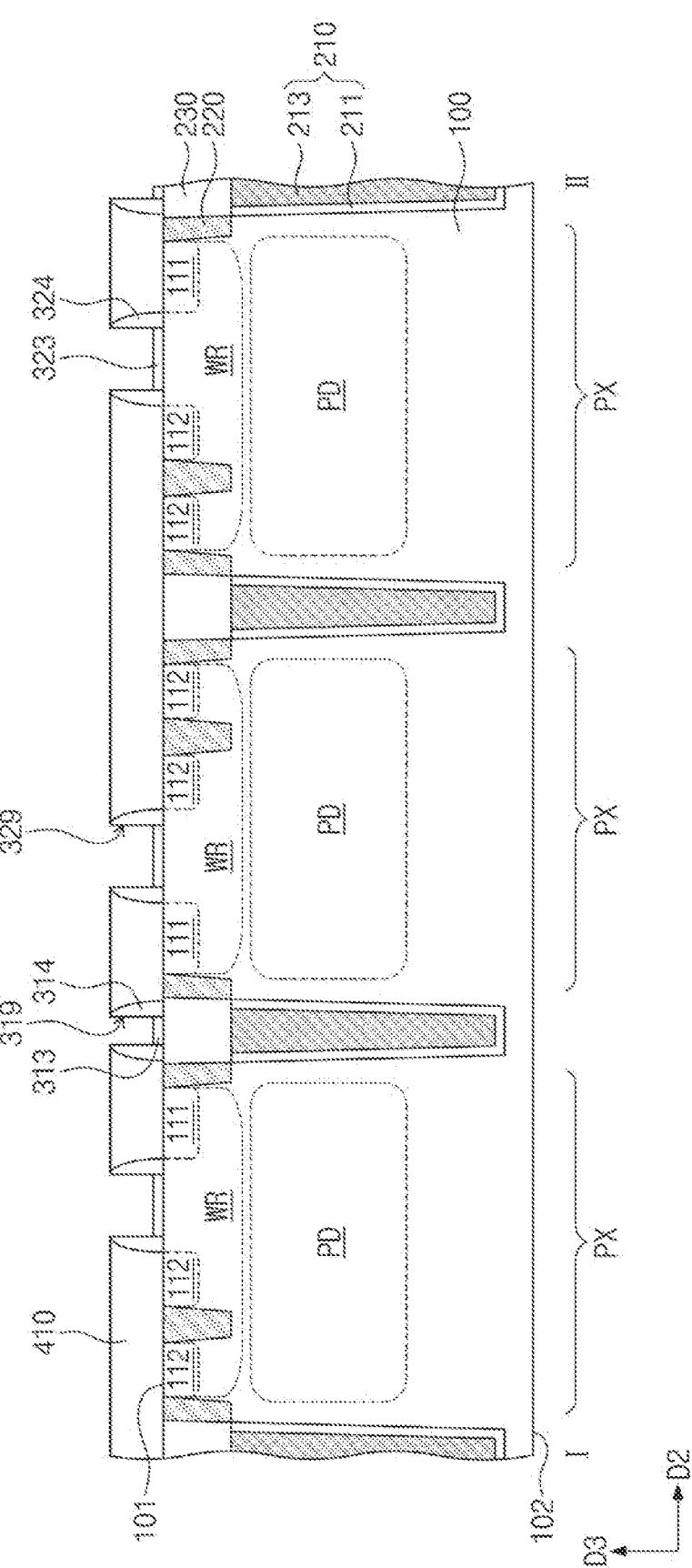

FIGS. 6A and 6B illustrate cross-sectional views taken along line I-II of FIG. 2A, showing a method of forming a conductive line pattern and a gate pattern according to some example embodiments. A duplicate description will be omitted below for conciseness.

Referring sequentially to FIGS. 5A to 5E, a photoelectric conversion region PD, a well impurity region WR, an isolation pattern 210, a device dielectric pattern 220, and a first dielectric pattern 230 may be formed in a substrate 100. A dielectric layer 303 and a preliminary layer 300P may be formed on a first surface 101 of the substrate 100.

Referring to FIGS. 5E and 6A, the dielectric layer 303 and the preliminary layer 300P may be patterned to form a second dielectric pattern 313, a gate dielectric pattern 323, a preliminary conductive line pattern 310P, and a preliminary gate pattern 320P. A line spacer 314 and a gate spacer 324 may be respectively formed on a sidewall of the preliminary conductive line pattern 310P and a sidewall of the preliminary gate pattern 320P. The line spacer 314 and the gate spacer 324 may be formed by performing substantially the same method as that used for forming the line spacer 314 and the gate spacer 324 discussed with reference to FIG. 5F. The first surface 101 of the substrate 100 may be implanted with first conductivity type impurities to form a first impurity region 111 and second impurity regions 112.

A first dielectric layer 410 may be formed on the first surface 101 of the substrate 100, thereby covering an outer sidewall of the line spacer 314 and an outer sidewall of the gate spacer 324. The first dielectric layer 410 may expose a top surface of the preliminary conductive line pattern 310P and a top surface of the preliminary gate pattern 320P.

Referring to FIG. 6B, the preliminary conductive line pattern 310P and the preliminary gate pattern 320P may be removed to respectively form a first opening 319 and a second opening 329. For example, an etching process may be performed for removal of the preliminary conductive line pattern 310P and the preliminary gate pattern 320P. For example, a single etching process may be performed to remove the preliminary conductive line pattern 310P and the preliminary gate pattern 320P. The removal of the preliminary conductive line pattern 310P may form the first opening 319 between inner sidewalls of the line spacer 314. The first opening 319 may expose the first dielectric pattern 230. The removal of the preliminary gate pattern 320P may form the second opening 329 between inner sidewalls of the gate spacer 324. The second opening 329 may expose the gate dielectric pattern 323.

Referring sequentially to FIGS. 6B and 5F, a conductive line pattern 310 and a gate pattern 320 may be respectively formed in the first opening 319 and the second opening 329. The formation of the conductive line pattern 310 and the gate pattern 320 may include forming a metal layer that fills the first and second openings 319 and 329, and performing a planarization process on the metal layer until the first dielectric layer 410 is exposed. The planarization process may cause that the conductive line pattern 310 is locally formed in the first opening 319, and that the gate pattern 320 is locally formed in the second opening 329.

Thereafter, the processes discussed with reference to FIGS. 5G and 5H may be performed to form a wiring line layer 400 on the first surface 101 of the substrate 100 and to thin the substrate 100.

Referring to FIG. 2B, a conductive terminal 215, a backside dielectric layer 600, color filters CF, and microlenses 700 may be formed on a second surface 102 of the substrate 100. Therefore, the image sensor 1 may be fabricated. In certain example embodiments, the conductive line pattern 310 may include the same material as that of the gate pattern 320. For example, the conductive line pattern 310 may include the same metallic material as that of the gate pattern 320.

Figure 6C:
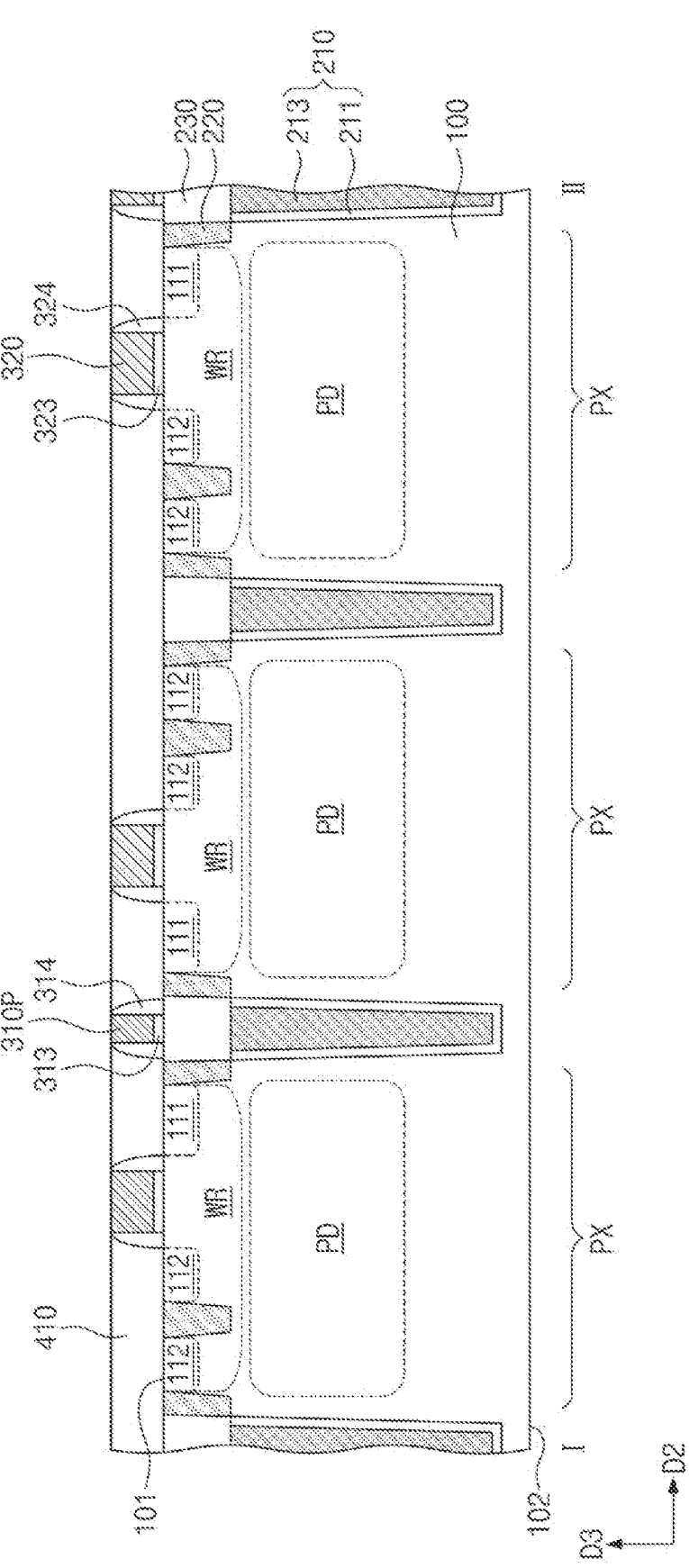
FIGS. 6C and 6D illustrate cross-sectional views showing a method of forming a conductive line pattern and a gate pattern according to some examples embodiments.
Figure 6D:
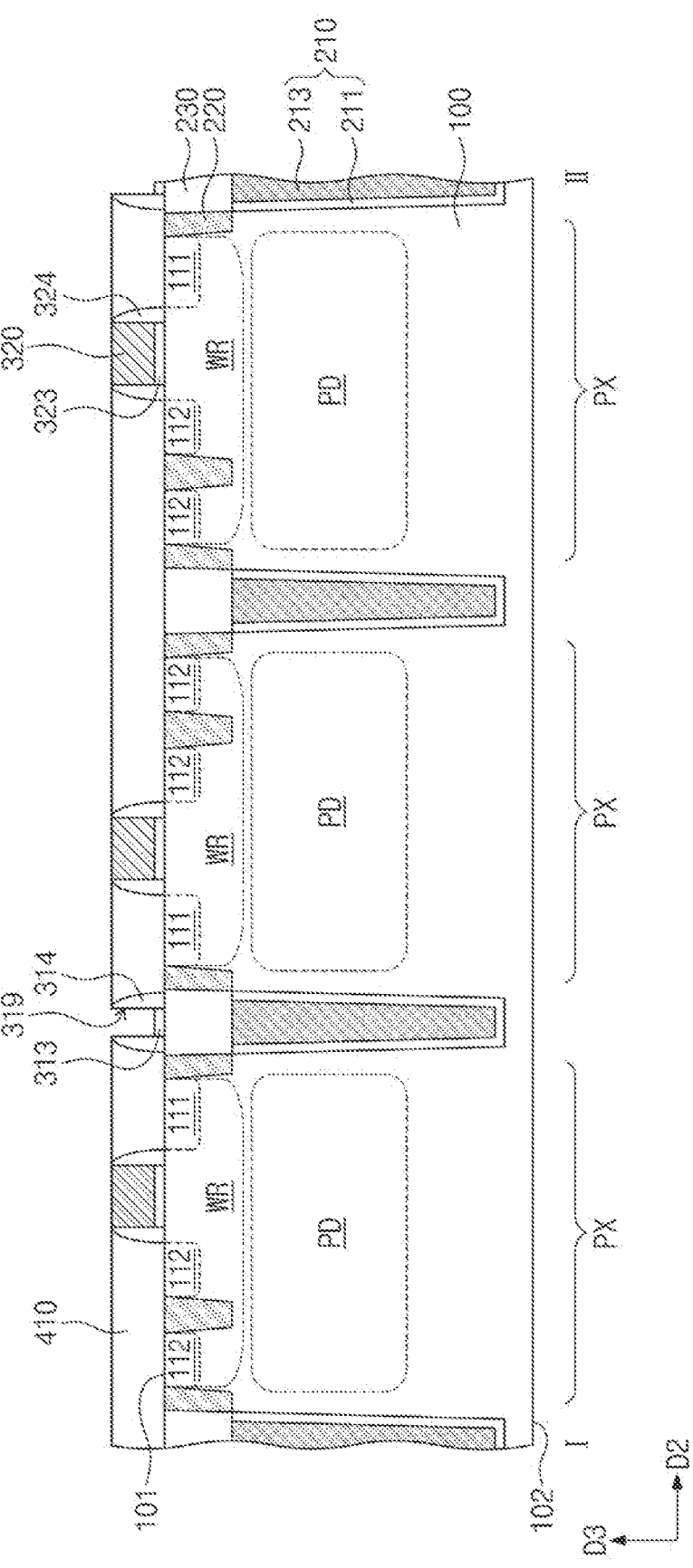

FIGS. 6C and 6D illustrate cross-sectional views taken along line I-II of FIG. 2A, showing a method of forming a conductive line pattern and a gate pattern according to some example embodiments. A duplicate description will be omitted below for conciseness.

Referring sequentially to FIGS. 5A to 5F, a photoelectric conversion region PD, a well impurity region WR, an isolation pattern 210, a device dielectric pattern 220, and a first dielectric pattern 230 may be formed in a substrate 100. A dielectric layer 303 and a preliminary layer 300P may be formed on a first surface 101 of the substrate 100.

Referring to FIG. 6C, the preliminary layer 300P may be patterned to form a preliminary conductive line pattern 310P and a gate pattern 320. The dielectric layer 303 may be patterned to form a second dielectric pattern 313 and a gate dielectric pattern 323. A line spacer 314 and a gate spacer 324 may be respectively formed on a sidewall of the preliminary conductive line pattern 310P and a sidewall of the gate pattern 320. The first surface 101 of the substrate 100 may be implanted with first conductivity type impurities to form a first impurity region 111 and second impurity regions 112. A first dielectric layer 410 may be formed on the first surface 101 of the substrate 100, thereby covering the line spacer 314 and the gate spacer 324.

Referring to FIG. 6D, the preliminary conductive line pattern 310P may be removed by an etching process to form a first opening 319. The first opening 319 may expose inner sidewalls of the line spacer 314 and the second dielectric pattern 313. The gate pattern 320, on the other hand, may not be exposed to the etching process. For example, during the etching process, the gate pattern 320 may be covered with a mask layer (not shown). Therefore, after the formation of the first opening 319 is terminated, the gate pattern 320 may remain without being removed.

Referring sequentially to FIGS. 6D and 5F, a conductive line pattern 310 may be formed in the first opening 319. For example, the formation of the conductive line pattern 310 may include forming a preliminary metal layer that fills the first opening 319, and performing a planarization process on the preliminary metal layer until the first dielectric layer 410 is exposed. After that, the processes discussed with reference to FIGS. 5G and 5H may be performed to form a wiring line layer 400 on the first surface 101 of the substrate 100 and to thin the substrate 100.

Referring to FIG. 2B, a conductive terminal 215, a backside dielectric layer 600, color filters CF, and microlenses 700 may be formed on a second surface 102 of the substrate 100. Therefore, the image sensor 1 may be fabricated. In certain example embodiments, the conductive line pattern 310 may include a different material from that of the gate pattern 320. For example, the conductive line pattern 310 may include metal, and the gate pattern 320 may include polysilicon.

Figure 6E:
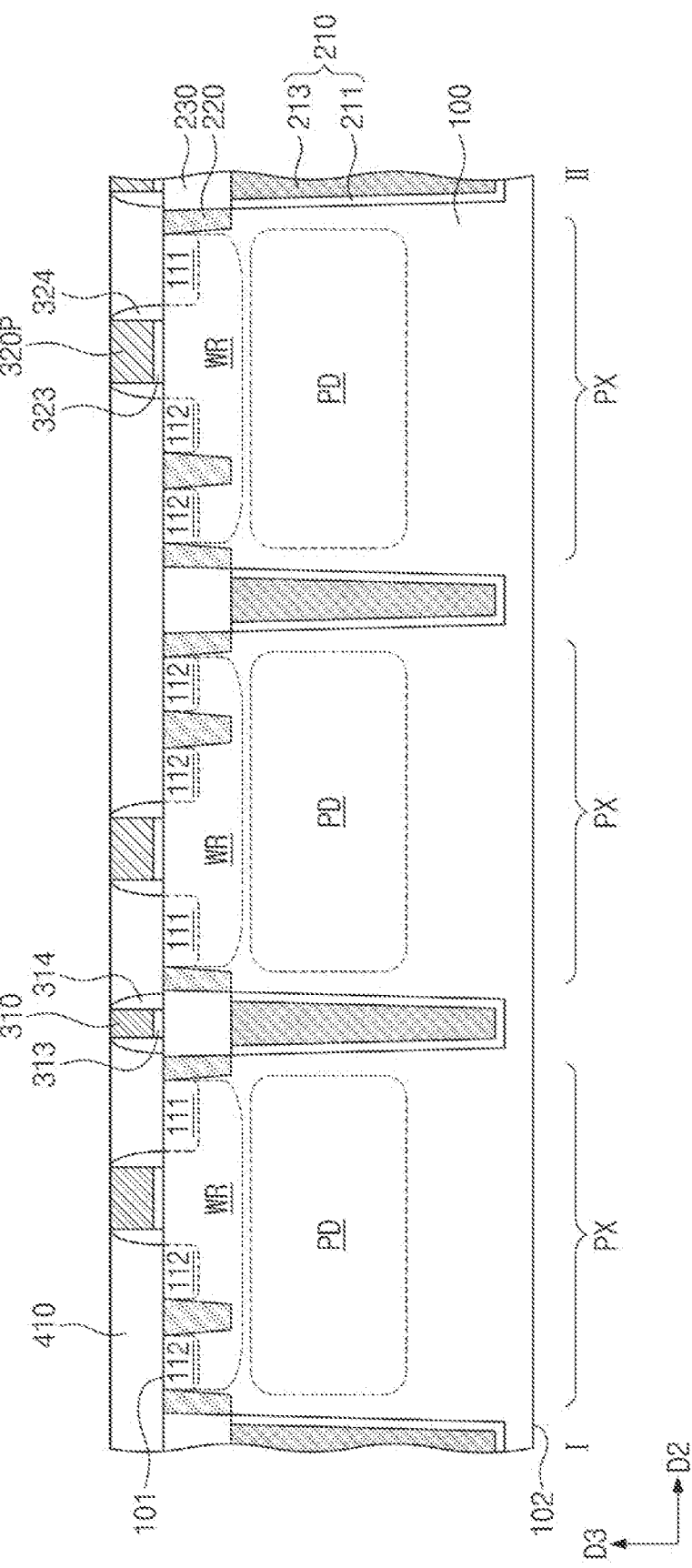
FIGS. 6E and 6F illustrate cross-sectional views showing a method of forming a conductive line pattern and a gate pattern according to some example embodiments
Figure 6F:
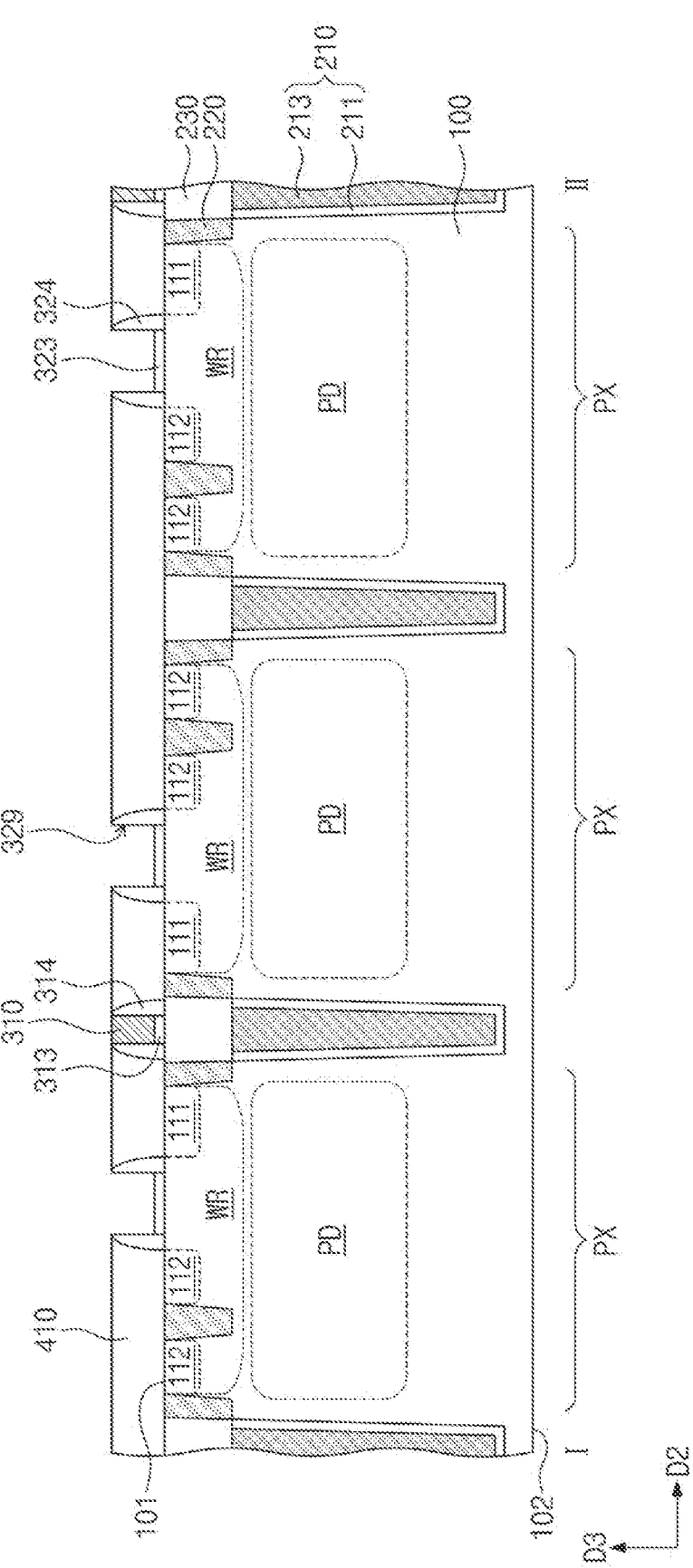

FIGS. 6E and 6F illustrate cross-sectional views taken along line I-II of FIG. 2A, showing a method of forming a conductive line pattern and a gate pattern according to some example embodiments. A duplicate description will be omitted below for conciseness.

Referring sequentially to FIGS. 5A to 5F, a photoelectric conversion region PD, a well impurity region WR, an isolation pattern 210, a device dielectric pattern 220, and a first dielectric pattern 230 may be formed in a substrate 100. A dielectric layer 303 and a preliminary layer 300P may be formed on a first surface 101 of the substrate 100.

Referring to FIG. 6E, the preliminary layer 300P may be patterned to form a conductive line pattern 310 and a preliminary gate pattern 320P. The dielectric layer 303 may be patterned to form a second dielectric pattern 313 and a gate dielectric pattern 323. A line spacer 314 and a gate spacer 324 may be respectively formed on a sidewall of the conductive line pattern 310 and a sidewall of the preliminary gate pattern 320P. A first impurity region 111 and second impurity regions 112 may be formed in the substrate 100. A first dielectric layer 410 may be formed on the first surface 101 of the substrate 100, thereby covering an outer sidewall of the line spacer 314 and an outer sidewall of the gate spacer 324.

Referring to FIG. 6F, the preliminary gate pattern 320P may be removed by an etching process to form a second opening 329. The conductive line pattern 310, on the other hand, may not be exposed to the etching process. For example, during the etching process, the conductive line pattern 310 may be covered with a mask layer (not shown). Therefore, after the formation of the second opening 329 is terminated, the conductive line pattern 310 may remain.

Referring sequentially to FIGS. 6F and 5F, a gate pattern 320 may be formed in the second opening 329. The formation of the gate pattern 320 may include forming a preliminary metal layer that fills the second opening 329, and performing a planarization process on the preliminary metal layer until the first dielectric layer 410 is exposed. After that, the processes discussed with reference to FIGS. 5G and 5H may be performed to form a wiring line layer 400 on the first surface 101 of the substrate 100 and to thin the substrate 100.

Referring to FIG. 2B, a conductive terminal 215, a backside dielectric layer 600, color filters CF, and microlenses 700 may be formed on a second surface 102 of the substrate 100. Therefore, the image sensor 1 may be fabricated. In certain example embodiments, the conductive line pattern 310 may include a different material from that of the gate pattern 320. For example, the conductive line pattern 310 may include polysilicon, and the gate pattern 320 may include metal.

Figure 7A:
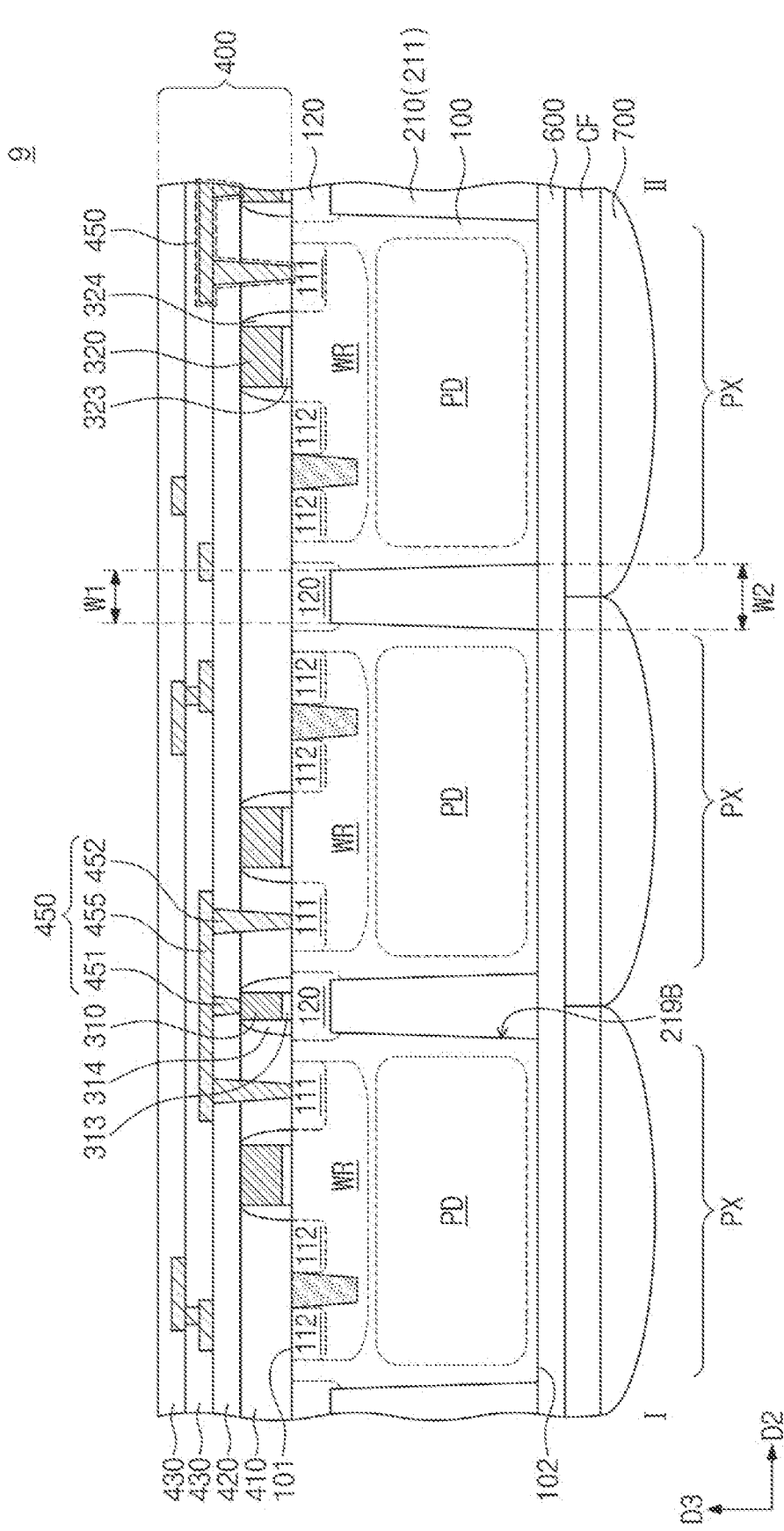
FIG. 7A illustrates a cross-sectional view showing an image sensor according to some examples embodiments.

FIG. 7A illustrates a cross-sectional taken along line I-II of FIG. 2A, showing an image sensor according to some example embodiments. A duplicate description will be omitted below for conciseness.

Referring to FIG. 7A, an image sensor 9 may include the substrate 100, the isolation pattern 210, the device dielectric pattern 220, the conductive line pattern 310, the gate pattern 320, and the wiring line layer 400. The substrate 100, the device dielectric pattern 220, the conductive line pattern 310, the gate pattern 320, and the wiring line layer 400 may be substantially the same as those discussed above.

The isolation pattern 210 may be provided in a second trench 219B, and the second trench 219B may be recessed from the second surface 102 of the substrate 100. A width W2 of the second trench 219B at the bottom surface of the isolation pattern 210 may be greater than a width W1 of the second trench 219B at the top surface of the isolation pattern 210. In some example embodiments, the isolation pattern 210 may penetrate the second surface 102 of the substrate 100. The top surface of the isolation pattern 210 may be disposed in the substrate 100. Therefore, the isolation pattern 210 may be spaced apart from the first surface 101 of the substrate 100. The isolation pattern 210 may be a dielectric isolation pattern 211 that fills the second trench 219B. In some example embodiments, the isolation pattern 210 may omit the conductive isolation pattern 213 shown in FIG. 2B. The isolation pattern 210 may not include a crystalline semiconductor material, such as polysilicon.

A doping region 120 may be interposed between the isolation pattern 210 and the first surface 101 of the substrate 100. The doping region 120 may include the first conductivity type impurities. The doping region 120 may surround a top surface of the isolation pattern 210.

The conductive line pattern 310 may be provided on the first surface 101 of the substrate 100. The conductive line pattern 310 may vertically overlap the isolation pattern 210 and the doping region 120. The second dielectric pattern 313 may be interposed between the conductive line pattern 310 and the first surface 101 of the substrate 100. For example, the second dielectric pattern 313 may be interposed between the conductive line pattern 310 and the doping region 120 of the substrate 100. Differently from that shown, the doping region 120 may not be formed.

The image sensor 9 may be fabricated by substantially the same method discussed above. For example, the image sensor 9 may be formed by substantially the same method as that discussed in FIG. 5A to 5H. In contrast, the first surface 101 of the substrate 100 may further be implanted with the first conductivity type impurities to form the doping region 120. The formation of the isolation pattern 210 may be performed after the thinning process discussed in FIG. 5H. The formation of the isolation pattern 210 may include forming the second trench 219B on the second surface 102 of the substrate 100, and filling the second trench 219B with a dielectric material.

Figure 7B:
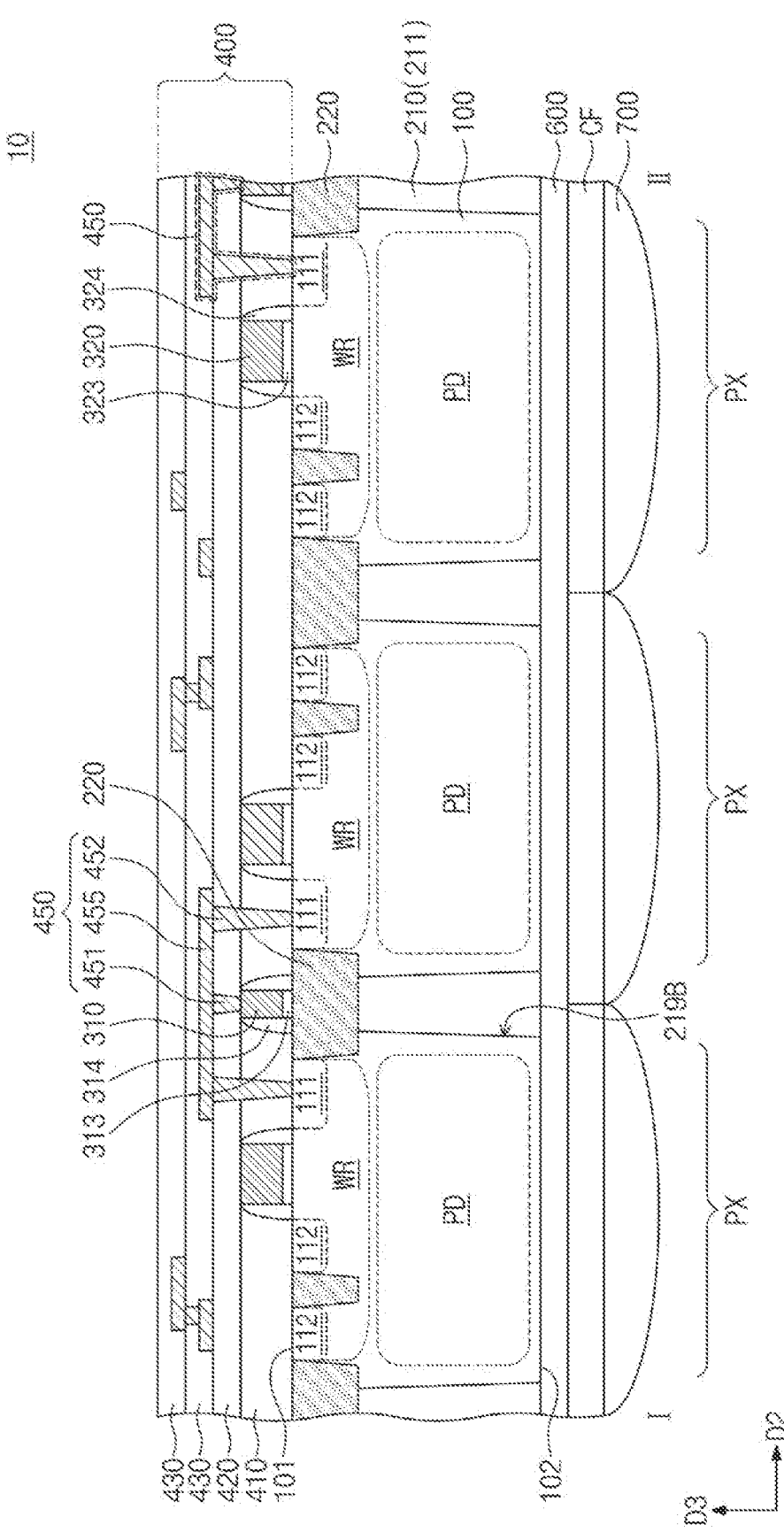
FIG. 7B illustrates a cross-sectional view showing an image sensor according to some examples embodiments.
Figure 7C:
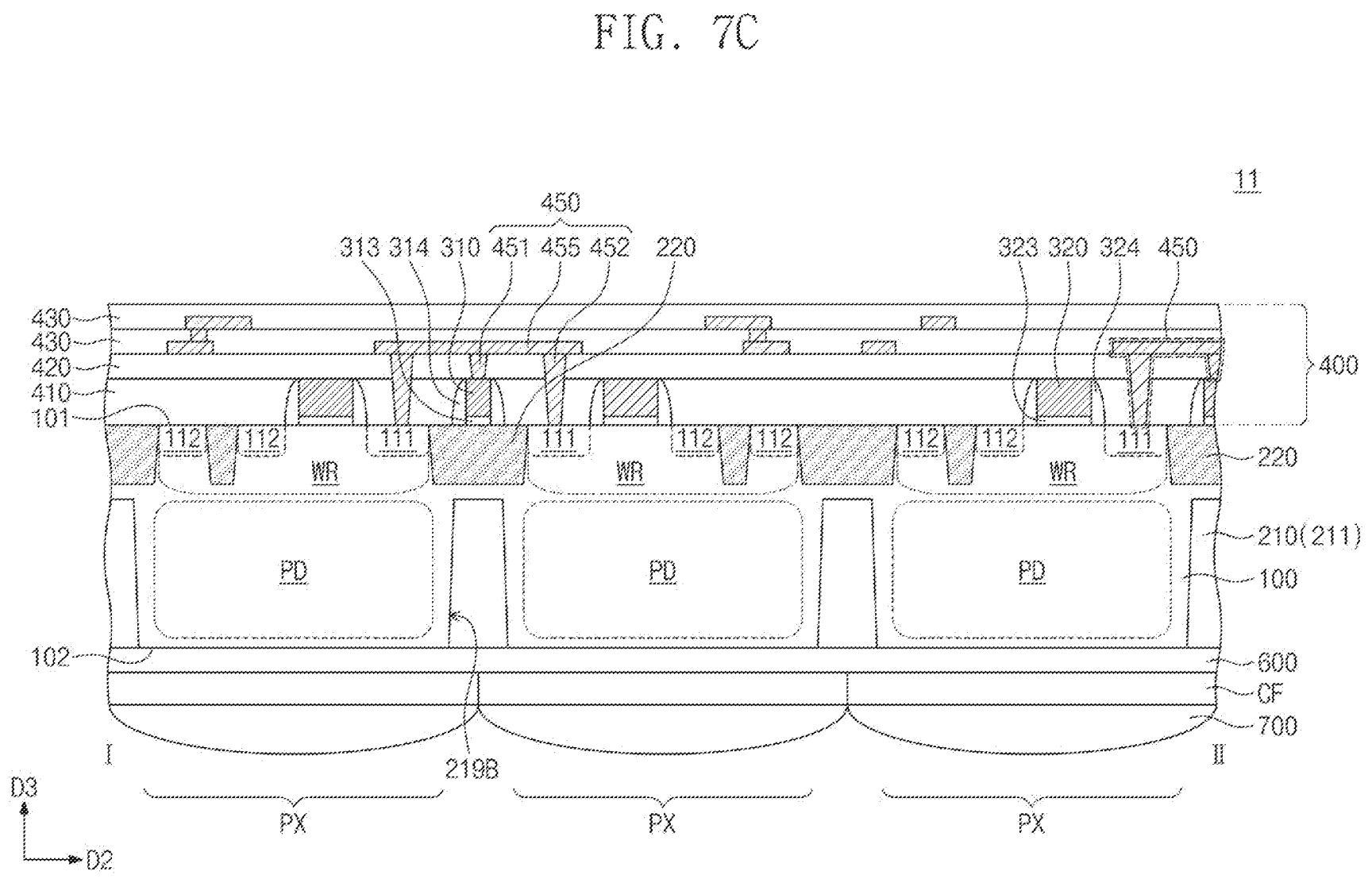

FIG. 7B illustrates a cross-sectional taken along line I-II of FIG. 2A, showing an image sensor according to some example embodiments. FIG. 7C illustrates a cross-sectional view taken along line I-II of FIG. 2A, showing an image sensor according to some example embodiments. A duplicate description will be omitted below for conciseness.

Referring to FIGS. 7B and 7C, image sensors 10 and 11 may include the substrate 100, the isolation pattern 210, the conductive line pattern 310, and the wiring line layer 400. The isolation pattern 210 may be substantially the same as that discussed with reference to FIG. 7A. For example, the isolation pattern 210 may be provided in a second trench 219B, and the second trench 219B may be recessed from the second surface 102 of the substrate 100. The device dielectric pattern 220 may be interposed between the isolation pattern 210 and the conductive line pattern 310.

Referring to FIG. 7B, the device dielectric pattern 220 of the image sensor 10 may be connected to the isolation pattern 210.

Referring to FIG. 7C, the device dielectric pattern 220 of the image sensor 11 may be spaced apart from the isolation pattern 210. For example, the substrate 100 may extend between the device dielectric pattern 220 and the isolation pattern 210.

Figure 8A:
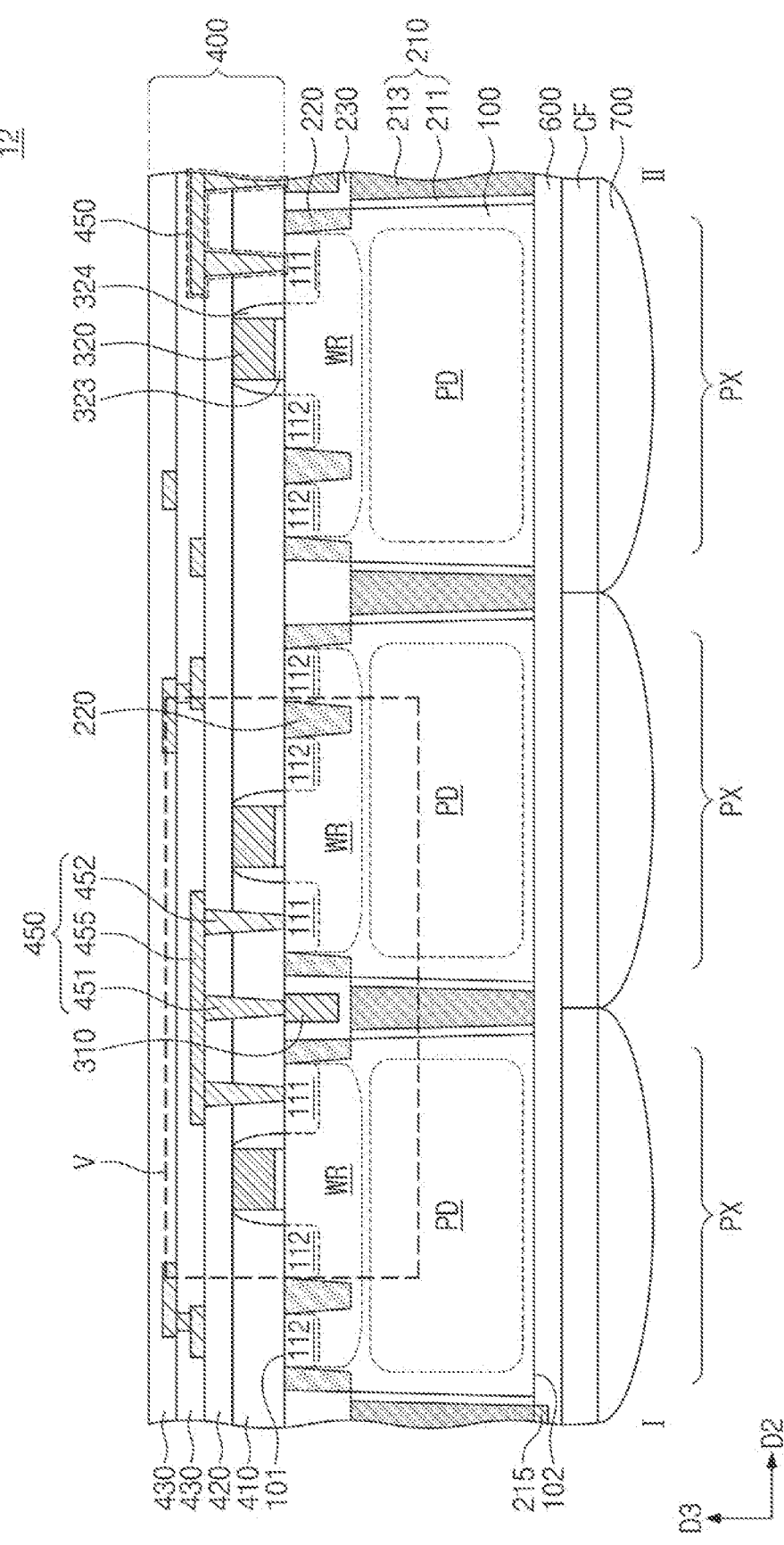
Figure 8B:
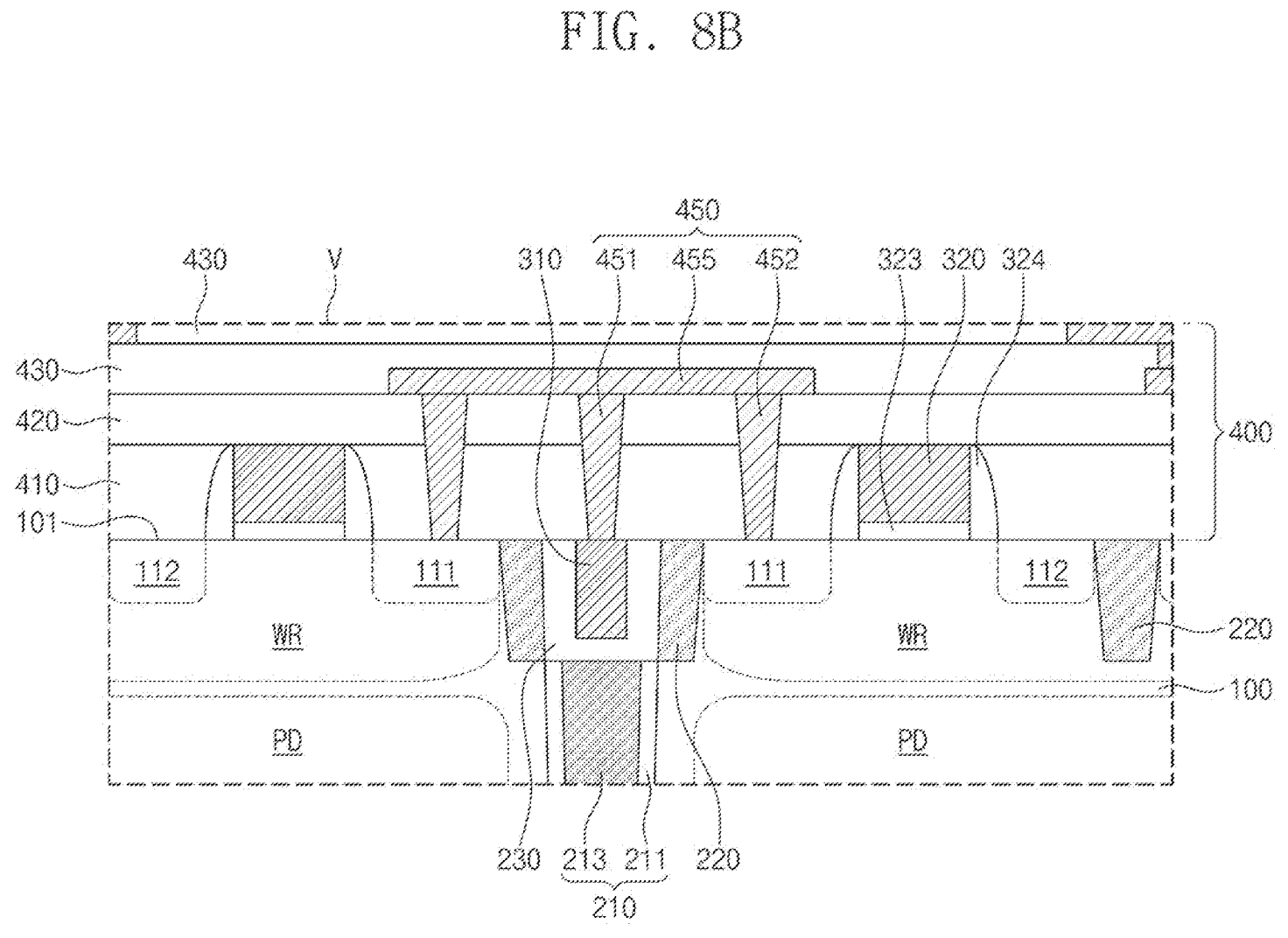
Figure 8C:
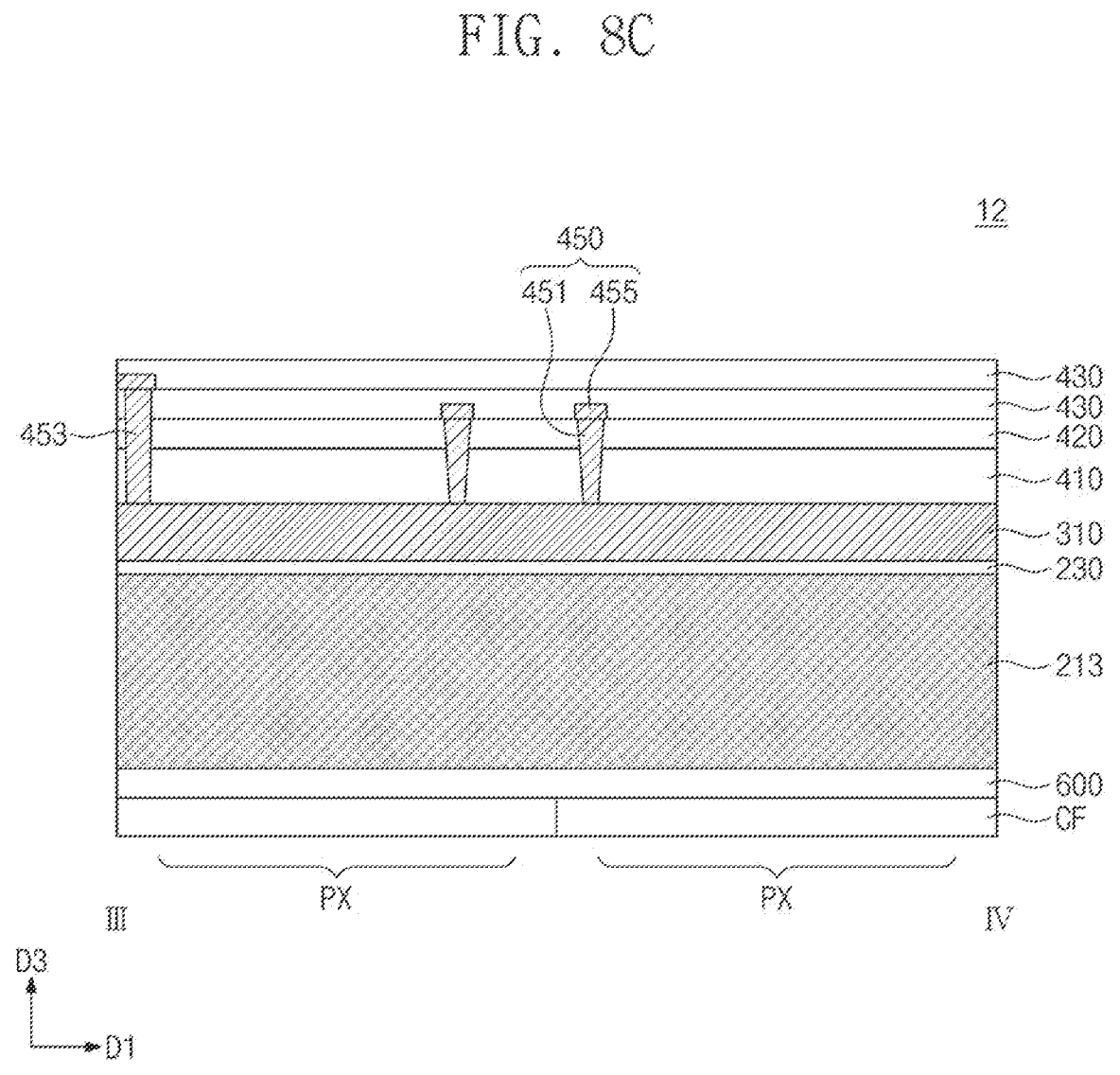

FIGS. 8A to 8C illustrate cross-sectional views showing an image sensor according to some example embodiments. FIG. 8A illustrates a cross-sectional view taken along line I-II of FIG. 2A. FIG. 8B illustrates an enlarged view showing section V of FIG. 8A. FIG. 8C illustrates a cross-sectional view taken along line III-IV of FIG. 2A. A duplicate description will be omitted below for conciseness.

Referring to FIGS. 2A, 8A, 8B, and 8C, an image sensor 12 may include the substrate 100, the isolation pattern 210, the device dielectric pattern 220, the conductive line pattern 310, the gate pattern 320, and the wiring line layer 400. The substrate 100, the isolation pattern 210, the device dielectric pattern 220, the gate pattern 320, and the wiring line layer 400 may be substantially the same as those discussed above.

The conductive line pattern 310 may vertically overlap the isolation pattern 210. For example, the conductive line pattern 310 may overlap the conductive isolation pattern 213. In contrast to the above example embodiments, the conductive line pattern 310 in the example embodiment of FIG. 8A may be disposed in the substrate 100 and adjacent to the first surface 101 of the substrate 100. For example, the conductive line pattern 310 may have a bottom surface at a level lower than the first surface 101 of the substrate 100. The conductive line pattern 310 may have a top surface at substantially the same level as that of the first surface 101 of the substrate 100. In other words, the top surface of the conductive line pattern 310 may be coplanar with the first surface 101 of the substrate, but the example embodiments are not limited thereto.

The conductive line pattern 310 may be buried in the first dielectric pattern 230. The first dielectric pattern 230 may be interposed between the conductive line pattern 310 and the isolation pattern 210. For example, the first dielectric pattern 230 may be interposed between the conductive line pattern 310 and the conductive isolation pattern 213. Therefore, the conductive line pattern 310 may be spaced apart and electrically insulated from the conductive isolation pattern 213. The first dielectric pattern 230 may be interposed between the conductive line pattern 310 and the substrate 100. Therefore, the conductive line pattern 310 may not be in direct contact with the substrate 100. The first dielectric pattern 230 may extend between the conductive line pattern 310 and the device dielectric pattern 220.

The wiring line layer 400 may be disposed on the first surface 101 of the substrate 100. The wiring line layer 400 may include the first dielectric layer 410, the second dielectric layer 420, the third dielectric layer 430, and the conductive structure 450. The conductive structure 450 may include, for example, the first contact plug 451, the second contact plug 452, and the conductive pattern 455. The first contact plug 451, the second contact plug 452, and the conductive pattern 455 may be substantially the same as those discussed with reference to FIGS. 2A to 2D, except that the first contact plug 451 may penetrate the first and second dielectric layers 410 and 420 and may be coupled to the conductive line pattern 310 and, as shown in FIG. 8C, the third contact plug 453 may penetrate the first and second dielectric layers 410 and 420. The third contact plug 453 may further penetrate at least one of the third dielectric layers 430.

In other example embodiments, the first impurity region 111 may include the ground region GND. As discussed in the example embodiment of FIG. 2E, the ground region GND may be connected to the photoelectric conversion region PD. In this case, the conductive line pattern 310 may serve as a ground line.

Figure 8D:
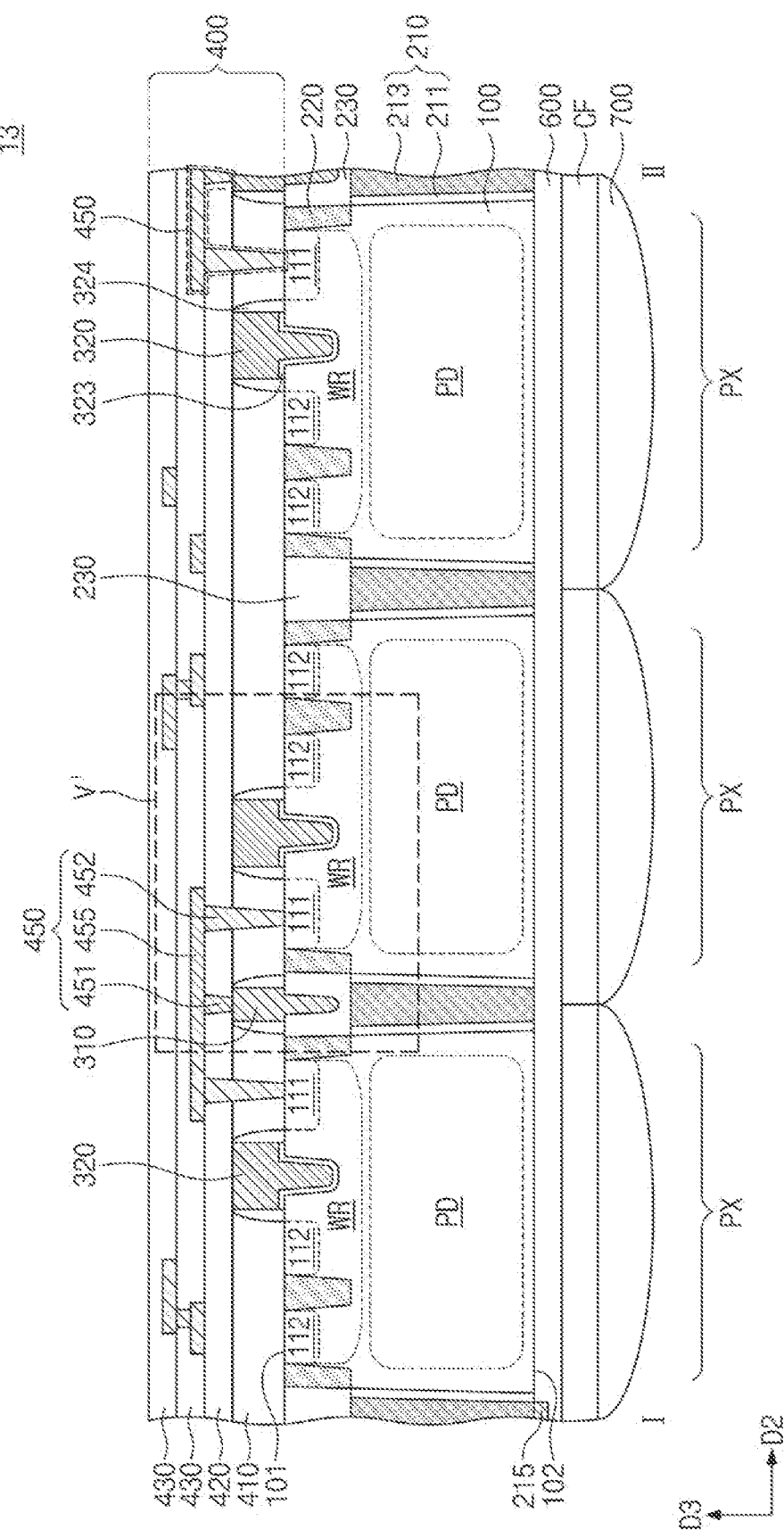
FIG. 8D illustrates a cross-sectional view showing an image sensor according to some examples embodiments.
Figure 8E:
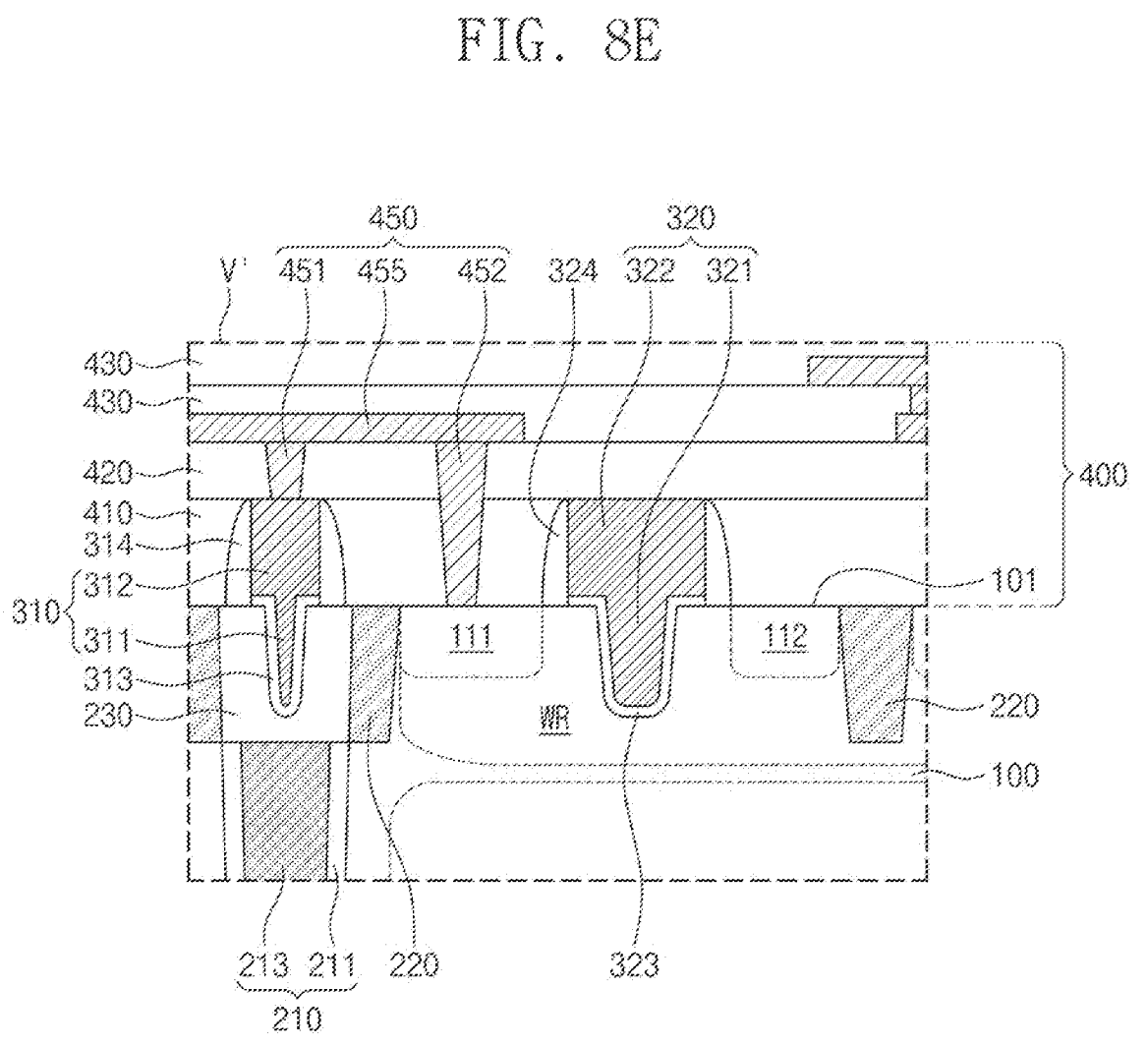

FIG. 8D illustrates a cross-sectional view taken along line I-II of FIG. 2A, showing an image sensor according to some example embodiments. FIG. 8E illustrates an enlarged view showing section V' of FIG. 8D. The discussion of FIGS. 8D and 8E also refers to FIG. 2A.

Referring to FIGS. 8D and 8E, an image sensor 13 may include the substrate 100, the isolation pattern 210, the device dielectric pattern 220, the conductive line pattern 310, the gate pattern 320, and the conductive structure 450.

The gate pattern 320 may be disposed on the first surface 101 of the substrate 100. The gate pattern 320 may be disposed laterally spaced apart from the isolation pattern 210. The gate pattern 320 may have a buried gate structure.

For example, as shown in FIG. 8E, the gate pattern 320 may include a first portion 321 and a second portion 322. The second portion 322 of the gate pattern 320 may be disposed on the first surface 101 of the substrate 100. The second portion 322 of the gate pattern 320 may extend in a direction parallel to the first surface 101 of the substrate 100. The first portion 321 of the gate pattern 320 may protrude into the substrate 100. The first portion 321 of the gate pattern 320 may be connected to the second portion 322 of the gate pattern 320. The gate dielectric pattern 323 may be interposed between the gate pattern 320 and the substrate 100. On the first surface 101 of the substrate 100, the gate spacer 324 may cover a sidewall of the first portion 321 of the gate pattern 320.

The conductive line pattern 310 may vertically overlap the isolation pattern 210. As shown in FIG. 8E, the conductive line pattern 310 may include a first portion 311 and a second portion 312. The second portion 312 of the conductive line pattern 310 may be disposed on the first surface 101 of the substrate 100. An arrangement of the second portion 312 of the conductive line pattern 310 may be similar to an arrangement of the conductive line pattern 310 discussed above in FIGS. 2A to 2D. The first portion 311 of the conductive line pattern 310 may be provided in the substrate 100. For example, the first portion 311 of the conductive line pattern 310 may protrude from the second portion 312 into the substrate 100. The first portion 311 of the conductive line pattern 310 may be connected to the second portion 312 of the conductive line pattern 310. The first portion 311 of the conductive line pattern 310 may be substantially the same as the conductive line pattern 310 discussed in the example of FIGS. 8A to 8C. On the first surface 101 of the substrate 100, the line spacer 314 may cover a sidewall of the second portion 312 of the conductive line pattern 310. The second dielectric pattern 313 may be interposed between the conductive line pattern 310 and the first dielectric pattern 230. The second dielectric pattern 313 may include the same material as that of the gate dielectric pattern 323.

Figure 8F:
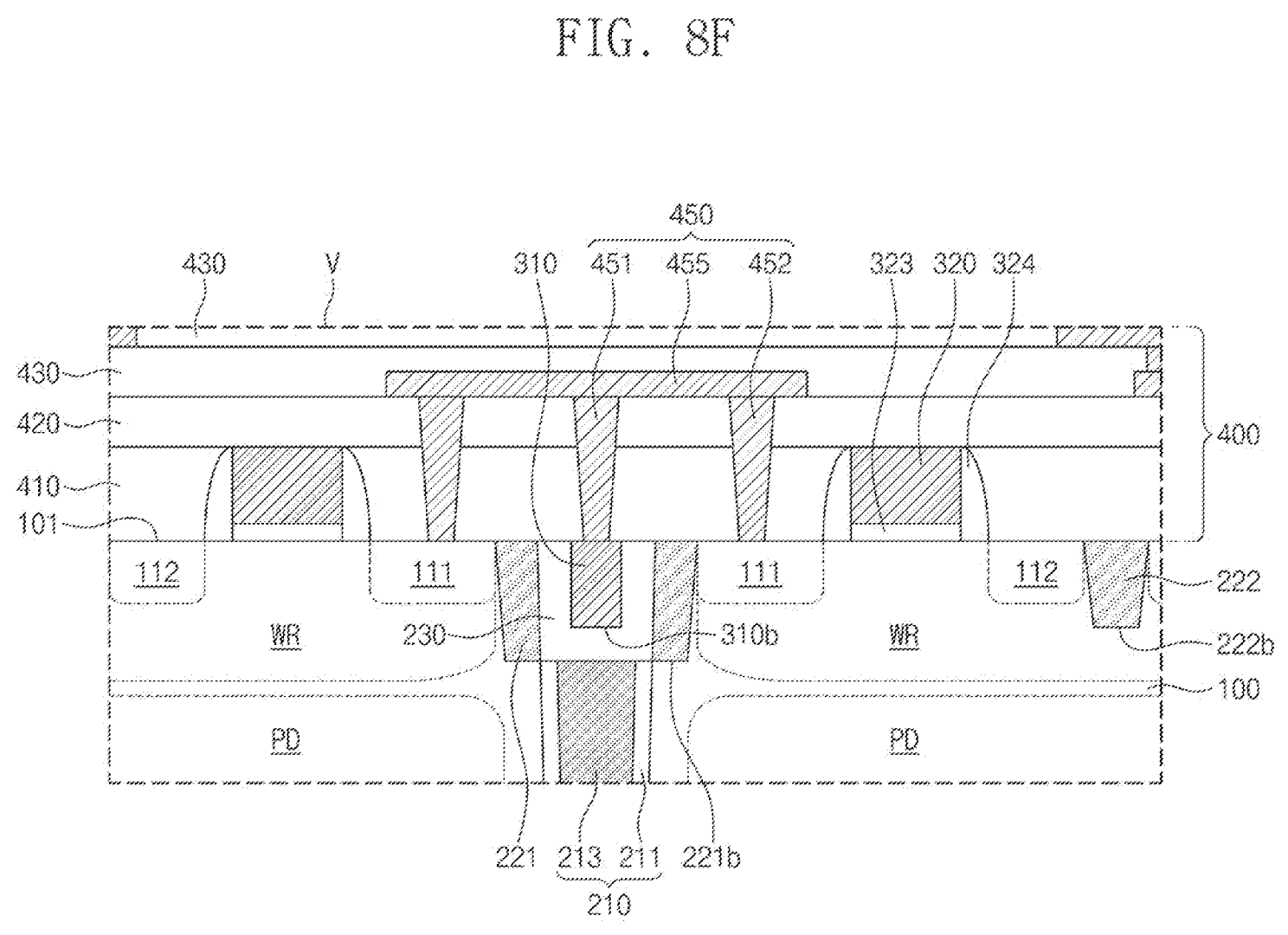

FIG. 8F illustrates an enlarged view of section V depicted in FIG. 8A, showing a device dielectric pattern and a conductive line pattern according to some example embodiments. A duplicate description will be omitted below for conciseness.

Referring to FIG. 8F, the substrate 100 may be provided therein with a first device dielectric pattern 221 and a second device dielectric pattern 222 that are adjacent to the first surface 101 of the substrate 100. The first device dielectric pattern 221 may be provided on a sidewall of the first dielectric pattern 230. The first device dielectric pattern 221 may be interposed, for example, between the first dielectric pattern 230 and the substrate 100. The first device dielectric pattern 221 may have a bottom surface 221b at a lower level than that of a bottom surface 310b of the conductive line pattern 310.

The second device dielectric pattern 222 may define active regions. For example, the second impurity region 112 may be disposed on one side of the second device dielectric pattern 222. The second device dielectric pattern 222 may have a bottom surface 222b at a different level from that of the bottom surface 221b of the first device dielectric pattern 221. For example, the bottom surface 222b of the second device dielectric pattern 222 may be located at a higher level than that of the bottom surface 221b of the first device dielectric pattern 221. The bottom surface 222b of the second device dielectric pattern 222 may be located at substantially the same level as that of the bottom surface 310b of the conductive line pattern 310.

Differently from that shown in FIG. 8F, in some example embodiments, the bottom surface 310b of the conductive line pattern 310 may be located at a lower level than that of the bottom surface 222b of the second device dielectric pattern 222, and the bottom surface 310b of the conductive line pattern 310 may be located at a higher level than that of the bottom surface 221b of the first device dielectric pattern 221.

The first and second device dielectric patterns 221 and 222 may include the same material as that of the device dielectric pattern 220 discussed in FIGS. 2B and 2D. The function and arrangement of the first and second device dielectric patterns 221 and 222 may be similar to those of the device dielectric pattern 220 discussed in FIGS. 2B and 2D.

Figure 8G:
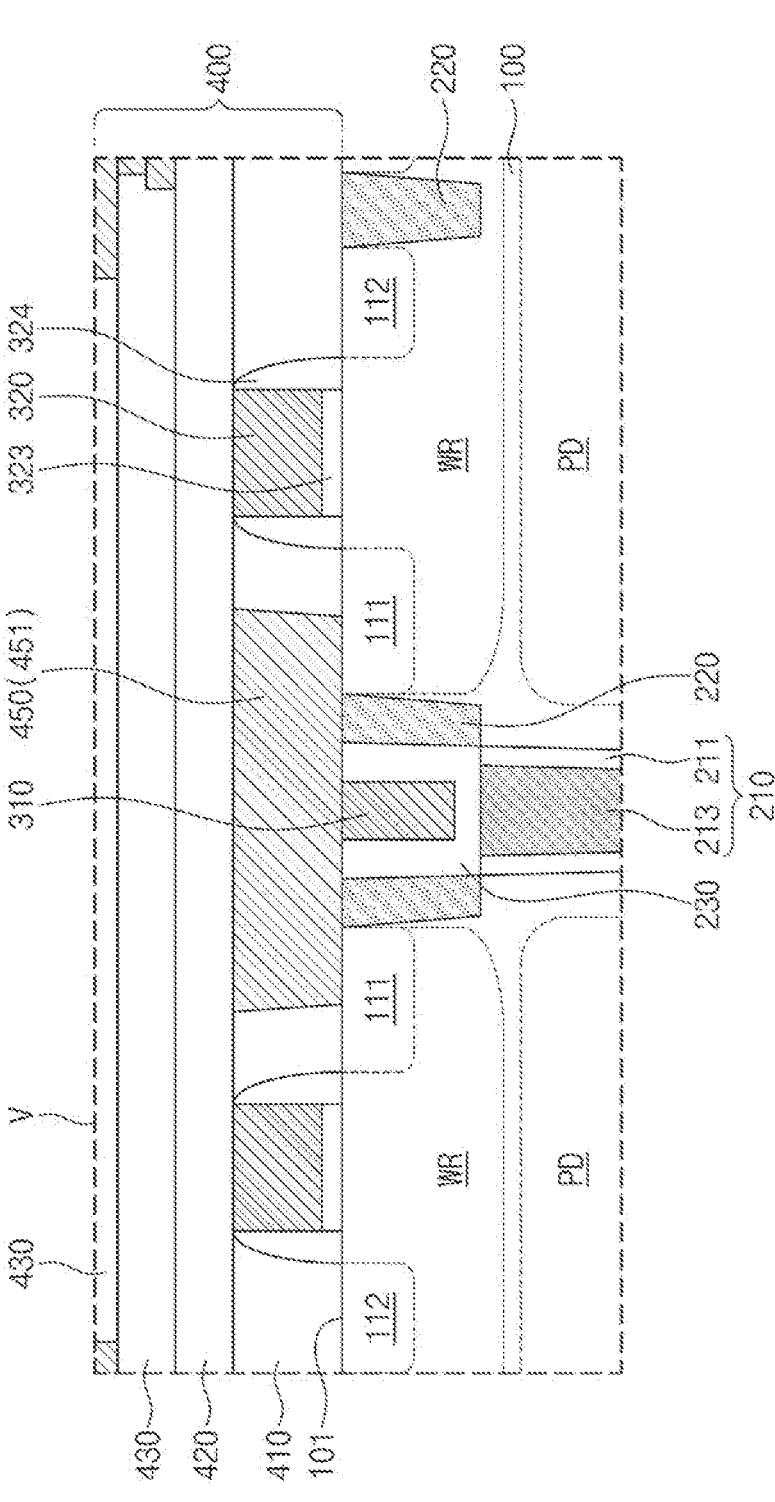
FIG. 8G illustrates a cross-sectional view showing a conductive line pattern and a conductive structure according to some examples embodiments.

FIG. 8G illustrates an enlarged view of section V depicted in FIG. 8A, showing a conductive line pattern and a conductive structure according to some example embodiments. A duplicate description will be omitted below for conciseness.

Referring to FIG. 8G, the conductive structure 450 may include the first contact plug 451, but may omit the second contact plug (see 452 of FIG. 2B) and the conductive pattern (see 455 of FIG. 2B). The first contact plug 451 may be in direct contact with the conductive line pattern 310 and the first impurity region 111. The first contact plug 451 may be provided in the first dielectric layer 410, and may cover the top surface of the conductive line pattern 310, the top surface of the first dielectric pattern 230, the top surface of the isolation pattern 210, and the top surface of the first impurity region 111.

Figure 8H:
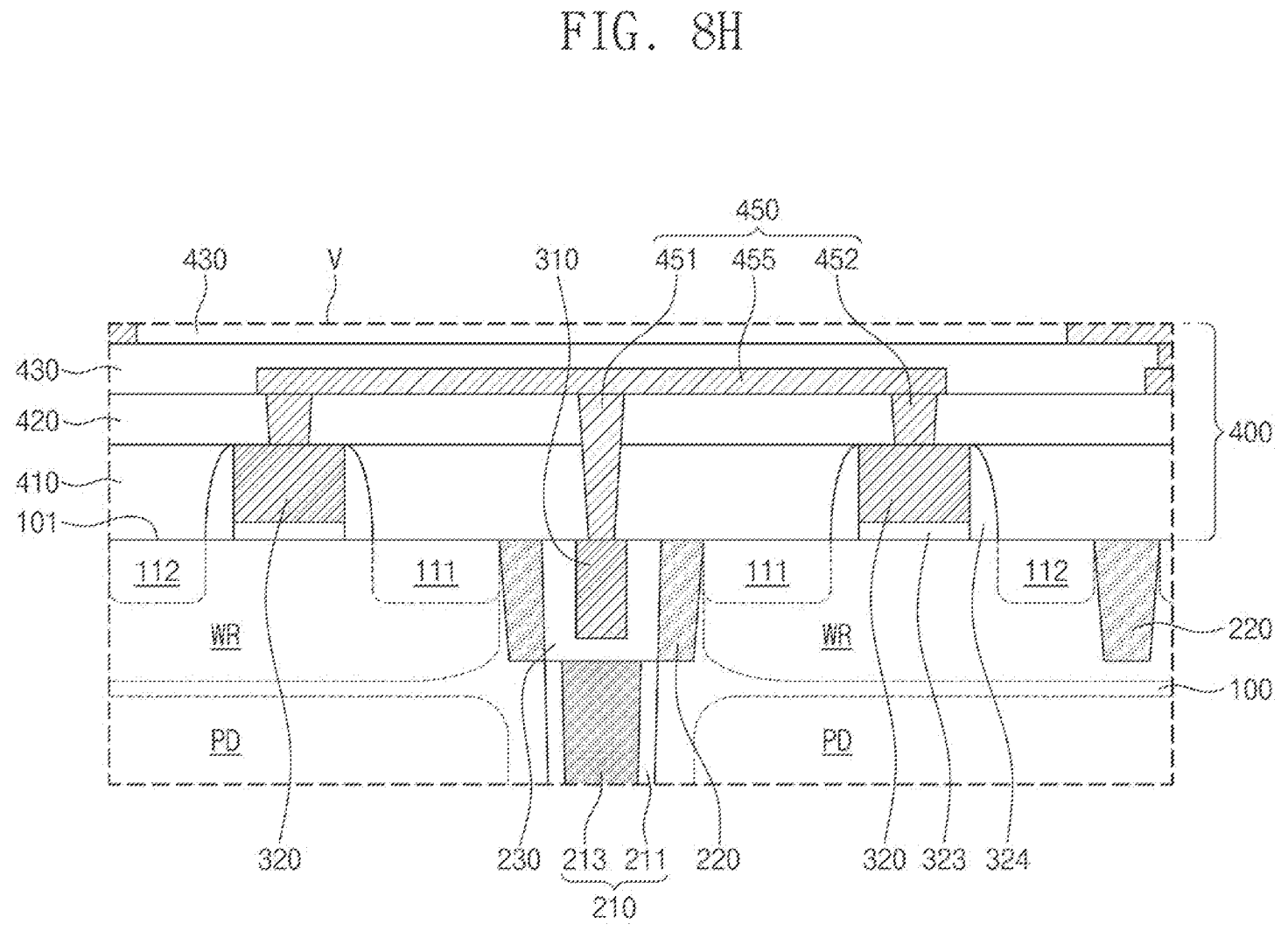

FIG. 8H illustrates an enlarged view of section V depicted in FIG. 8A, showing a conductive line pattern and a conductive structure according to some example embodiments.

Referring to FIG. 8H, the conductive structure 450 may include the first contact plug 451, the second contact plug 452, and the conductive pattern 455. The first contact plug 451 and the conductive pattern 455 may be substantially the same as those discussed in FIGS. 8A to 8C. In contrast to the example embodiments in FIGS. 8A to 8C, on the top surface of the gate pattern 320, the second contact plug 452 may be coupled to the gate pattern 320. Therefore, the conductive line pattern 310 may be electrically connected through the conductive structure 450 to the gate pattern 320. The electrical connection of the conductive structure 450 may be substantially the same as that discussed in FIG. 4B.

FIG. 8I illustrates an enlarged view of section V depicted in FIG. 8A, showing a conductive line pattern and a conductive structure according to some example embodiments.

Referring to FIG. 8I, the conductive structure 450 may include the first contact plug 451 and the conductive pattern 455, but may omit the second contact plug (see 452 of FIG. 2B). The first contact plug 451 may penetrate the first dielectric layer 410 and may be coupled to the conductive line pattern 310. The conductive pattern 455 may be disposed in the second dielectric layer 420, and may be in direct contact with top surfaces of the first dielectric layer 410 and the gate pattern 320. The conductive pattern 455 may be coupled to the gate pattern 320 and the first contact plug 451. The conductive pattern 455 and the first contact plug 451 may be integrally formed into a single body. For example, the conductive pattern 455 and the first contact plug 451 may include the same material and may be connected without a boundary surface therebetween. The conductive pattern 455 and the first contact plug 451 may constitute a contact structure. Alternatively, in some example embodiments, the conductive pattern 455 may be formed separately from the first contact plug 451.

Figure 9A:
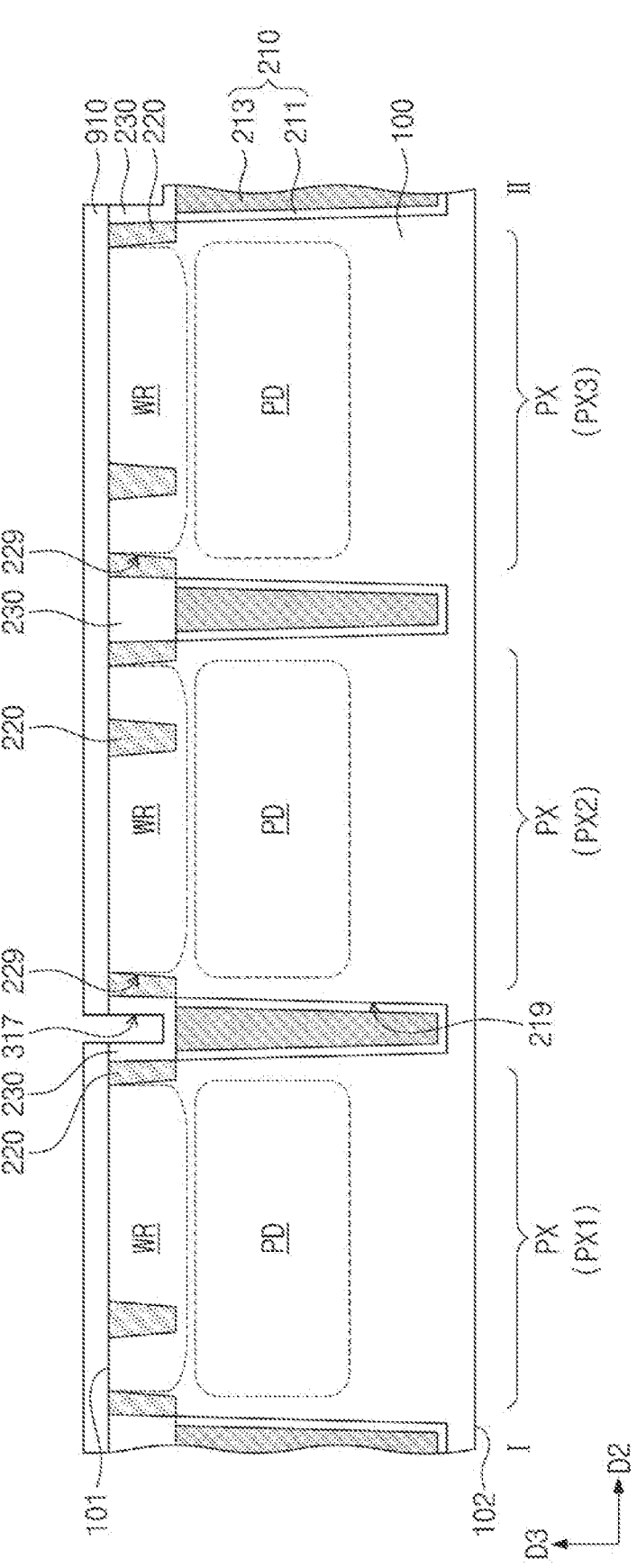
FIGS. 9A to 9C illustrate cross-sectional views showing a method of fabricating an image sensor according to some examples embodiments.
Figure 9B:
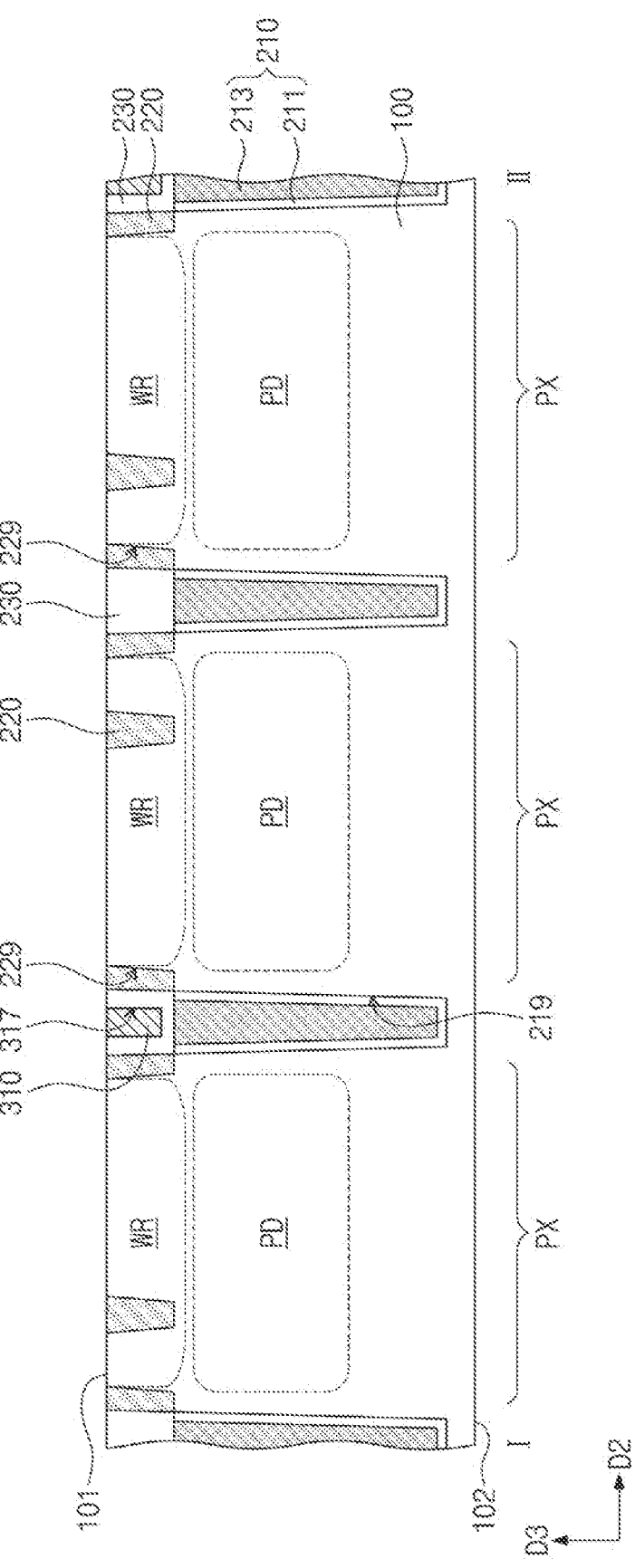
Figure 9C:
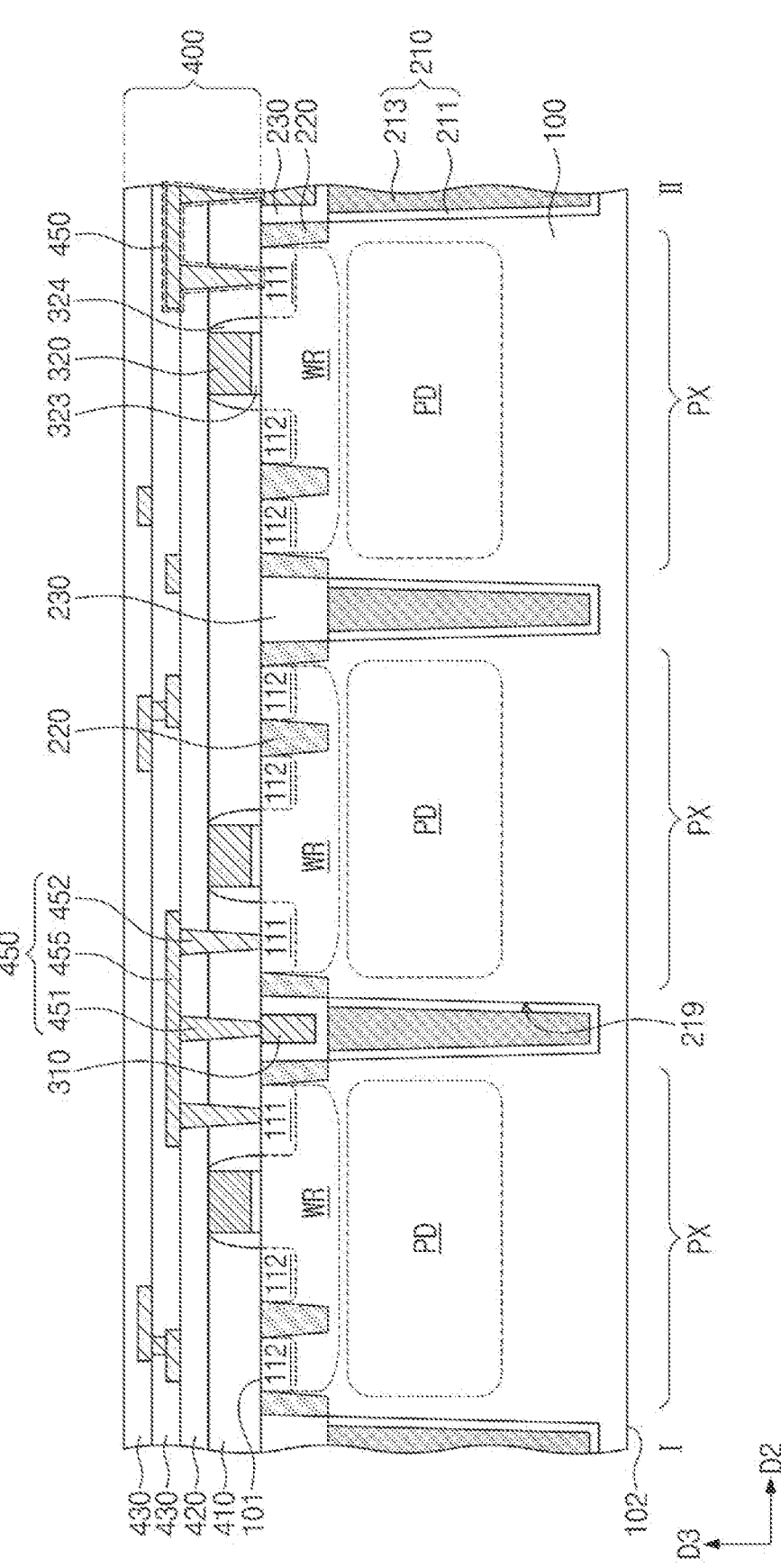

FIGS. 9A to 9C illustrate cross-sectional views taken along line I-II of FIG. 2A, showing a method of fabricating an image sensor according to some example embodiments. A duplicate description will be omitted below for conciseness.

Referring to FIG. 9A, the processes discussed with reference to FIGS. 5A to 5D may be performed to form, in a substrate 100, a photoelectric conversion region PD, a well impurity region WR, an isolation pattern 210, a device dielectric pattern 220, and a first dielectric pattern 230. For example, the device dielectric pattern 220 may be formed in the first trench 229. The isolation pattern 210 may fill a portion of the first trench 229, and the first dielectric pattern 230 may fill the remaining portion of the first trench 229.

A third trench 317 may be formed in the first dielectric pattern 230. The formation of the third trench 317 may include forming a first mask pattern 910 on a first surface 101 of the substrate 100, and performing an etching process in which the first mask pattern 910 is used as an etching mask. For example, the third trench 317 may be formed between a first pixel region PX1 and a second pixel region PX2, but may not be formed between the second pixel region PX2 and a third pixel region PX3. The arrangement of the third trench 317, however, is not be limited thereto, but may be variously changed. A bottom surface of the third trench 317 may be provided in the first dielectric pattern 230. Differently from that shown in FIG. 9A, in some example embodiments, the third trench 317 may further extend horizontally along the first surface 101 of the substrate 100 to expose an inner sidewall of the device dielectric pattern 220.

Referring to FIG. 9B, a conductive line pattern 310 may be formed to fill the third trench 317. The formation of the conductive line pattern 310 may include forming a preliminary line pattern in the third trench 317 and on the first surface 101 of the substrate 100, and performing a planarization process on the preliminary line pattern. The planarization process may cause that the conductive line pattern 310 is locally formed in the third trench 317. The preliminary line pattern may include metal, metal silicide, polysilicon, or a combination thereof. The first mask pattern 910 may be removed after or during the formation of the conductive line pattern 310.

Referring to FIG. 9C, a gate dielectric pattern 323, a gate spacer 324, a gate pattern 320, and a first dielectric layer 410 may be formed on the first surface 101 of the substrate 100. The formation of the gate dielectric pattern 323, the gate spacer 324, the gate pattern 320, and the first dielectric layer 410 may be the same as or similar to that discussed in FIGS. 5E and 5F. A second dielectric layer 420, a conductive structure 450, and third dielectric layers 430 may be formed on the first surface 101 of the substrate 100.

Referring back to FIG. 8A, a thinning process may be performed on a second surface 102 of the substrate 100, and thus the conductive isolation pattern 213 may be exposed on the second surface 102 of the substrate 100. A conductive terminal 215, a backside dielectric layer 600, color filters CF, and micro-lenses 700 may be formed on the second surface 102 of the substrate 100. Therefore, the image sensor 12 discussed in FIGS. 8A to 8C may be eventually fabricated.

FIGS. 10A to 10D illustrate cross-sectional views taken along line I-II of FIG. 2A, showing a method of fabricating an image sensor according to some example embodiments.

Referring to FIGS. 5A to 5D, a photoelectric conversion region PD, a well impurity region WR, an isolation pattern 210, a device dielectric pattern 220, and a first dielectric pattern 230 may be formed in a substrate 100.

Figure 10A:
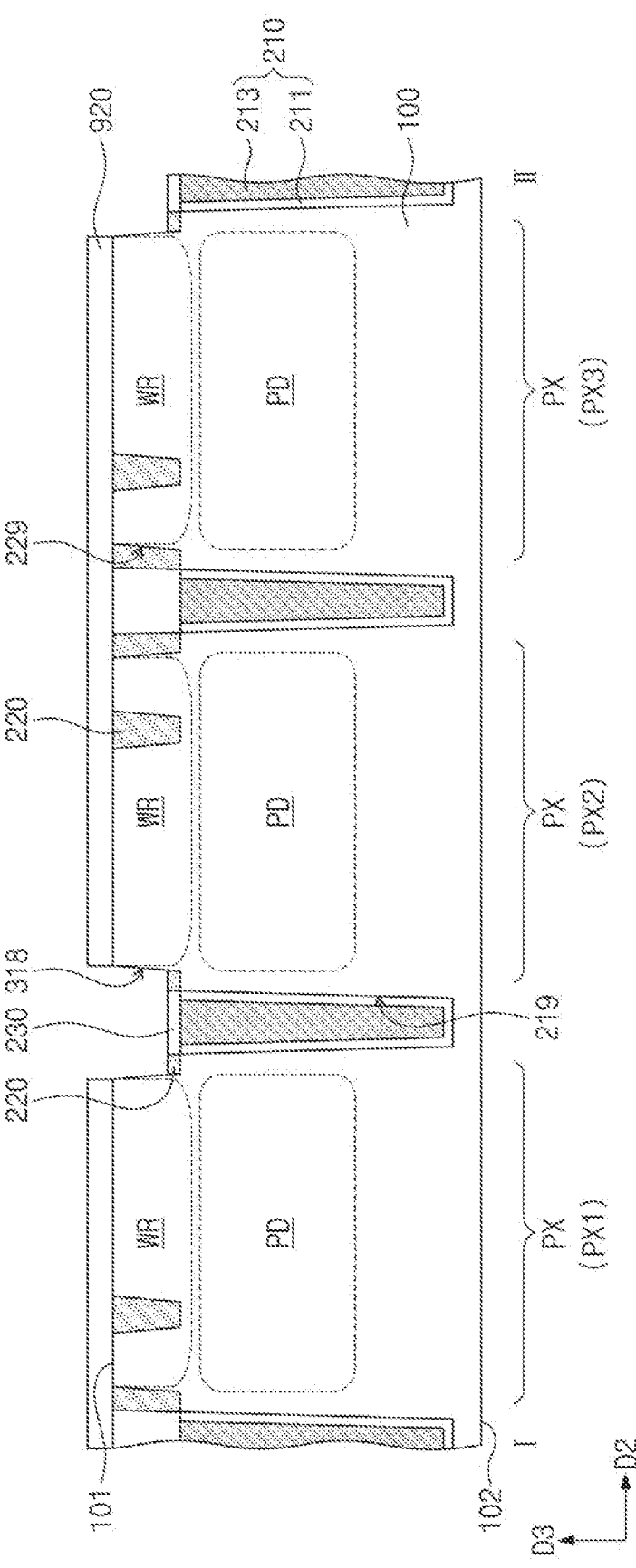
FIGS. 10A to 10D illustrate cross-sectional views showing a method of fabricating an image sensor according to some examples embodiments.

Referring sequentially to FIGS. 5D and 10A, a fourth trench 318 may be formed between pixel regions PX, thereby exposing the first dielectric pattern 230 and the device dielectric pattern 220. The formation of the fourth trench 318 may include forming a second mask pattern 920 on a first surface 101 of the substrate 100, and performing an etching process in which the second mask pattern 920 is used as an etching mask. The second mask pattern 920 may be formed on the first surface 101 of the substrate 100, thereby exposing the device dielectric pattern 220 and the first dielectric pattern 230. For example, the second mask pattern 920 may expose the device dielectric pattern 220 and the first dielectric pattern 230 that are disposed between first and second pixel regions PX1 and PX2. The second mask pattern 920 may cover the device dielectric pattern 220 and the first dielectric pattern 230 that are disposed between second and third pixel regions PX2 and PX3. The etching process may recess a top surface of the device dielectric pattern 220 and a top surface of the first dielectric pattern 230. Therefore, the fourth trench 318 may be formed to expose the first dielectric pattern 230 and the device dielectric pattern 220. During the etching process, the substrate 100 may have an etch selectivity.

Figure 10B:
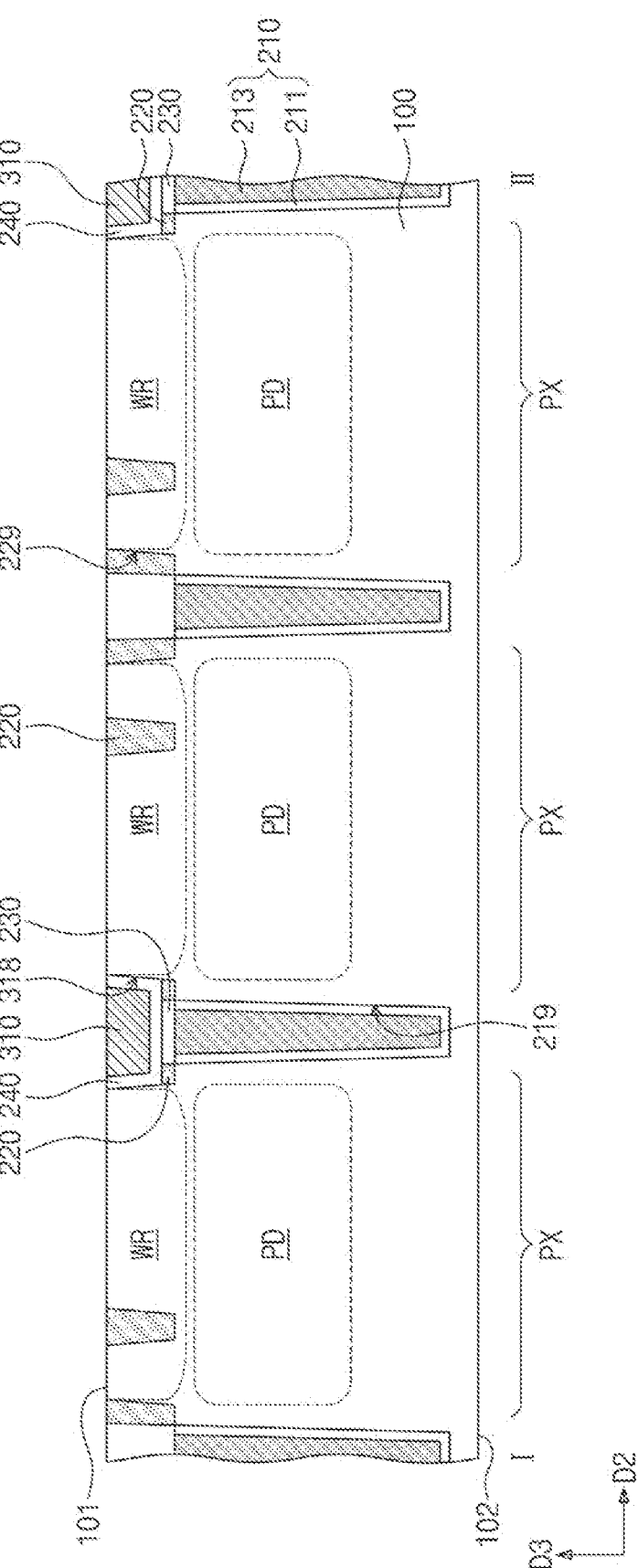

Referring to FIG. 10B, a third dielectric pattern 240 and a conductive line pattern 310 may be formed in the fourth trench 318. The formation of the third dielectric pattern 240 and the conductive line pattern 310 may include forming a preliminary dielectric layer to conformally cover a bottom surface and sidewalls of the fourth trench 318 and the first surface 101 of the substrate 100, forming on the preliminary dielectric layer a conductive layer to fill the fourth trench 318, and performing a planarization process on the conductive layer and the preliminary dielectric layer. The planarization process may cause the conductive layer and the preliminary dielectric layer to be removed from the first surface 101 of the substrate 100, and the conductive line pattern 310 and the third dielectric pattern 240 to be locally formed in the fourth trench 318. The third dielectric pattern 240 may be interposed between the conductive line pattern 310 and the substrate 100, between the conductive line pattern 310 and the device dielectric pattern 220, and between the conductive line pattern 310 and the first dielectric pattern 230. The conductive line pattern 310 may have a top surface at substantially the same level as that of a top surface of the third dielectric pattern 240 and that of the first surface 101 of the substrate 100. The third dielectric pattern 240 may include one or more of a silicon-based dielectric material (e.g., silicon nitride, silicon oxide, and/or silicon oxynitride) and a high-k dielectric material (e.g., hafnium oxide and/or aluminum oxide).

Figure 10C:
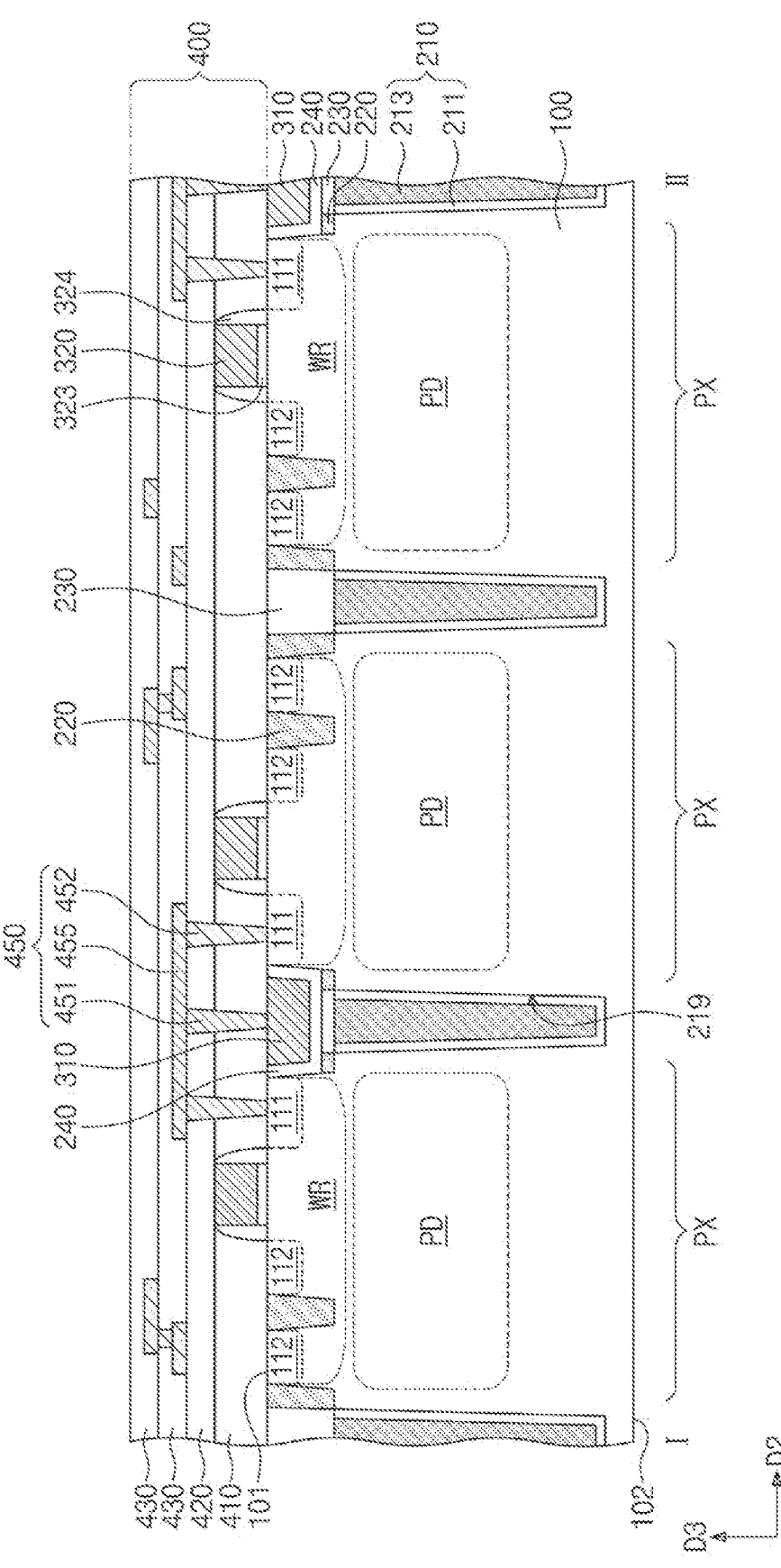

Referring to FIG. 10C, a gate pattern 320 and a gate dielectric pattern 323 may be formed on the first surface 101 of the substrate 100. A gate spacer 324 may be formed on the first surface 101 of the substrate 100. The formation of the gate spacer 324 may be substantially the same as that discussed in FIG. 5F. A first dielectric layer 410, a second dielectric layer 420, a conductive structure 450, and third dielectric layers 430 may be formed on the first surface 101 of the substrate 100, with the result that a wiring line layer 400 may be formed.

Figure 10D:
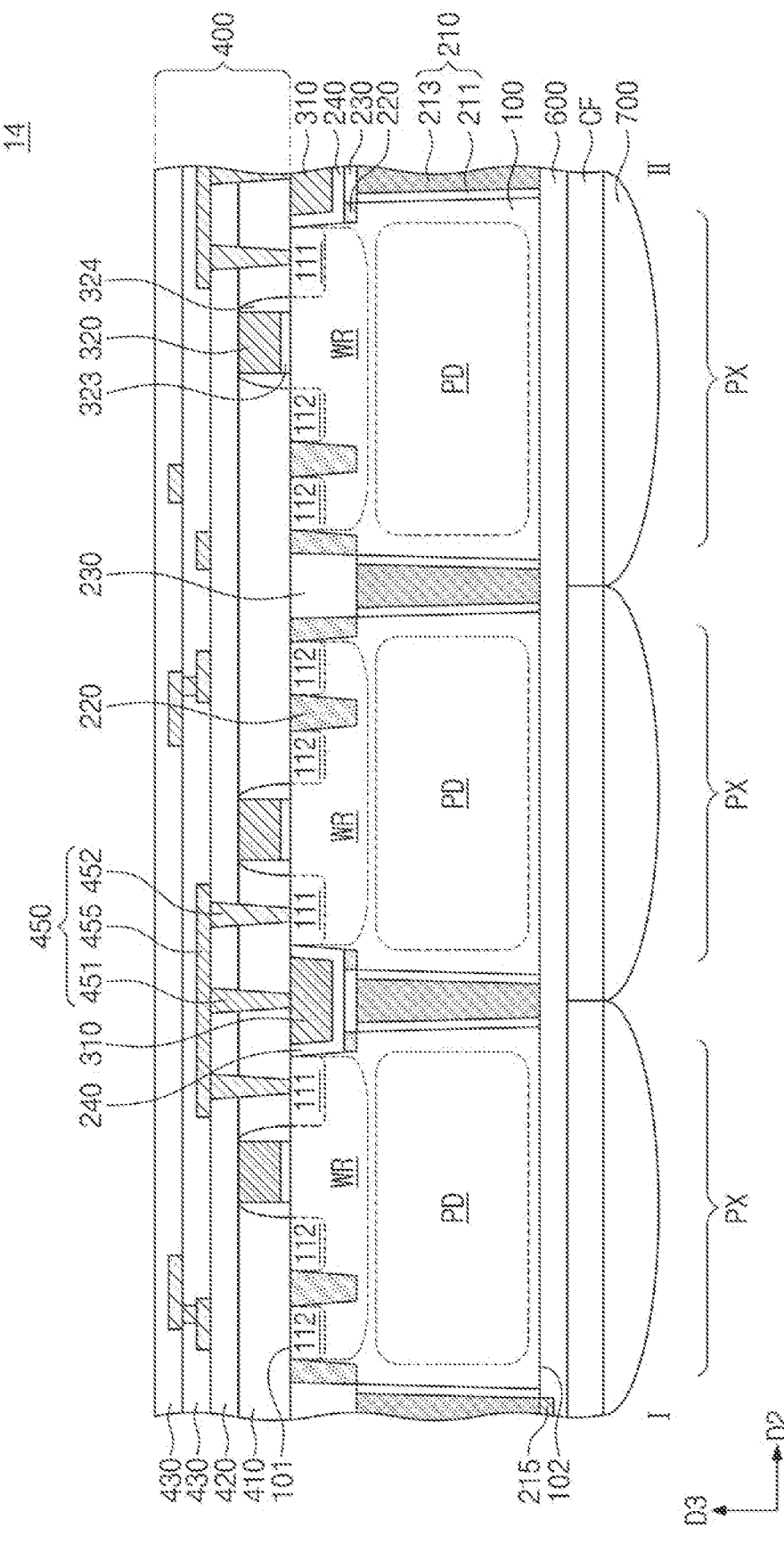

Referring to FIG. 10D, a thinning process may be performed on a second surface 102 of the substrate 100, and thus the conductive isolation pattern 213 may be exposed on the second surface 102 of the substrate 100. A conductive terminal 215, a backside dielectric layer 600, color filters CF, and micro-lenses 700 may be formed on the second surface 102 of the thinned substrate 100. Therefore, an image sensor 14 may thus be fabricated.

Figure 11A:
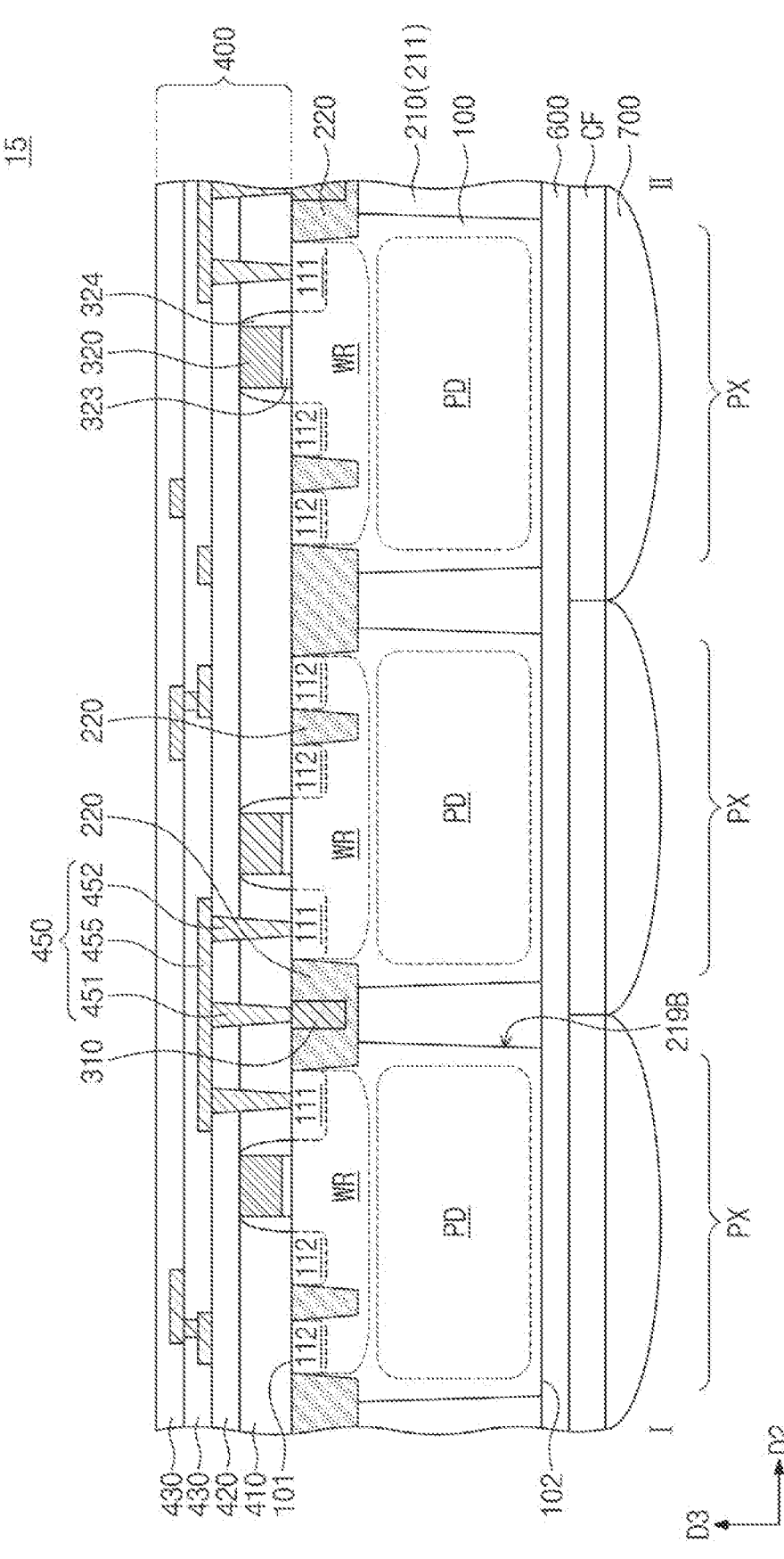
FIG. 11A illustrates a cross-sectional view showing an image sensor according to some examples embodiments.
Figure 11B:
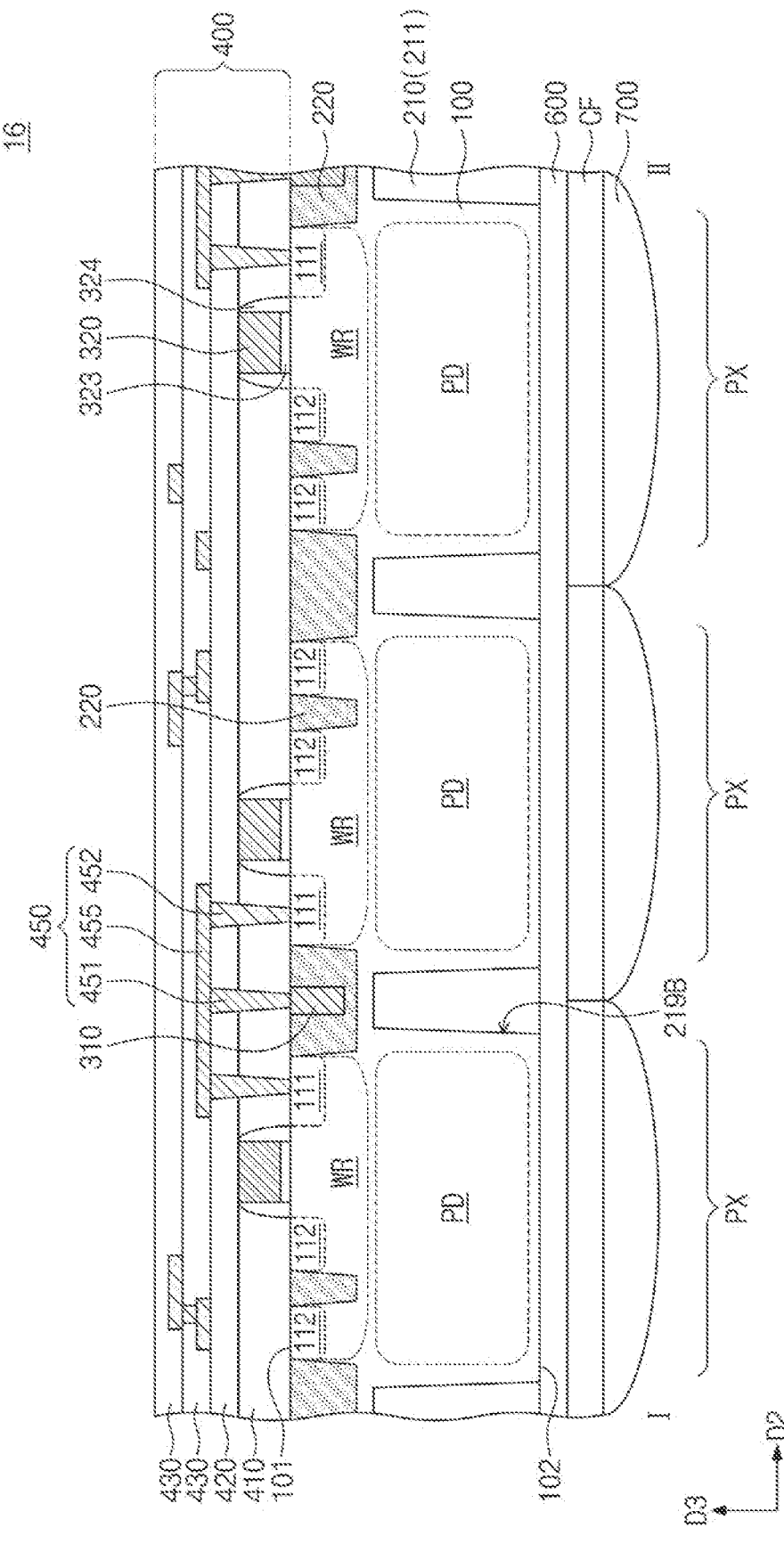
FIG. 11B illustrates a cross-sectional view showing an image sensor according to some examples embodiments.

FIG. 11A illustrates a cross-sectional view taken along line I-II of FIG. 2A, showing an image sensor according to some example embodiments. FIG. 11B illustrates a cross-sectional view taken along line I-II of FIG. 2A, showing an image sensor according to some example embodiments. A duplicate description will be omitted below for conciseness.

Referring to FIGS. 11A and 11B, image sensors 15 and 16 may include the substrate 100, the isolation pattern 210, the device dielectric pattern 220, the conductive line pattern 310, the gate pattern 320, and the wiring line layer 400. The substrate 100, the gate pattern 320, the wiring line layer 400, the backside dielectric layer 600, the color filters CF, and the micro-lenses 700 may be substantially the same as those discussed in FIGS. 2A to 2D. The isolation pattern 210 may be substantially the same as that discussed with reference to FIGS. 7A to 7C. For example, the isolation pattern 210 may be provided in the second trench 219B, and the second trench 219B may be recessed from the second surface 102 of the substrate 100. The isolation pattern 210 may include the dielectric isolation pattern 211, but may not include the conductive isolation pattern (see 213 of FIG. 2B).

The device dielectric pattern 220 may be interposed between the isolation pattern 210 and the first surface 101 of the substrate 100. The conductive line pattern 310 may be provided in the device dielectric pattern 220. The conductive line pattern 310 may have a bottom surface and a sidewall that are surrounded by the device dielectric pattern 220. The conductive line pattern 310 may be coupled to the conductive structure 450.

Referring to FIG. 11A, the isolation pattern 210 of the image sensor 15 may be connected to the device dielectric pattern 220.

Referring to FIG. 11B, the isolation pattern 210 of the image sensor 16 may be spaced apart from the device dielectric pattern 220, and the substrate 100 may extend between a top surface of the isolation pattern 210 and a bottom surface of the device dielectric pattern 220.

Figure 12A:
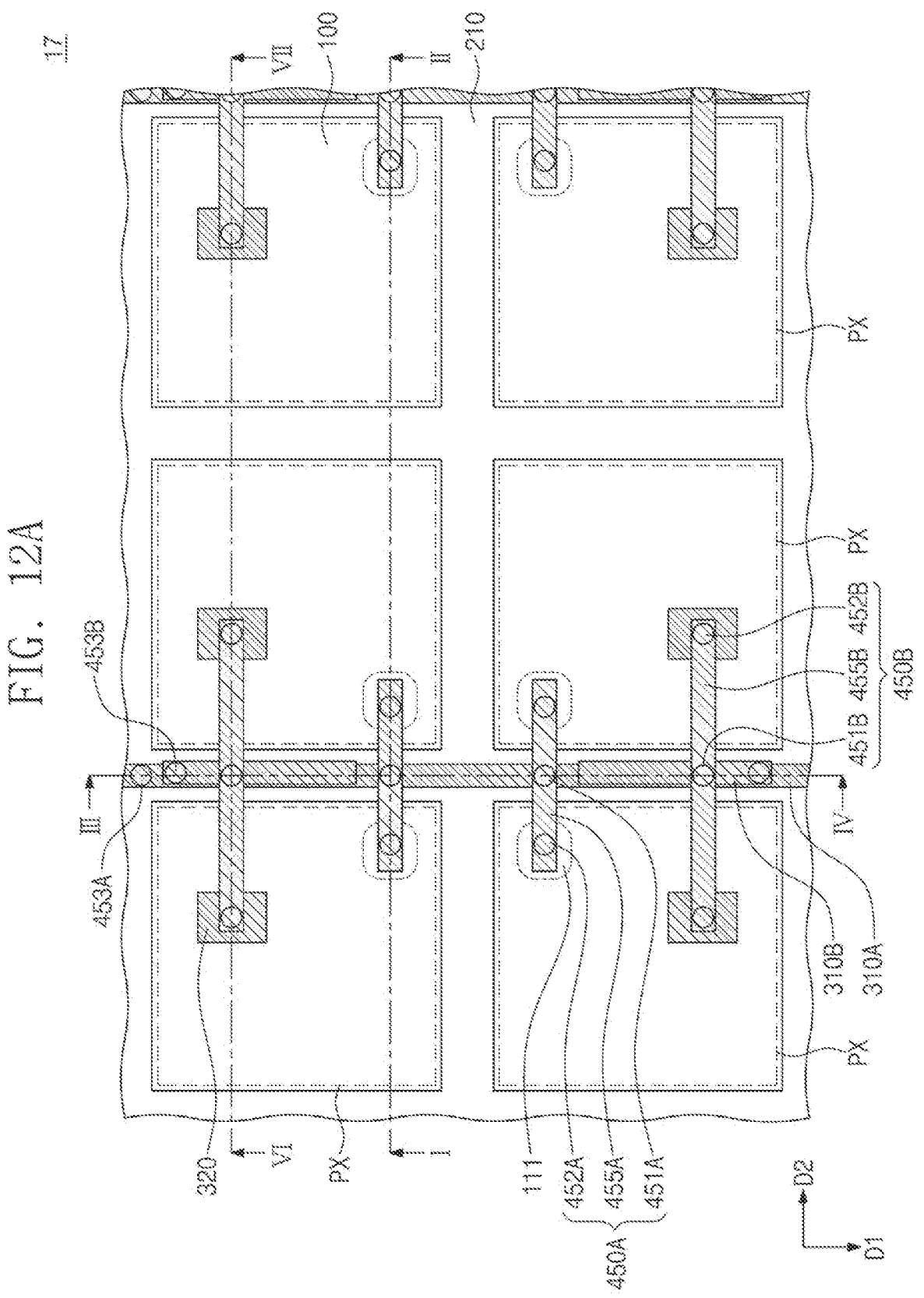
FIG. 12A illustrates a plan view showing an image sensor according to some examples embodiments.
Figure 12B:
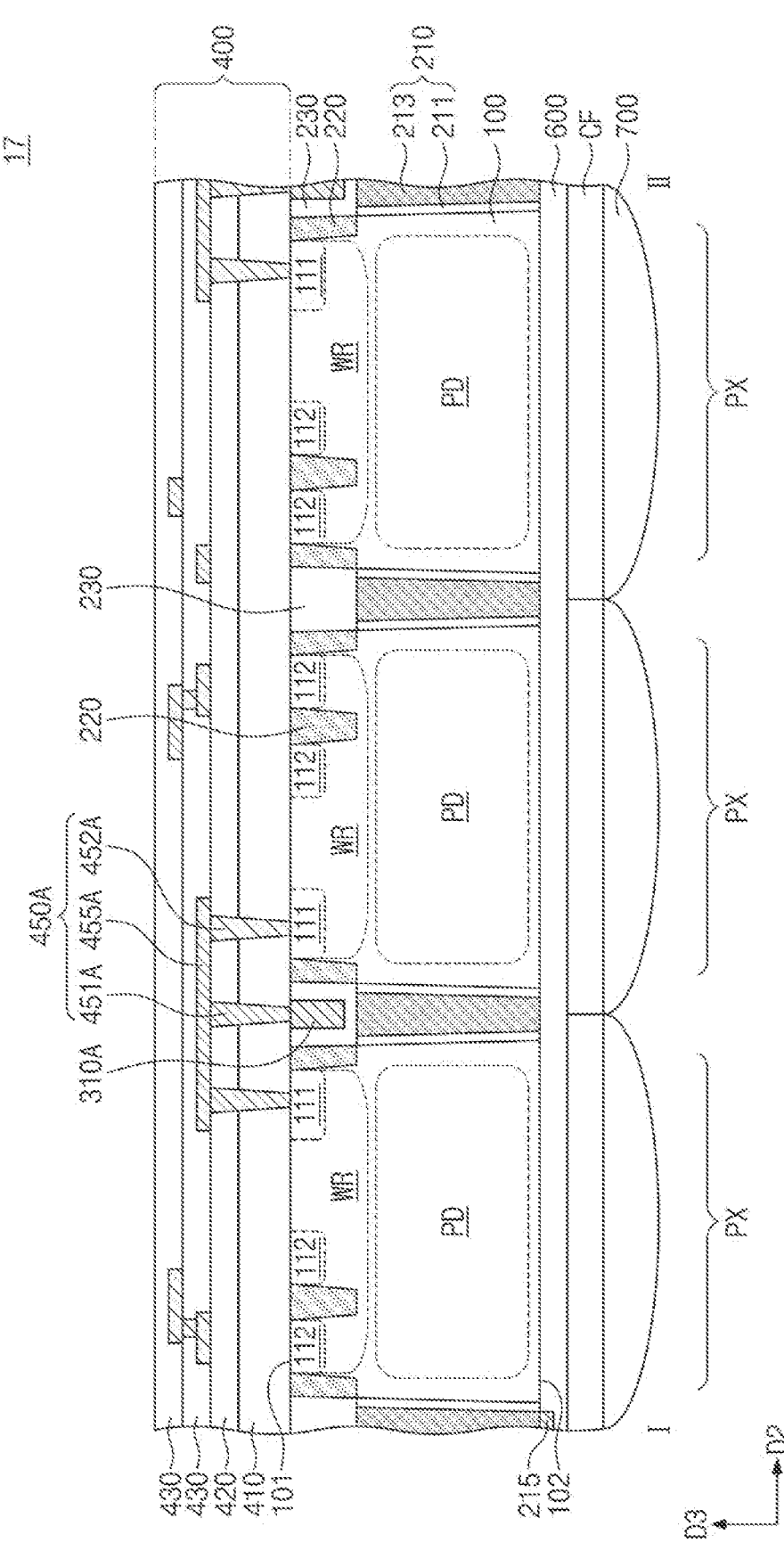
FIG. 12B illustrates a cross-sectional view taken along line I-II of FIG. 12A.
Figure 12C:
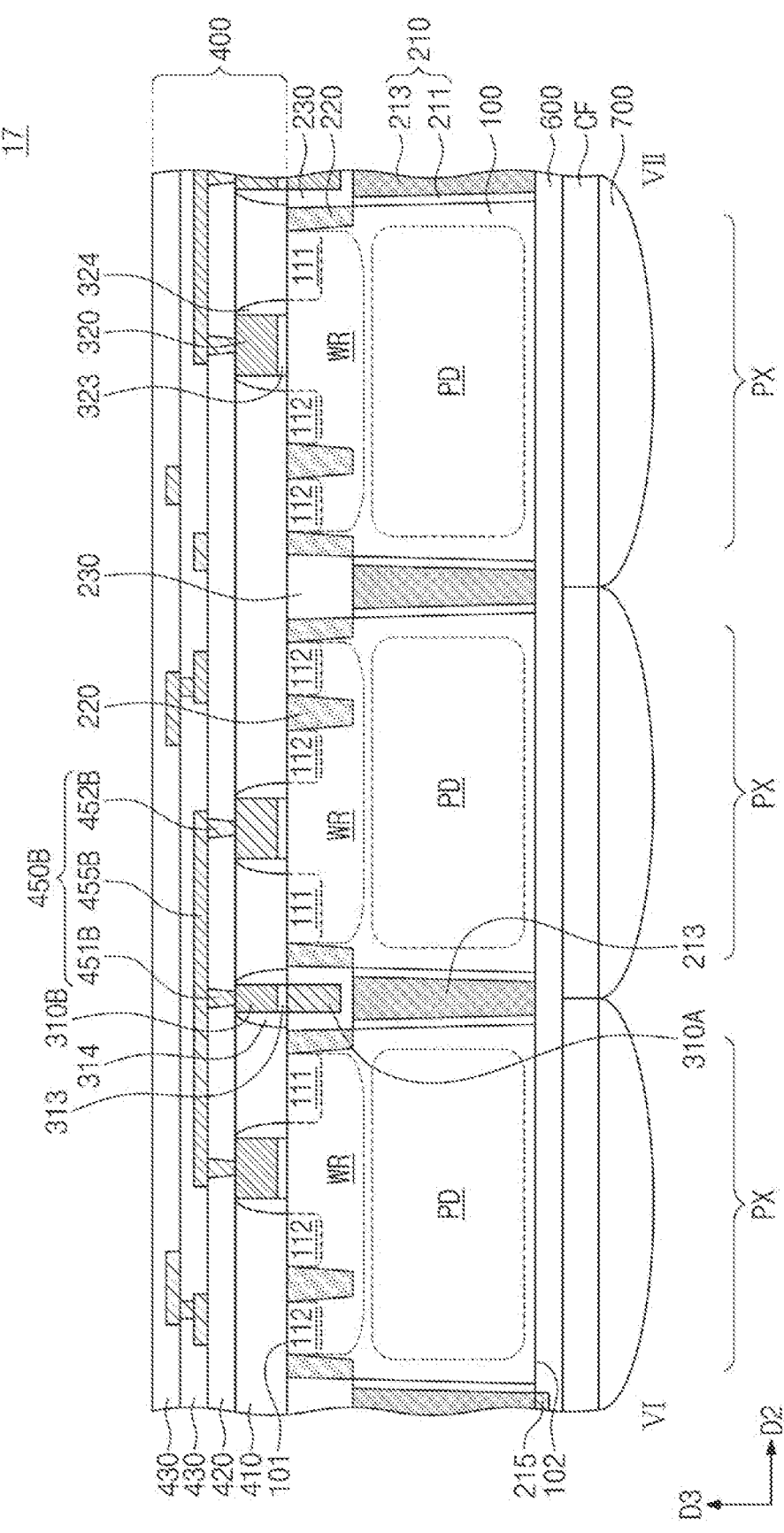
FIG. 12C illustrates a cross-sectional view taken along line VI-VII of FIG. 12A.
Figure 12D:
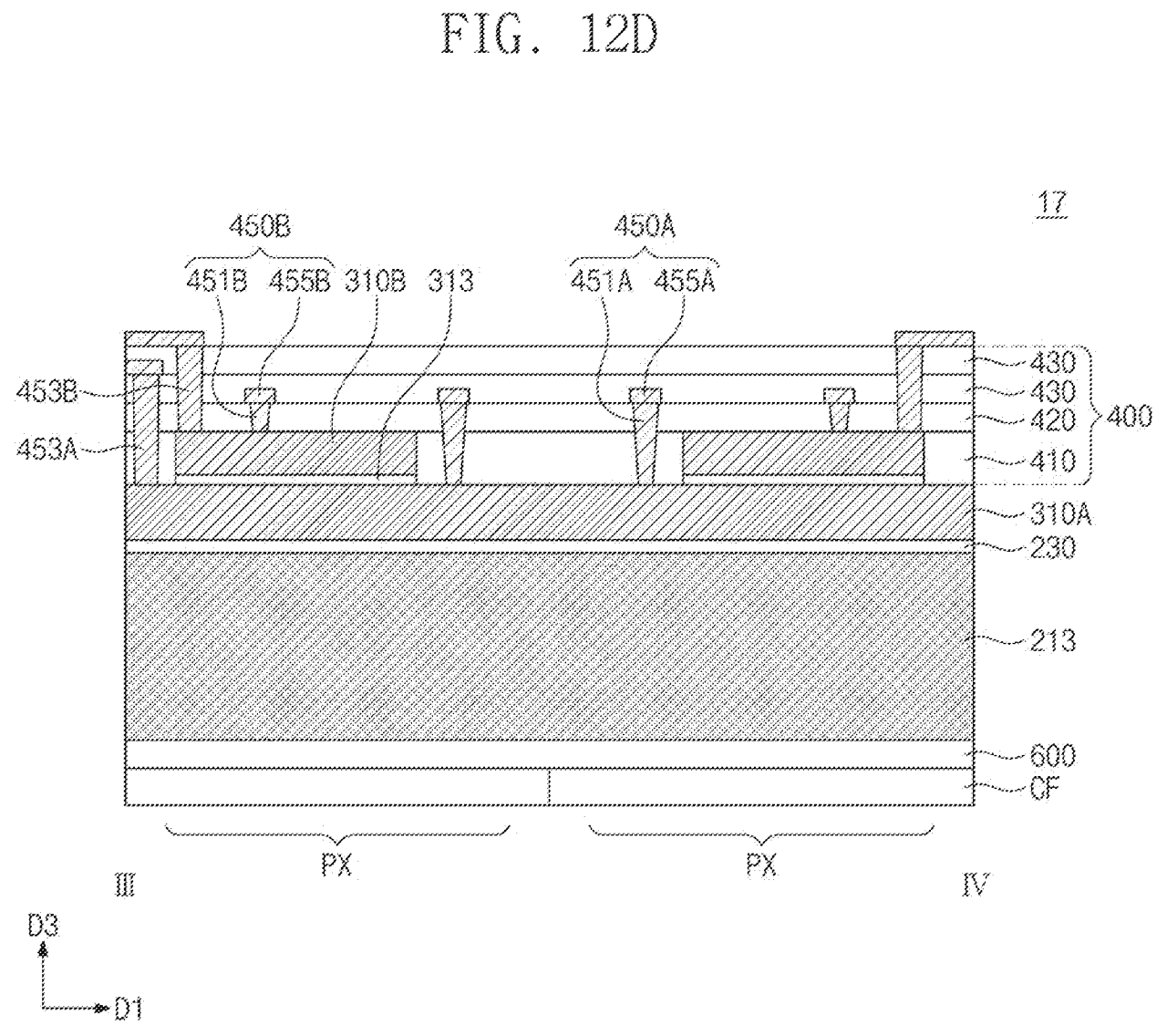

FIG. 12A illustrates a plan view showing an image sensor according to some example embodiments. FIG. 12B illustrates a cross-sectional view taken along line I-II of FIG. 12A. FIG. 12C illustrates a cross-sectional view taken along line VI-VII of FIG. 12A. FIG. 12D illustrates a cross-sectional view taken along line III-IV of FIG. 12A. A duplicate description will be omitted below for conciseness.

Referring to FIGS. 12A to 12D, an image sensor 17 may include the substrate 100, the isolation pattern 210, the device dielectric pattern 220, the gate pattern 320, and the wiring line layer 400, and further include a first conductive line pattern 310A and a second conductive line pattern 310B.

The first conductive line pattern 310A may be provided in the substrate 100 and may vertically overlap the isolation pattern 210. The first conductive line pattern 310A may be substantially the same as the conductive line pattern 310 discussed with reference to FIGS. 8A to 8C. The first conductive line pattern 310A may be formed by substantially the same method as that used for forming the conductive line pattern 310 discussed in FIGS. 9A and 9B or in FIGS. 10A and 10B. The first dielectric pattern 230 may be interposed between the conductive isolation pattern 213 and the first conductive line pattern 310A. The first conductive line pattern 310A may be electrically separated from the conductive isolation pattern 213 by the first dielectric pattern 230. The first dielectric pattern 230 may extend between the first conductive line pattern 310A and the device dielectric pattern 220, thereby further covering a sidewall of the first conductive line pattern 310A.

A first conductive structure 450A may be provided in the wiring line layer 400, and coupled to the first conductive line pattern 310A and the first impurity region 111. The first conductive structure 450A may include a first contact plug pattern 451A, a second contact plug pattern 452A, and a first conductive pattern 455A. The first contact plug pattern 451A, the second contact plug pattern 452A, and the first conductive pattern 455A may be substantially the same respectively as the first contact plug 451, the second contact plug 452, and the conductive pattern 455 that are discussed with reference to FIGS. 8A to 8C. The first conductive line pattern 310A may be electrically connected through the first conductive structure 450A to the first impurity region 111.

As shown in FIG. 12C, a second conductive line pattern 310B may be provided on the first surface 101 of the substrate 100. For example, the second conductive line pattern 310B may be disposed on the first conductive line pattern 310A, and may vertically overlap the isolation pattern 210 and the first conductive line pattern 310A. The second conductive line pattern 310B may be the same as or similar to the conductive line pattern 310 discussed with reference to FIG. 2A to 2D or with reference to FIG. 4B. The second conductive line pattern 310B may be formed by substantially the same method as that discussed with reference to FIGS. 5E and 5F, FIGS. 6A and 6B, FIGS. 6C and 6D, or FIGS. 6E and 6F. The second dielectric pattern 313 may be interposed between the second conductive line pattern 310B and the first conductive line pattern 310A. The second conductive line pattern 310B may be electrically separated from the first conductive line pattern 310A by the second dielectric pattern 313. The second conductive line pattern 310B may be electrically separated from the conductive isolation pattern 213. The line spacer 314 may further be provided on a sidewall of the second conductive line pattern 310B, thereby covering the sidewall of the second conductive line pattern 310B. The second dielectric pattern 313 may include the same material as that of the gate dielectric pattern 323.

A second conductive structure 450B may be provided in the wiring line layer 400, and electrically connected to the second conductive line pattern 310B and the gate pattern 320. The second conductive structure 450B may include a first contact plug portion 451B, a second contact plug portion 452B, and a second conductive pattern 455B. The first contact plug portion 451B, the second contact plug portion 452B, and the second conductive pattern 455B may be substantially the same respectively as the first contact plug 451, the second contact plug 452, and the conductive pattern 455 that are discussed in FIG. 4B. The second conductive line pattern 310B may serve as an electrical pathway that is separated from that provided from the first conductive line pattern 310A.

As shown in FIG. 12D, a third contact plug portion 453B may penetrate the first dielectric layer 410 and the second dielectric layer 420, and may be coupled to the second conductive line pattern 310B. The third contact plug portion 453B may further penetrate at least one of the third dielectric layers 430. As shown in FIG. 12A, the third contact plug portion 453B may be spaced apart from the first contact plug portion 451B and the second contact plug portion 452B. The third contact plug portion 453B may be the same as or similar to the third contact plug 453 discussed in FIG. 2D.

As shown in FIG. 12D, a third contact plug pattern 453A may penetrate the first dielectric layer 410 and the second dielectric layer 420, and may be coupled to the first conductive line pattern 310A. The third contact plug pattern 453A may further include at least one of the third dielectric layers 430. The third contact plug pattern 453A may be spaced apart from the third contact plug portion 453B and the second conductive line pattern 310B. The third contact plug pattern 453A may be electrically separated from the third contact plug portion 453B and the second conductive line pattern 310B. The third contact plug pattern 453A may be the same as or similar to the third contact plug 453 discussed in FIG. 8C.

Figure 13A:
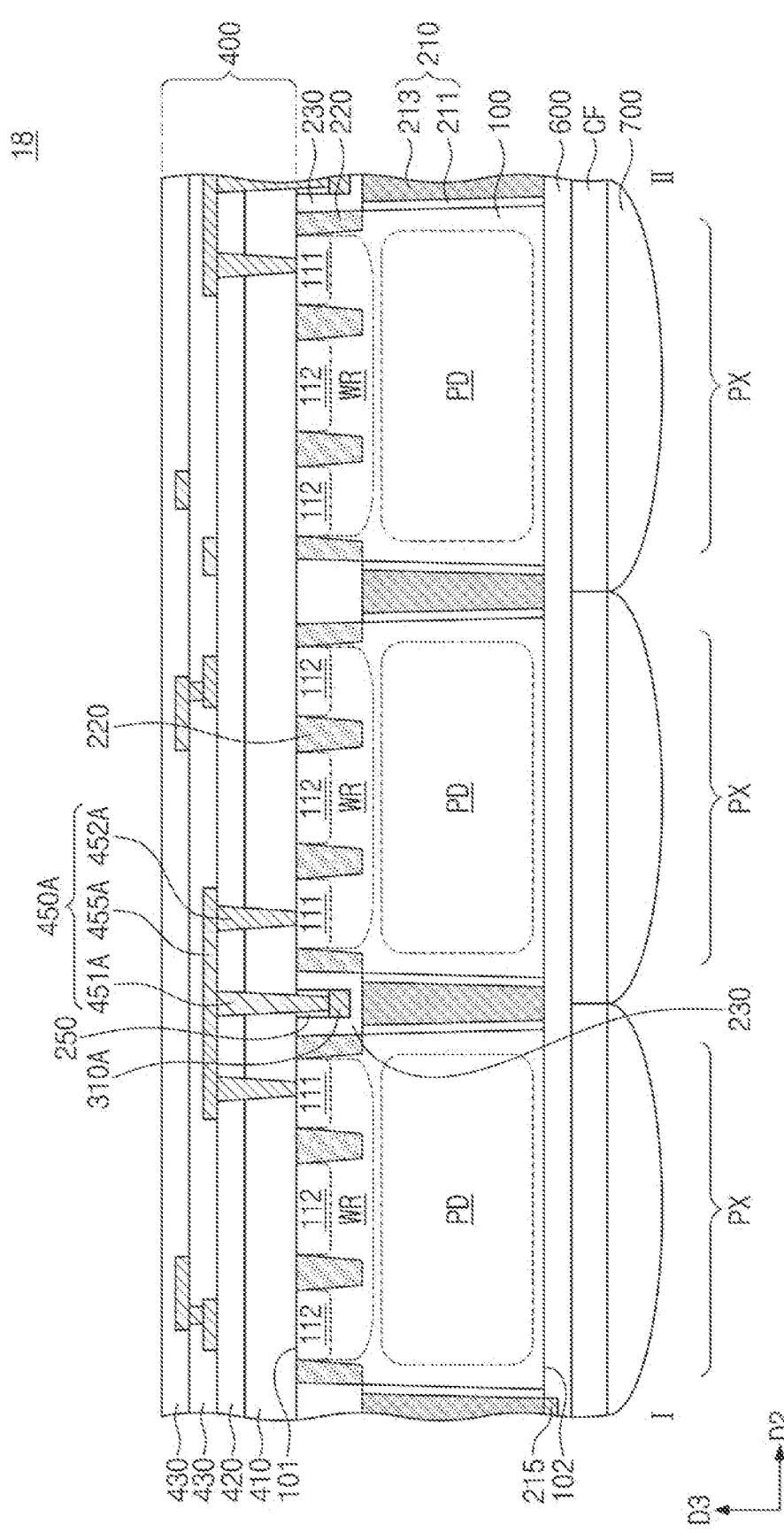
Figure 13B:
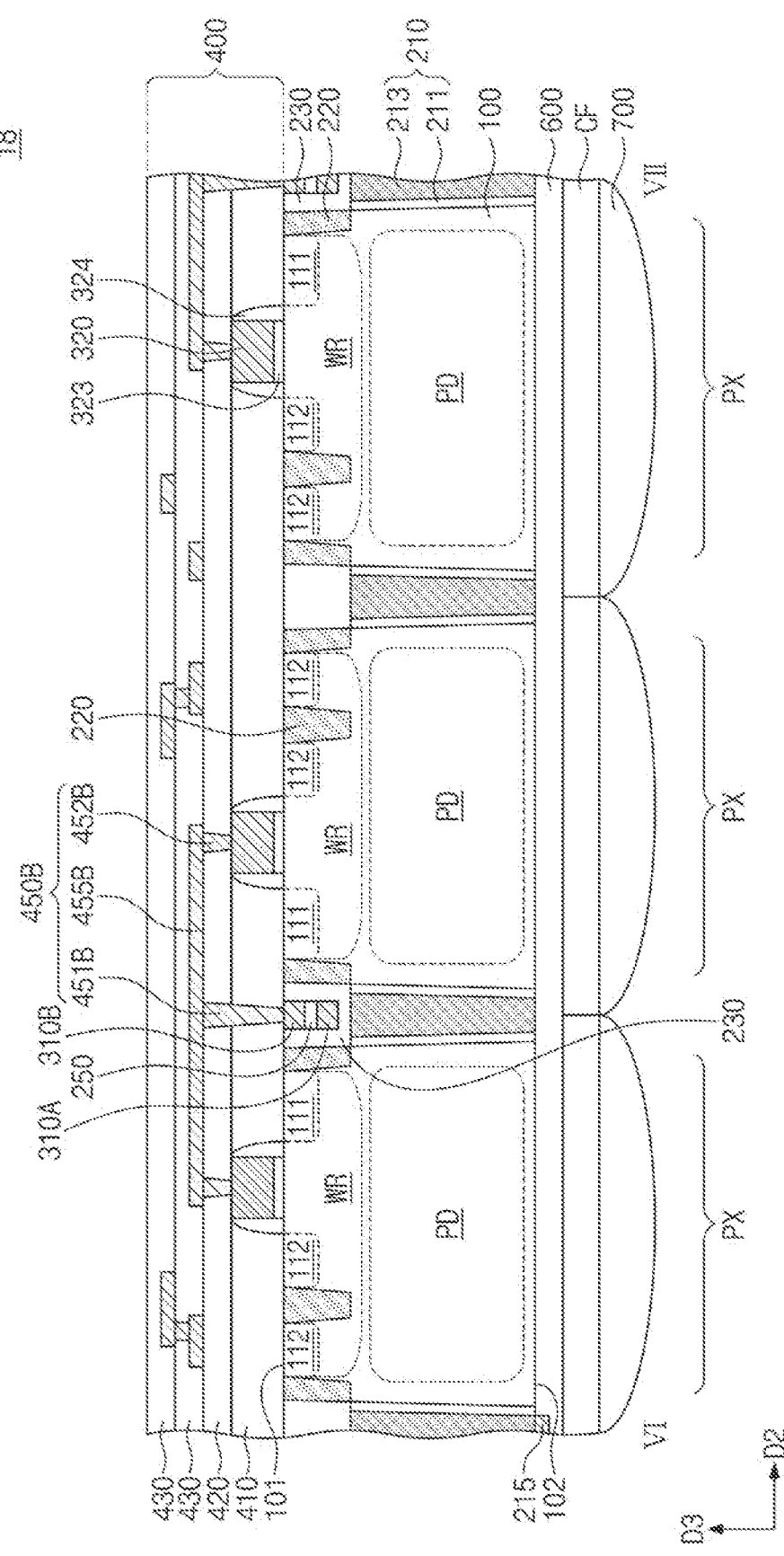
Figure 13C:
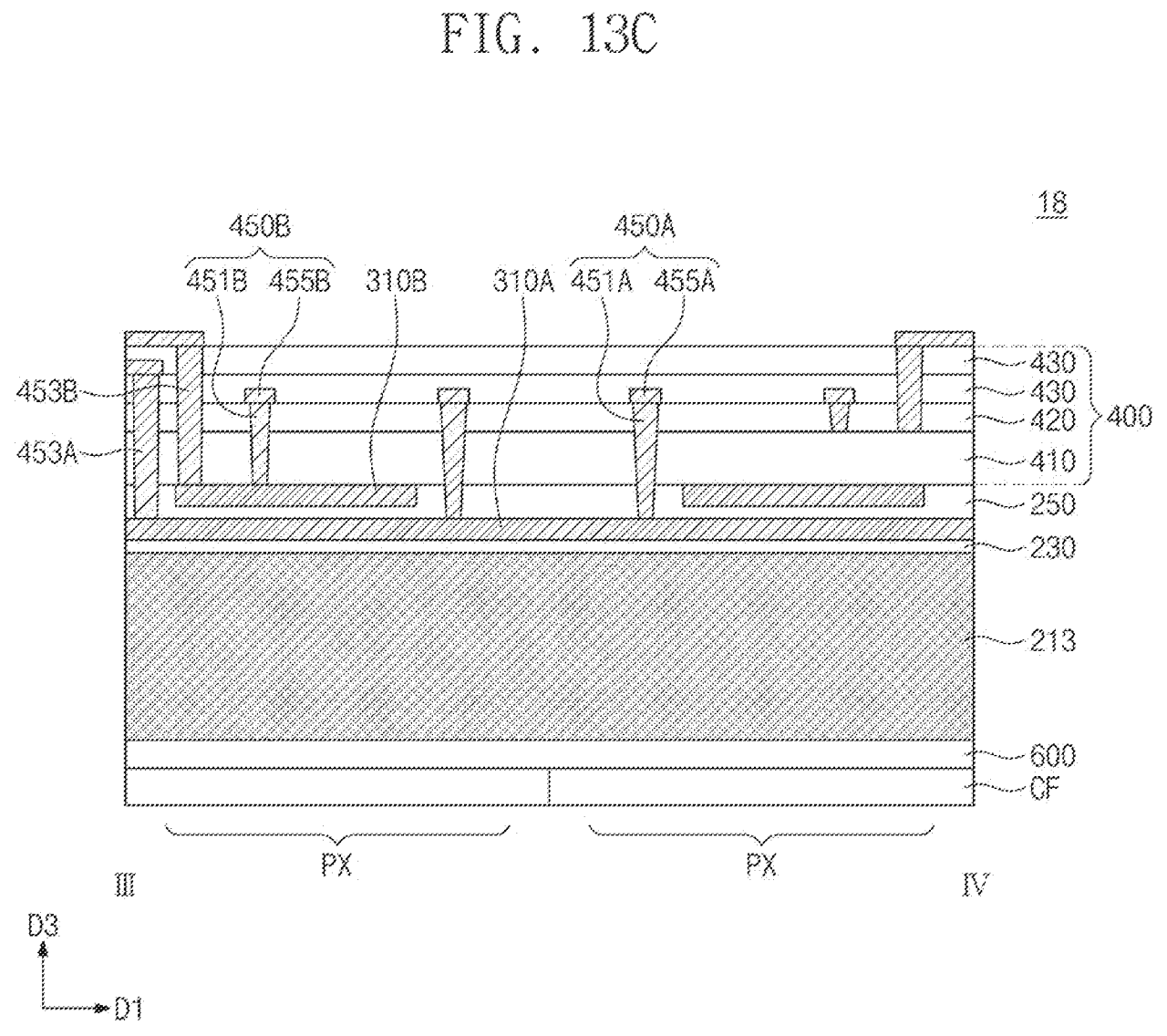

FIGS. 13A to 13C illustrate cross-sectional views showing an image sensor according to some example embodiments. FIG. 13A illustrates a cross-sectional view taken along line I-II of FIG. 12A. FIG. 13B illustrates a cross-sectional view taken along line VI-VII of FIG. 12A. FIG. 13C illustrates a cross-sectional view taken along line III-IV of FIG. 12A. A duplicate description will be omitted below for conciseness.

Referring to FIGS. 12A, 13A, 13B, and 13C, an image sensor 18 may include the substrate 100, the isolation pattern 210, the device dielectric pattern 220, the gate pattern 320, and the wiring line layer 400, and further include a first conductive line pattern 310A and a second conductive line pattern 310B.

The first conductive line pattern 310A may be provided in the substrate 100 and may vertically overlap the isolation pattern 210. The device dielectric pattern 220 may be interposed between the first conductive line pattern 310A and the substrate 100. The first conductive line pattern 310A may be substantially the same as the first conductive line pattern 310A discussed in FIGS. 12A to 12D, except that the first conductive line pattern 310A may have a top surface at a lower level than that of the first surface 101 of the substrate 100. A fourth dielectric pattern 250 may be disposed between the first conductive line pattern 310A and the first surface 101 of the substrate 100. The fourth dielectric pattern 250 may include one or more of a silicon-based dielectric material (e.g., silicon nitride, silicon oxide, and/or silicon oxynitride) and a high-k dielectric material (e.g., hafnium oxide and/or aluminum oxide).

As shown in FIG. 13A, a first conductive structure 450A may be provided in the wiring line layer 400, and may be coupled to the first conductive line pattern 310A and the first impurity region 111. The first conductive structure 450A may include a first contact plug pattern 451A, a second contact plug pattern 452A, and a first conductive pattern 455A. The first contact plug pattern 451A may penetrate the first dielectric layer 410, the second dielectric layer 420, and the fourth dielectric pattern 250.

As shown in FIG. 13B, the second conductive line pattern 310B may be provided in the substrate 100. A sidewall of the second conductive line pattern 310B may be surrounded by the first dielectric pattern 230. The second conductive line pattern 310B may be disposed on and vertically overlap the first conductive line pattern 310A. The fourth dielectric pattern 250 may be interposed between a top surface of the first conductive line pattern 310A and a bottom surface of the second conductive line pattern 310B. The second conductive line pattern 310B may be electrically separated from the first conductive line pattern 310A by the fourth dielectric pattern 250. The second conductive line pattern 310B may be electrically separated from the conductive isolation pattern 213. The second conductive line pattern 310B may be formed by a similar method to that used for forming the conductive line pattern 310 discussed in FIGS. 9A and 9B or in FIGS. 10A and 10B.

A second conductive structure 450B may be provided in the wiring line layer 400, and electrically connected to the second conductive line pattern 310B and the gate pattern 320. The second conductive structure 450B may include a first contact plug portion 451B, a second contact plug portion 452B, and a second conductive pattern 455B.

As shown in FIG. 13C, a third contact plug portion 453B may penetrate the first dielectric layer 410 and the second dielectric layer 420, and may be coupled to the second conductive line pattern 310B. The third contact plug portion 453B may further penetrate at least one of the third dielectric layers 430. A third contact plug pattern 453A may penetrate the first dielectric layer 410 and the second dielectric layer 420, and may be coupled to the first conductive line pattern 310A. The third contact plug pattern 453A may further include at least one of the third dielectric layers 430. The third contact plug pattern 453A may be electrically separated from the third contact plug portion 453B and the second conductive line pattern 310B.

For the image sensor 17 according to the example embodiment of FIGS. 12A to 12D and the image sensor 18 according to the example embodiment of FIGS. 13A to 13C, shapes and electrical connections of the first conductive structure 450A and the second conductive structure 450B are not limited to that shown, but may be variously changed. For example, the first conductive structure 450A may be electrically connected to the gate pattern 320, and the second conductive structure 450B may be electrically connected to the first impurity region 111. In this case, the second contact plug pattern 452A may be coupled to the gate pattern 320, and the second contact plug portion 452B may be coupled to the first impurity region 111.

For another example, the gate pattern 320 may be provided in plural. The first conductive structure 450A may be connected to one of the gate patterns 320, and the second conductive structure 450B may be connected to other one of the gate patterns 320.

For another example, one of the first conductive structure 450A and the second conductive structure 450B may be coupled to the first impurity region 111, and the other of the first conductive structure 450A and the second conductive structure 450B may be coupled to the second impurity region 112.

While various image sensors, including image sensor 1 to image sensor 18 have been described separately above, according to example embodiments, features of the image sensors 1 to 18 may be combined together on a same image sensor. For example, while an image sensor 1 is described with reference to FIG. 2B and an image sensor 2 is described with reference to FIG. 2E, an image sensor according to an example embodiment may include pixel regions having first and second impurity regions as described with reference to FIG. 2B and other pixel regions having ground regions as described with reference to FIG. 2E in a same image sensor. The disclosure is thus intended to include various combinations of the features of the image sensors 1-18 in a same image sensor.

According to the example embodiments discussed herein, a conductive line pattern may be disposed in a substrate or on a first surface of the substrate, and when viewed in plan, the conductive line pattern may overlap an isolation pattern. Because the conductive line pattern is provided, it may be possible to increase the freedom degree of design of wiring lines between dielectric layers. Accordingly, the wiring lines may increase in integration and/or decrease in congestion.

This detailed description should not be construed as limited to the example embodiments set forth herein, and it is intended that the present claims cover the various combinations, the modifications and variations of the various example embodiments described herein without departing from the spirit and scope of the present inventive concepts. The appended claims should be construed to include other embodiments.

What is claimed is:

1. A semiconductor device, comprising:

a substrate having a first surface and a second surface and including an isolation pattern that defines a plurality of pixel regions, and a photoelectric conversion region in each pixel region and a transistor for each of the plurality of pixel regions;

a gate electrode of the transistor disposed on the first surface of the substrate; and a conductive line pattern disposed on the first surface of the substrate, the conductive line pattern vertically overlapping the isolation pattern in plan view, wherein a top surface of the conductive line pattern is located at the same level as a top surface of the gate electrode, wherein a width of the conductive line pattern is less than a width of the isolation pattern, and wherein the isolation pattern comprises a conducive isolation pattern and a dielectric isolation pattern.

2. The semiconductor device of claim 1, further comprising a dielectric pattern disposed in the substrate and between the isolation pattern and the conductive line pattern.

3. The semiconductor device of claim 2, a width of the dielectric pattern is greater than the width of the conductive line pattern.

4. The semiconductor device of claim 3, the width of the conductive line pattern ranges from about 10 nm to about 70 nm.

5. The semiconductor device of claim 1, further comprising:

a first dielectric layer on the first surface of the substrate;

a gate spacer disposed on sidewalls of the gate electrode and embedded by the first dielectric layer; and a line spacer disposed on sidewalls of the conductive line pattern and embedded by the first dielectric layer.

6. The semiconductor device of claim 5, wherein the gate electrode includes a gate material that is the same as a conductive material of the conductive line pattern.

7. The semiconductor device of claim 6, wherein each of the gate material and the conductive material includes doped polysilicone or metal.

8. The semiconductor device of claim 1, further comprising a doping region disposed on the first surface of the substrate and in the substrate, the doping region between the isolation pattern and the conductive line pattern.

9. The semiconductor device of claim 1, wherein the photoelectric conversion region is configured to receive an incident light through the second surface, wherein the first surface and the second surface face each other.

10. The semiconductor device of claim 1, wherein the gate electrode is one of a plurality of gate electrodes, the plurality of gate electrodes on the plurality of pixel regions, respectively, and wherein the conductive line pattern connects at least two of the plurality of gate electrodes of the plurality of pixel regions through a contact plug.

11. The semiconductor device of claim 1, further comprising active regions of the plurality of pixel regions, respectively, the active regions disposed in the substrate, wherein the conductive line pattern connects the active regions of at least two of the plurality of pixel regions through a contact plug.

12. The semiconductor device of claim 11, further comprising:

a dielectric pattern on a bottom surface of the conductive line pattern, and a gate dielectric pattern on a bottom surface of the gate electrode, wherein the gate dielectric pattern has a substantially same thickness as a thickness of the dielectric pattern.

13. The semiconductor device of claim 11, wherein the conductive line pattern electrically separated from the isolation pattern.

14. The semiconductor device of claim 11, wherein a bottom surface of the conductive line pattern is located at a substantially same level as a bottom surface of the gate electrode, and wherein the top surface of the conductive line pattern is located at a substantially same level as the top surface of the gate electrode.

15. A semiconductor device, comprising:

a substrate including an isolation pattern that defines a plurality of pixel regions, the substrate including a photoelectric conversion region in each pixel region;

a gate electrode disposed on a first surface of the substrate and vertically overlapping at least one of the plurality of pixel regions; and a conductive line pattern disposed on the first surface of the substrate, the conductive line pattern vertically overlapping the isolation pattern in plan view, wherein a height of the conductive line pattern is substantially same as a height of the gate electrode, wherein a width of the conductive line pattern is less than a width of the isolation pattern, and wherein the isolation pattern comprises a conducive isolation pattern and a dielectric isolation pattern.

* * * * *